United States Patent
Breslin et al.

(10) Patent No.: US 11,852,694 B2
(45) Date of Patent: Dec. 26, 2023

(54) CIRCUITRY FOR DETECTING JACK PLUG INSERTION OR REMOVAL

(71) Applicant: Cirrus Logic International Semiconductor Ltd., Edinburgh (GB)

(72) Inventors: John A. Breslin, Edinburgh (GB); John B. Bowlerwell, Edinburgh (GB); Clive R. Graham, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 351 days.

(21) Appl. No.: 16/951,775

(22) Filed: Nov. 18, 2020

(65) Prior Publication Data

US 2021/0165055 A1    Jun. 3, 2021

Related U.S. Application Data

(60) Provisional application No. 62/947,117, filed on Dec. 12, 2019, provisional application No. 62/942,098, filed on Nov. 30, 2019.

(51) Int. Cl.
   *G01R 31/69* (2020.01)
   *H01R 13/66* (2006.01)
   (Continued)

(52) U.S. Cl.
   CPC ......... *G01R 31/69* (2020.01); *H01R 13/6683* (2013.01); *H01R 24/58* (2013.01); *H01R 2107/00* (2013.01)

(58) Field of Classification Search
   CPC ...... G01R 31/69; G01R 27/205; G01R 27/02; H01R 13/6683; H01R 24/58;
   (Continued)

(56) References Cited

U.S. PATENT DOCUMENTS

| 10,168,374 B2 * | 1/2019 | Chen ................... G01R 31/52 |
| 2003/0153205 A1 | 8/2003 | Corey et al. |

(Continued)

FOREIGN PATENT DOCUMENTS

GB    2544830 B    8/2018

OTHER PUBLICATIONS

Search Report under Section 17(6), UKIPO, Application No. GB2000271.3, dated Jan. 14, 2021.
(Continued)

*Primary Examiner* — Christopher P Mcandrew
*Assistant Examiner* — Zannatul Ferdous
(74) *Attorney, Agent, or Firm* — Jackson Walker L.L.P

(57) ABSTRACT

The present disclosure relates to circuitry for detecting connection of a plug of an audio accessory device to a socket of an intermediate cable that is connected to a host device, wherein the plug of the accessory device is of a different type than the socket of the intermediate cable. The circuitry comprises a monitoring unit comprising a first terminal configured to be electrically connected to a first socket contact of the socket that is in electrical contact with a first plug contact of the plug when the plug is fully received in the socket; and a second terminal configured to be electrically connected to a second socket contact of the socket that is in electrical contact with a second plug contact of the plug when the plug is fully received in the socket. The monitoring unit is configured to: detect a first impedance of a first signal path from the first terminal; detect a second impedance of a second signal path from the first terminal; and detect a third impedance of a third signal path from the second terminal, wherein the circuitry is configured to output a signal indicative of detection of connection of the plug to the socket in response to detection by the monitoring unit that the detected first, second and third impedances do not correspond to expected first, second and third impedances.

14 Claims, 30 Drawing Sheets

(51) Int. Cl.
*H01R 24/58* (2011.01)
*H01R 107/00* (2006.01)

(58) Field of Classification Search
CPC .. H01R 2107/00; H01R 13/665; H01R 25/00; H01R 2105/00; H04R 1/1033; H04R 3/12; H04R 5/04
See application file for complete search history.

(56) References Cited

U.S. PATENT DOCUMENTS

| | | |
|---|---|---|
| 2007/0164861 A1 | 7/2007 | Sano |
| 2009/0296952 A1 | 12/2009 | Pantfoerder et al. |
| 2012/0114159 A1 | 5/2012 | Akino |
| 2013/0156216 A1 | 6/2013 | Shah et al. |
| 2014/0003616 A1 | 1/2014 | Johnson et al. |
| 2014/0126742 A1* | 5/2014 | Eggebraaten ............ H04R 3/12 381/80 |
| 2014/0181328 A1* | 6/2014 | Terlizzi ................ H01R 13/641 710/11 |
| 2017/0153347 A1* | 6/2017 | Saunders ................. G01V 3/02 |
| 2018/0246158 A1* | 8/2018 | Taylor ................ H01R 13/6683 |
| 2019/0098396 A1* | 3/2019 | Shin ................... H01R 13/6683 |
| 2020/0186927 A1 | 6/2020 | Lesso et al. |

OTHER PUBLICATIONS

Combined Search and Examination Report under Sections 17 and 18(3), UKIPO, Application No. GB2000271.3, dated Jul. 10, 2020.

\* cited by examiner

CIRCUITRY FOR DETECTING JACK PLUG INSERTION OR REMOVAL

FIELD OF THE INVENTION

This application relates to circuitry for detecting at least partial removal and/or insertion of an audio jack plug from or into a corresponding socket and, in particular, to circuitry for detecting disconnection of an accessory device from and/or connection of an accessory device to a connector of an extension cable, splitter or the like that is connected to a connector of a host device.

BACKGROUND

Many electronic devices include a suitable connector for removably connecting an accessory device to the electronic device. For example many electronic devices have a connector to connect audio accessories to the electronic device. Mobile telephones, tablets, laptop computers and the like are examples of electronic devices, also referred to as "host devices", that are operable with audio accessory devices such as headphones, earphones, earbuds and headsets, for example, that are external to and distinct from the electronic device. Such audio accessories typically comprise mono or stereo speakers for audio playback and some audio accessories may also have a microphone for voice communication.

Such external accessory devices are often connected to the host electronic device via a mating connector arrangement such as a plug and socket. For instance, many audio accessories have a jack plug for connection to a suitable jack socket of the host electronic device. A well-known arrangement for a jack plug and its associated socket is the 3.5 mm 4-pole TRRS (Tip-Ring-Ring-Sleeve) configuration, which has four contacts, one contact for each of left audio, right audio, microphone, and ground.

In many devices it is desirable for the host electronic device to be able to detect when an accessory is connected to and/or disconnected from the host device. Thus commonly the host device may comprise circuitry such as a "jack detect" circuit to allow the host device to determine when a suitable accessory device connector has been connected to the host device (e.g. when a plug of an accessory device has been inserted into a socket of the host device). Various different types of jack detect arrangement are known. For instance, the presence of a suitable jack plug inserted fully into a socket may operate a mechanical switch to complete or disconnect a circuit coupled to a jack detect signal line. Monitoring the jack detect signal line, e.g. by comparing a voltage of the jack detect signal line with a known threshold voltage, gives an indication of whether a jack plug is inserted or not. In other arrangements the jack plug itself may form part of a jack detect circuit when inserted. Upon detection of the presence of a connector (e.g. a plug) of the audio accessory device in the connector (e.g. a socket) of an electronic device, the circuitry of the electronic device will be configured appropriately for operation with the accessory device e.g. to supply audio to the accessory device.

The detection circuitry also provides an indication of when the connector of the accessory device has been disconnected or removed from the connector of the host electronic device. This indication can cause the electronic device to react appropriately e.g. by suspending the generation and output of audio signals, thereby reducing power consumption of the electronic device, since audio output signals are not generated unnecessarily.

Some users may connect an accessory device such as a set of headphones, earphones, earbuds, a headset or the like to a host electronic device via a suitable extension cable. The extension cable may be formed of a suitable 3.5 mm TRRS jack plug at one end, with a corresponding TRRS jack socket at the other end. The plug of an accessory device can be received in the socket of the extension cable.

When an extension cable is used in this way, the jack detection circuitry of the host device will detect that a connector is received in the connector of the host electronic device, even when there is no accessory device connected to the extension cable. Thus audio signals may still be generated and output by the electronic device even when the accessory device is not connected to the connector of the extension cable, which can lead to unnecessary power consumption by the host electronic device.

Similarly, a splitter cable having a single jack plug at one end coupled to two or more parallel jack sockets at the other end may be used to connect two or more accessory devices to a host electronic device. The jack plug of the splitter cable is received in the socket of the host electronic device. Each socket of the splitter cable can receive the plug of a different accessory device.

When a splitter cable is used in this way, the jack detection circuitry of the host device will detect that a connector is received in the connector of the host electronic device, even when there is no accessory device connected to the splitter cable. Thus audio signals may still be generated and output by the electronic device even when no accessory device is connected to a connector of the splitter cable, which can lead to unnecessary power consumption by the host electronic device.

Also, when an extension cable or splitter cable is used in this way, the jack detection circuitry of the host device will not detect that a connector is removed from the far end of the extension or splitter cable (e.g. that a plug of an accessory device has been removed from a socket of the extension cable or splitter cable). Thus, audio signals may still be generated and output by the electronic device even when the accessory device is not connected to the connector of the extension cable or splitter cable, which can lead to unnecessary power consumption by the host electronic device.

Polling of the impedance of signal paths coupled to the left (L) and right (R) contacts of the socket of the host device can be employed in order to determine if such an accessory device is subsequently connected to the connector of the extension cable or splitter cable. Such polling typically involves temporarily connecting a DC voltage source to the relevant socket contact and measuring a parameter (e.g. a current) indicative of the impedance of the signal path. Whilst this approach is acceptable when audio signals are not being output to the connected accessory device, it is not viable when audio signals are being output, as the injection of DC voltages would give rise to unacceptable audio artefacts such as clicks and pops.

In some situations the plug of an extension cable or splitter cable may not correspond to the socket of the host device. For example, the host device may have a four-pole TRRS socket, whereas the extension cable or splitter cable may have a three pole tip, ring sleeve (TRS) plug at one end and a corresponding three pole TRS socket at the other end. Most host devices are capable of recognising if a three-pole plug is plugged into a four-pole socket and reconfiguring themselves as necessary for correct audio output. Thus, if an accessory device having a complementary TRS plug is connected to the TRS socket of the extension cable or splitter cable, audio output to the accessory device will typically be unaffected. However, if an accessory device having a four-pole plug (e.g. a TRRS plug) is connected to the three-pole (e.g. TRS) socket of the extension cable or splitter cable, the host device cannot recognise that this has happened and thus cannot reconfigure itself for correct audio output. Thus, in such circumstances audio playback on the accessory device may be distorted or attenuated, or may even not be possible.

There is thus a desire for a way to detect the disconnection of an accessory device from a host electronic device that can be used without degrading audio signals being output to the accessory device, even when the accessory device is connected to the host electronic device via an extension cable or splitter cable.

A desire also exists to detect mismatches between the plug of an accessory device and the socket of an extension cable, splitter cable or the like to which the accessory device is connected when the extension cable, splitter cable or the like is connected to a host device. In particular, a desire exists to detect when an accessory device having a four pole (e.g. TRRS) connector is connected to a three-pole connector of an extension cable, splitter cable or the like.

SUMMARY

According to a first aspect the invention provides circuitry for detecting connection of a plug of an audio accessory device to a socket of an intermediate cable that is connected to a host device, wherein the plug of the accessory device is of a different type than the socket of the intermediate cable, the circuitry comprising:
  a monitoring unit comprising:
    a first terminal configured to be electrically connected to a first socket contact of the socket that is in electrical contact with a first plug contact of the plug when the plug is fully received in the socket; and
    a second terminal configured to be electrically connected to a second socket contact of the socket that is in electrical contact with a second plug contact of the plug when the plug is fully received in the socket,
  wherein the monitoring unit is configured to:
  detect a first impedance of a first signal path from the first terminal;
  detect a second impedance of a second signal path from the first terminal; and
  detect a third impedance of a third signal path from the second terminal,
  wherein the circuitry is configured to output a signal indicative of detection of connection of the plug to the socket in response to detection by the monitoring unit that the detected first, second and third impedances do not correspond to expected first, second and third impedances.

The second terminal may be configured to act as an end point of the first signal path.

The circuitry may further comprise a third terminal configured to be electrically connected to a third socket contact of the socket that is in electrical contact with a third plug contact of the plug when the plug is fully received in the socket, wherein the third terminal is configured to act as an end point of the second and third signal paths.

The circuitry may be configured to output the signal in response to detection by the monitoring unit that the sum of the second and third impedances does not correspond to the first impedance.

The plug may be a four-pole jack plug and the socket may be a three-pole socket.

For example, the plug may be a TRRS plug and the socket may be a TRS socket.

The intermediate cable may be an extension cable or a splitter cable, for example.

The monitoring unit may be configured to determine the first, second and third impedances in response to a request received by the host device.

The request may be a request for audio output, for example.

The monitoring unit may be configured to determine the first, second and third impedances periodically.

Alternatively, the monitoring unit may be configured to monitor the first, second and third impedances continuously.

The circuitry may be implemented as an integrated circuit.

A second aspect of the present disclosure provides an electronic device comprising circuitry according to the first aspect.

A third aspect of the present disclosure provides a method for detecting connection of a plug of an audio accessory device to a socket of an intermediate cable that is connected to a host device, wherein the plug of the accessory device is of a different type than the socket of the intermediate cable, the method comprising:
  detecting a first impedance of a first signal path from a first terminal of a monitoring unit, wherein the first terminal is configured to be electrically connected to a first socket contact of the socket that is in electrical contact with a first plug contact of the plug when the plug is fully received in the socket;
  detecting a second impedance of a second signal path from the first terminal;
  detecting a third impedance of a third signal path from a second terminal, wherein the second terminal is configured to be electrically connected to a second socket contact of the socket that is in electrical contact with a second plug contact of the plug when the plug is fully received in the socket; and
  outputting a signal indicative of detection of connection of the plug to the socket in response to detection that the detected first, second and third impedances do not correspond to expected first, second and third impedances.

A fourth aspect of the present disclosure provides circuitry for detecting at least partial removal of a plug of an audio accessory device from a socket of an intermediate cable that is connected to a host device, the circuitry comprising:
  a monitoring unit comprising:
  a first terminal configured to be electrically connected to a first socket contact of the socket that is in electrical contact with a first plug contact of the plug of the audio accessory device when the plug of the audio accessory device is fully received in the socket of the intermediate cable,
  wherein the monitoring unit is configured to monitor a first impedance of a first signal path coupled to the first terminal, and
  wherein the circuitry is configured to output a signal indicative of detection of at least partial removal of the plug of the audio accessory device from the socket of the intermediate cable in response to detection by the monitoring unit of a change in an impedance state of the first signal path from a first impedance state in which the impedance of the first signal path has a first impedance value to a second, high impedance state.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
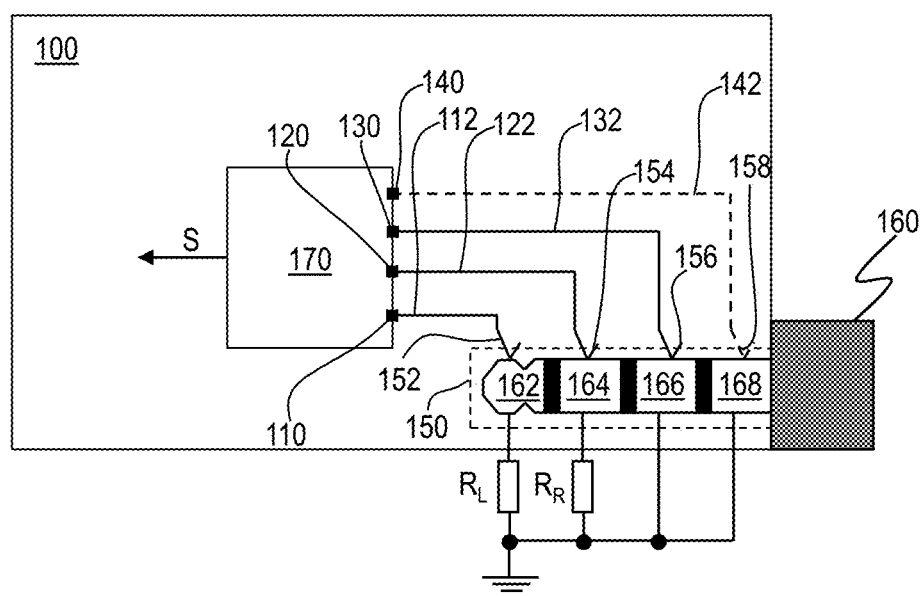
FIG. 1 illustrates an example of circuitry for detecting at least partial removal of a jack plug from a corresponding socket.

FIG. 1 illustrates circuitry 100 for detecting at least partial removal of an electrical plug 160 from a corresponding electrical socket 150. In this example, the plug 160 is a conventional 3.5 mm TRRS (Tip-Ring-Ring-Sleeve) jack plug with four contacts, namely: a tip (T) contact 162; a first ring (R) contact 164; a second ring (R) contact 166; and a sleeve (S) contact 168. The electrical socket 150 in this example is a 4-pole socket with TRRS contacts 152-158 (the sleeve contact 158 is shown in dashed outline FIG. 1). As will be appreciated, when the plug 160 is fully received in the socket 150, the T, R, R and S contacts 152-158 of the socket 150 are in electrical contact with the corresponding TRRS contacts 162-168 of the plug 160.

The circuitry 100 may form part of a host electronic device such as a mobile phone, tablet or laptop computer or the like, and the plug 160 may form part of an accessory device such as a set of headphones, earphones, earbuds, a headset or the like. The insertion of the plug 160 into the socket 150 may therefore provide a mating connection between an accessory device and a host electronic device.

The circuitry 100 further comprises a monitoring unit 170, which may comprise discrete circuitry, integrated circuitry, processor circuitry configured to execute suitable software instructions or any combination of discrete circuitry, integrated circuitry, processor circuitry and software. The monitoring unit 170 is configured to monitor a first impedance of a first signal path associated with the socket tip contact 152, and a second impedance of a second signal path associated with the first socket ring contact 154. To this end the monitoring unit 170 includes a first terminal 110, a second terminal 120, a third terminal 130 and a fourth terminal 140. The first terminal 110 is electrically coupled to the tip contact 152 of the socket 150 via a conductor (e.g. a PCB trace, wire or the like) 112, the second terminal 120 is electrically coupled to the first ring contact 154 of the socket 150 via a conductor 122, the third terminal 130 is electrically coupled to the second ring contact 156 of the socket 150 via a conductor 132, and the fourth terminal 140 is electrically coupled to the sleeve contact 158 of the socket 150 via a conductor 142.

The monitoring unit 170 is configured to monitor, continuously or periodically, the impedance of the audio accessory via a first signal path between the first terminal 110 and the third terminal 130 and the impedance of the audio accessory via a second signal path between the second terminal 120 and the third terminal 130, in order to detect a partial or complete removal of the plug 160 from the socket 150.

For example, a stereo audio accessory comprising left and right speakers (represented in FIG. 1 by impedances $R_L$, $R_R$ respectively) but no microphone may include a 3.5 mm TRRS plug 160 that can be received in the socket 150. A left speaker of the audio accessory is typically connected to the tip contact 162 of the plug 164, whilst a right speaker of the audio accessory is typically connected to the first ring contact 164 of the plug 164. The second ring contact 166 and possibly also the sleeve contact 168 of the plug 160 typically provides a ground connection for the audio accessory.

Thus, when the plug 160 of such an audio accessory device is fully received in the socket 150 of a host device, the tip contact 162 of the plug 160 will be electrically connected to the first terminal 110 of the monitoring unit 170, the first ring contact 164 of the plug 160 will be electrically connected to the second terminal 120 of the monitoring unit 170, the second ring contact 166 of the plug 160 will be electrically connected to the third terminal 130 of the monitoring unit 170 and the sleeve contact 168 of the plug 160 will be electrically connected to the fourth terminal 140 of the monitoring unit 170.

Accordingly, when the plug 160 of the audio accessory is fully received in the socket 150 of the host device the impedance of a first signal path between the first terminal 110 and the third terminal 130, via the audio accessory, as measured by the monitoring unit 170 (which may be referred to as the first measured impedance), will be approximately equal to the impedance $R_L$ of the left speaker of the audio accessory, and the impedance of a second signal path between the second terminal 120 and the third terminal 130, via the audio accessory, as measured by the monitoring unit 170 (which may be referred to as the second measured impedance), will be approximately equal to the impedance $R_R$ of the right speaker of the audio accessory.

Conversely, if no plug 160 is received in the socket 150 the first measured impedance will be very high, since the first signal path is open circuit, and the second measured impedance will also be very high, since the second signal path is also open circuit.

Thus, the impedance measurements made by the impedance monitoring unit 170 can be used to determine whether or not a plug 160 is received in the socket 150. For example if the first and second measured impedances are relatively low, e.g. ~16Ω, then it may be determined that a plug is present in the socket 150, since such measured impedances may correspond to the impedances, or expected impedance ranges, of the first and second speakers of an audio accessory. If the first and second measured impedances are relatively high, e.g. >10 kΩ, then it may be determined that there is no plug present in the socket 150, since such measured impedances may be indicative of open circuit conditions in the first and second signal paths.

The circuitry 100 may thus use the measured impedance values of the first and second signal paths between the terminals of the monitoring unit, via the audio accessory, to determine whether or not a plug is received in the socket 150, or may alternatively use relative impedance states of the first and second signal paths. In the example of FIG. 1, in which the plug 160 is fully received in the socket 150, a first impedance state, detected at the first terminal 110, and a second impedance state, detected at the second terminal 120, will both be low impedance (since the measured impedances of the associated first and second signal paths are relatively low), thus indicating that the plug 160 is fully received in the socket 150.

Thus, the monitoring unit 170 and associated circuitry 100 may implement "jack detect" functionality: when the monitoring unit 170 detects that both the first impedance state at the first terminal 110 and the second impedance state at second terminal 120 are low impedance (e.g. the first and second measured impedances correspond to left and right audio accessory speaker impedances respectively), then the monitoring unit 170 may determine that a plug is received in the socket 150.

However, as the plug 160 is being removed from the socket 150, the impedance states at the first and second terminals 110, 120 will change, as will be described in relation to FIGS. 2a-c, 3a-d and 4a-d. When the impedance state at at least the first terminal 110, changes in accordance with a predetermined sequence, this will be indicative of at least partial removal of the plug 160 from the socket 150. The circuitry 100 is therefore configured to output a signal S indicative of detection of at least partial removal of the plug 160 from the socket 150 in response to detection by the monitoring unit 170 of a predetermined sequence of impedance states detected at the first and/or second terminals 110, 120.

This jack detect functionality may complement existing jack detect circuitry or functionality in a host device, such that in the event of failure of such existing jack detect circuitry (e.g. failure of a mechanical switch or contact used by the existing jack detect circuitry), the insertion of a plug into a socket of the host device and the removal of a plug from the socket of the host device can still be detected.

Alternatively, the jack detect functionality implemented by the monitoring unit 170 and associated circuitry 100 may replace other types of jack detect circuitry that may otherwise be provided in a host device. This may help to reduce a bill of materials cost of the host device, since, for example, a mechanical switch component that would otherwise be required for jack detect purposes can be omitted.

Moreover, the monitoring unit 170 and associated circuitry 100 are able to detect connection or disconnection of an audio accessory to or from a host device even when the audio accessory is connected indirectly to the host device, e.g. via an extension cable or splitter cable that remains connected to the host device when the accessory device is disconnected from the extension cable or splitter cable.

Figure 2A:
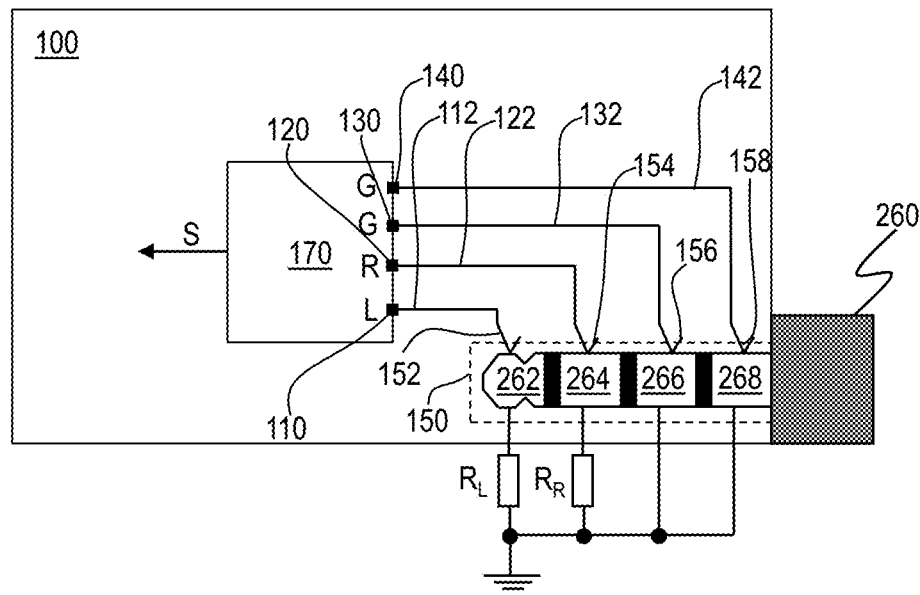
FIGS. 2a-c illustrate an example of the removal of a four-pole jack plug from a corresponding socket over a sequence of different removal states.
Figure 2B:
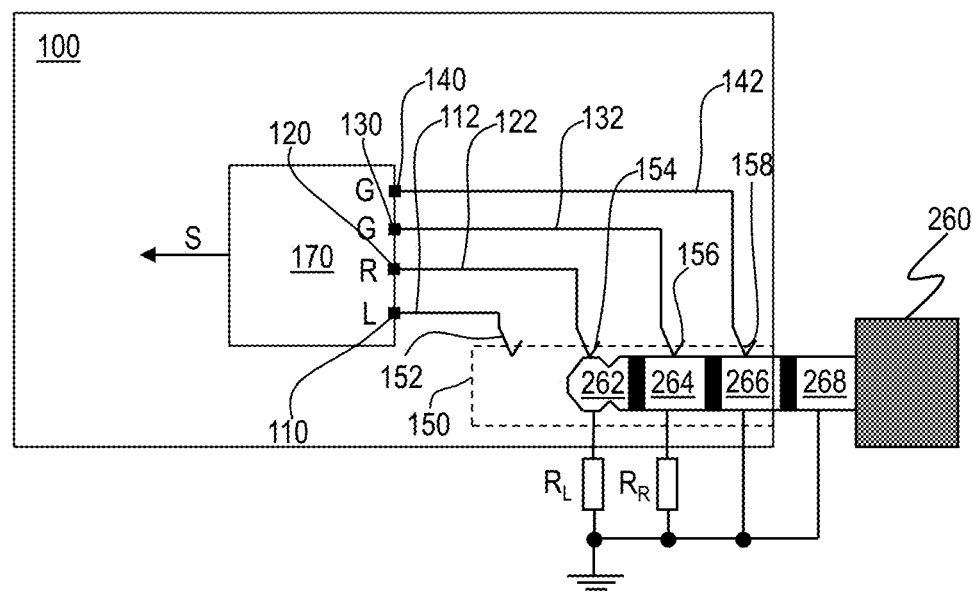
Figure 2C:
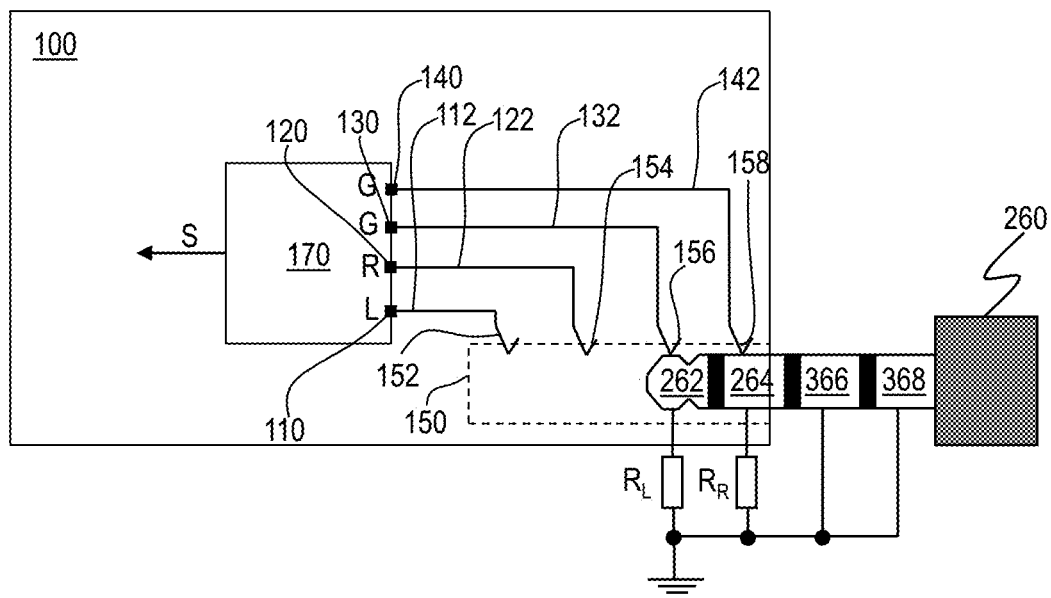

FIGS. 2a-c illustrate an example of an audio jack plug 260 being removed from a corresponding socket 150 over a sequence of different removal states. The elements in common between FIG. 1 and FIGS. 2a-c are given corresponding reference numerals.

In the illustrated example of FIG. 2, a plug 260 may comprise a TRRS jack plug to provide a connection to an audio accessory device such as a set of stereo headphones that does not include a microphone. A common configuration for the jack plug for such an accessory device is that the tip and first ring contacts 262, 264 provide connections for the left audio and right audio loads (e.g. left and right speakers), respectively, with the second ring and sleeve contact 266, 268 being connected together and providing a ground connection for the accessory device. Thus, as illustrated in FIG. 2a, the plug tip (T) contact 262 provides a connection to the left audio load $R_L$. Similarly, the first plug ring (R) contact 264 provides a connection to the right audio load $R_R$. It will be appreciated that both the left audio load $R_L$ and the right audio load $R_R$ will be substantially the same and therefore the impedance of either load may be expressed as $R_{LOAD}$. The second plug ring (R) contact 266 and the plug sleeve contact 268 of the plug 260 may both provide a connection to ground.

Therefore, as illustrated in FIG. 2a, when the plug 160 is fully received in the socket 150, the first terminal 110 of the monitoring unit 170 is electrically connected to the left load $R_L$ at the plug tip contact 262 via the socket tip contact 152, while the second terminal 120 of the monitoring unit 170 is electrically connected to the right load $R_R$ at the first plug ring contact 264 via the first socket ring contact 154.

The monitoring unit 170 further comprises a third terminal 130 and a fourth terminal 140, which are electrically connected to the second socket ring contact 156 and the socket sleeve contact 158 respectively, via respective conductors such as PCB tracks, wires or the like. As illustrated in FIG. 2a, when the plug 160 is fully received in the socket 150, the second socket ring contact 156 is electrically connected to the second plug ring contact 266 and the socket sleeve contact 158 is electrically connected to the plug sleeve contact 268. As described above, the second plug ring contact 266 and the plug sleeve contact 268 both provide a contact for connection to ground. Therefore, the third terminal 130 and the fourth terminal 140 connect the second plug ring contact 266 and the plug sleeve contact 268 to ground G, when the plug 160 is fully received in the socket 150.

With both the third and fourth terminals 130, 140 connected to ground G, either of these terminals may provide a suitable reference from which impedance measurements may be taken. Therefore, impedance measurements may be taken for a first signal path from the first terminal 110 to either the third terminal 130 or the fourth terminal 140, via the audio accessory, and for a second signal path from the second terminal 120 to either the third terminal 130 or the fourth terminal 140, via the audio accessory. In other words, a first impedance state may be detected at the first terminal 110 for a first signal path between the first terminal 110 and either the third terminal 130 or the fourth terminal 140, and a second impedance state may be detected at the second terminal 120, for a second signal path between the second terminal 120 and either the third terminal 130 or the fourth terminal 140.

In the illustrated example of FIGS. 2a-c, the fourth terminal 140 is used as the end of the first and second signal paths for the purpose of detecting the first and second impedance states.

FIG. 2a illustrates the plug 260 and the socket 150 in an initial (or first) removal state, in which the plug 260 is fully inserted in the socket 150. In this initial removal state, the impedance state at both the first terminal 110 and the second terminal 120 will be low, as the first and second terminals 110,120 are in electrical contact with the plug tip and first ring contacts 262, 264 via socket contacts 152,154, respectively. The first signal path from the first terminal 110 to the fourth terminal 140, via the audio accessory, includes the left load $R_L$, and therefore the impedance of the first signal path will be measured as $R_{LOAD}$. Accordingly, the first impedance state, detected at the first terminal 110, is low impedance. Similarly, the second signal path from the second terminal 120 the fourth terminal 140, via the audio accessory, includes the right audio load $R_R$. Therefore, the impedance of the second signal path will also be measured as $R_{LOAD}$ by monitoring unit 170. Thus the second impedance state, detected at the second terminal 120, is also low impedance.

FIG. 2b illustrates a second removal state of the plug 260 and the socket 150, in which the plug 260 is partially removed from the socket 150. In the second removal state, the plug 260 has been partially extracted from the socket 150, such that the plug sleeve contact 268 is no longer received in the socket 150. In the second removal state, the socket tip contact 152 is not in electrical contact with any of the plug contacts 262-268. The signal path from the first terminal 110 is therefore open circuit. As such, the first impedance state, detected at the first terminal 110, will be high impedance.

In the second removal state, the second terminal 120 is electrically connected to the plug tip contact 262 via the first socket ring contact 154. The signal path between the second terminal 120 and the fourth terminal 140, via the audio accessory, therefore includes the left audio load $R_L$. As the impedances of the left audio load $R_L$ and the right audio load $R_R$ are substantially the same, the impedance of this signal path will therefore again be measured as $R_{LOAD}$ in the second removal state, and thus the impedance state, detected at the second terminal 120, when the plug 160 and the socket 150 are in the second removal state will be low impedance.

FIG. 2c illustrates the plug 260 and the socket 150 in a third removal state, which for the purposes of the present disclosure is equivalent to the full removal of the plug 260 from the socket 150. In the third removal state, the plug tip contact 262 and the first plug ring contacts 264 are received in the socket 150, in contact with the second socket ring contact 156 and the socket sleeve contact 158 respectively. However, the second socket ring contact 156 and the socket sleeve contact 158 are both grounded. The left and right audio contacts of the plug 260 (i.e. the socket tip contact 262 and the first socket ring contact 264) are therefore no longer in contact with the socket contacts of the socket 150 through which audio signals can be supplied to the left and/or right plug contacts (i.e. the socket tip contact 152 and the first socket ring contact 154). Therefore, neither of left audio load $R_L$ and right audio load $R_R$ can be driven in the third removal state. Accordingly, when the plug 260 and the socket 150 adopt the third removal state, the plug 260 will be considered to be removed from the socket 150 for the purposes of the present disclosure.

In the third removal state, the first terminal 110 is again not connected to any of the plug contacts 262-268. Therefore the first impedance state, detected at the first terminal 110, will again be high impedance. The first socket ring contact 154 is no longer in electrical contact with any of the plug contacts 262-268 in the third removal state. Therefore, the second impedance state, detected at the second terminal 120, will also be high impedance.

As will be apparent from FIG. 2c, in the third removal state a third signal path between the third and fourth terminals 130, 140 of the monitoring unit 170, via the audio accessory, will include the left and right loads $R_L$, $R_R$ and thus the impedance of this third signal path will be approximately equal to $2R_{LOAD}$. The monitoring unit 170 could be configured to monitor the impedance of the third signal path, either continuously or in response to detection of high impedance states of the first and second signal paths, in order to detect or verify removal of the plug 260 from the socket 150 by detecting a change of the impedance of the third signal path to approximately $2R_{LOAD}$.

The sequence of values of the first and second impedance states as the plug 260 is removed from the socket 150 over the first to third removal states illustrated in FIGS. 2a-c may therefore be expressed according to Table 1:

TABLE 1

| Removal State | First Impedance State | Second Impedance State |
| --- | --- | --- |
| First | Low-Z ($R_{LOAD}$) | Low-Z ($R_{LOAD}$) |
| Second | High-Z | $R_{LOAD}$ |
| Third | High-Z | High-Z |

The changing sequence of the first and/or second impedance states detected at the first and/or second terminals 110, 120 respectively may therefore be indicative of the removal of the plug 260 from the socket 150. As the plug 260 is removed from the socket 150, the plug 260 and socket 150 will sequentially adopt the first, second and third removal states illustrated in FIGS. 2a-c. The monitoring unit 170 is therefore configured to detect a sequence of first and/or second impedance states, and when the detected sequence of first and/or second impedance states corresponds to the relevant sequence(s) in Table 1, the monitoring unit 170 will detect that the plug 260 has been removed from socket 150.

The circuitry 100 is configured to output a signal S indicative of detection of at least partial removal of the plug 260 from the socket 150 when the monitoring unit 170 detects this predetermined sequence. The signal S may be sent to a controller (not illustrated) of the host device, which may, in response to the signal S, suspend the generation and supply of audio signals to the socket 150, thereby reducing power consumption of the host device, since audio signals are not unnecessarily generated and output.

The monitoring unit 170 may comprise a processor and/or circuitry configured to detect one or more of the predetermined sequences denoted in Table 1, indicative of removal of the plug 260 from socket 150. In another example the monitoring unit 170 may detect the first and second impedance states (e.g. by measuring the impedances of signal paths from the first and second terminals 110, 120, as described above) and transmit the detected impedance states to a downstream processor. The downstream processor may log the detected sequences of the first and/or second impedance states and, when one or more of the logged sequences of impedance states corresponds to a predetermined sequence, may output the signal S to a controller to suspend audio output by the host device.

FIGS. 3*a-d* illustrate another example of an audio jack plug 360 being removed from a corresponding socket 150 over a sequence of different removal states. The elements in common between FIG. 1, FIGS. 2*a-c* and FIGS. 3*a-d* are given corresponding reference numerals.

Figure 3A:
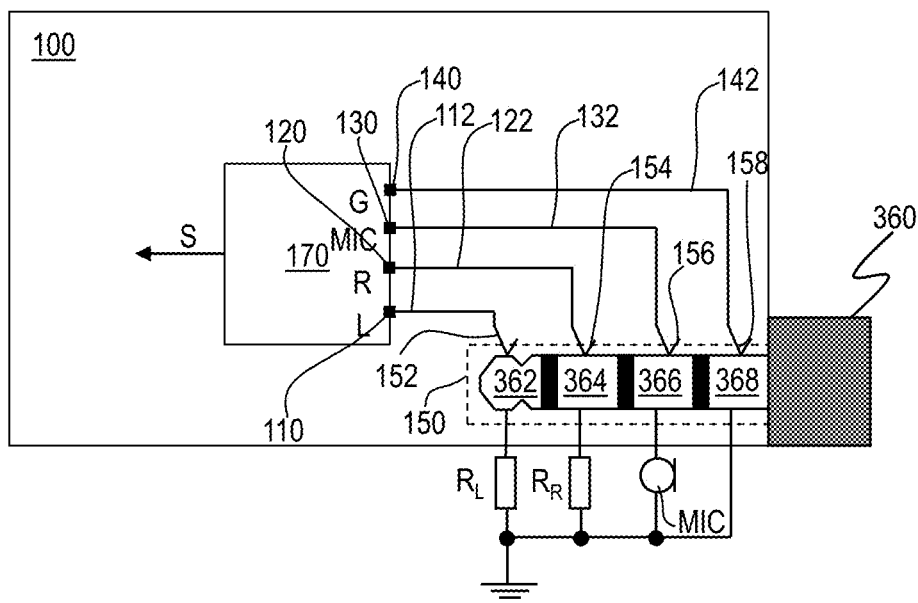
FIGS. 3a-d illustrate another example of the removal of a four-pole jack plug from a corresponding socket over a sequence of different removal states.

In the example of FIGS. 3*a-d*, a plug 360 may form part of an audio accessory device which has microphone capabilities, e.g. a stereo headset. One TRRS plug contact configuration for such an accessory device is left audio, right audio, microphone and ground, respectively. Therefore, as illustrated in FIG. 3*a*, the plug tip and first plug ring contacts 362, 364 comprise the left audio contact and right audio contacts, illustrated by left load $R_L$ and right load $R_R$, respectively, in FIG. 3*a*. As in the example of FIG. 2*a*, the first terminal 110 is electrically connected to the plug tip contact 362 when the plug 360 is fully received in socket 150. Similarly, the second terminal 120 is electrically connected to the first plug ring contact 364 when the plug 360 is fully received in the socket 150.

The second plug ring contact 366 comprises the microphone contact of the plug 360, which is illustrated by microphone MIC at the second plug ring contact 366. When the plug 360 is fully received in the socket 150 as shown in FIG. 3*a*, the third terminal 130 of the monitoring unit 170 is electrically connected to the second plug ring contact 366.

The plug sleeve contact 368 provides a ground contact of the plug 360. When the plug 360 is fully received in the socket 150 as shown in FIG. 3*a*, the fourth terminal 140 of the monitoring unit 170 is electrically connected to the plug sleeve contact 368. The fourth terminal 140 is also connected to a ground plane or rail of the circuitry 100.

As described with reference to FIGS. 2*a-c*, the fourth terminal 140 acts as the end of the first and second signal paths (which start at the first and second terminals 110, 120 respectively) for which the first and second impedances are measured by the monitoring unit 170.

As illustrated in FIG. 3*a*, with the plug 360 fully received in the socket 150 in an initial or first removal state, the first signal path between the first terminal 110 and the fourth terminal 140, via the audio accessory, includes the left audio load impedance $R_L$ (which is equal to $R_{LOAD}$ as explained above with reference to FIGS. 2*a*-2*c*) and the second signal path between the second terminal 120 the fourth terminal 140, via the audio accessory, includes the right audio load impedance $R_R$ (which is also equal to $R_{LOAD}$ as explained above with reference to FIGS. 2*a*-2*c*). Thus in this initial removal state, the first impedance state, detected at the first terminal 110, and the second impedance state, detected at the second terminal 120, will be both be $R_{LOAD}$ (or low impedance), indicating a low measured impedance of both the first signal path between the first terminal 110 and the fourth terminal 140 and the second signal path between the second terminal 120 and the fourth terminal 140.

The monitoring unit 170 may be further configured to monitor a third impedance state at the third terminal 130. When the plug 360 is fully received in socket 150, as shown in FIG. 3*a*, the impedance of a third signal path between the third terminal 130 and the fourth terminal 140, via the audio accessory, will be approximately equal to the impedance of the microphone MIC. For example, the measured impedance of the third signal path may be approximately 2.2 kΩ.

The changing value of the third impedance state at third terminal 130 may be used in conjunction with the changing values of the first and/or second impedance states to detect or confirm removal of the plug 360 from the socket 150.

In the initial removal state, the second socket ring contact 156 is in electrical contact with the second plug ring contact 366, which is connected to the microphone MIC. The signal path from the third terminal 130 to the fourth terminal 140, via the audio accessory, therefore includes microphone MIC. Therefore, the impedance of the third signal path between the third terminal 130 the fourth terminal 140 will be measured as the impedance $R_{MIC}$ of the microphone.

Figure 3B:
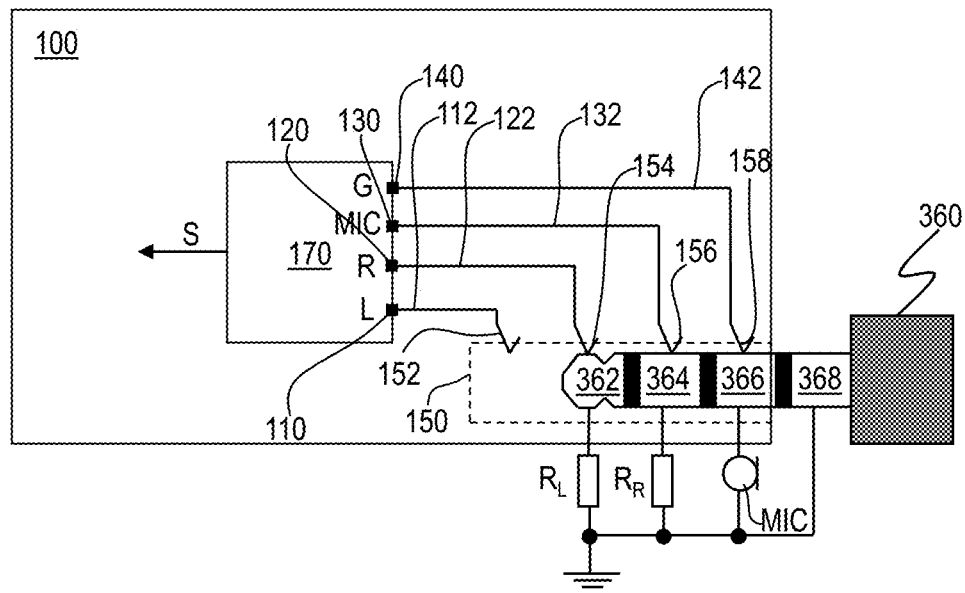

FIG. 3*b* illustrates a second removal state of the plug 360 and the socket 150, in which the plug 360 is partially removed from socket 150. In the second removal state, the first signal path from first terminal 110 is open circuit, as the socket tip contact 152 is not in contact with any of the plug contacts 362-368. Therefore, the first impedance state, detected at the first terminal 110, will be high impedance.

The second terminal 120 is electrically connected to the plug tip contact 362 via the first socket ring contact 154. The second signal path from the second terminal 120 to the fourth terminal 140, via the audio accessory, includes the left audio load impedance $R_L$ and the microphone MIC. As the left audio load $R_L$ impedance is substantially equal to right audio load impedance $R_R$, the measured impedance of the second signal path will be approximately $R_{LOAD}+R_{MIC}$. The second impedance state, detected at the second terminal 120, will therefore increase to approximately $R_{LOAD}+R_{MIC}$ in the second removal state.

The third signal path from the third terminal 130 to the fourth terminal 140, via the audio accessory, includes the right audio load $R_R$ and the microphone MIC, due to the contact between the second socket ring contact 156 and the second plug ring contact 366. Therefore, in the second removal state the impedance of the third signal path between the third terminal 130 and the fourth terminal 140 will be measured as $R_{LOAD}+R_{MIC}$. Thus the detected impedance state at the third terminal 130 in the second removal state will be approximately $R_{LOAD}+R_{MIC}$.

Figure 3C:
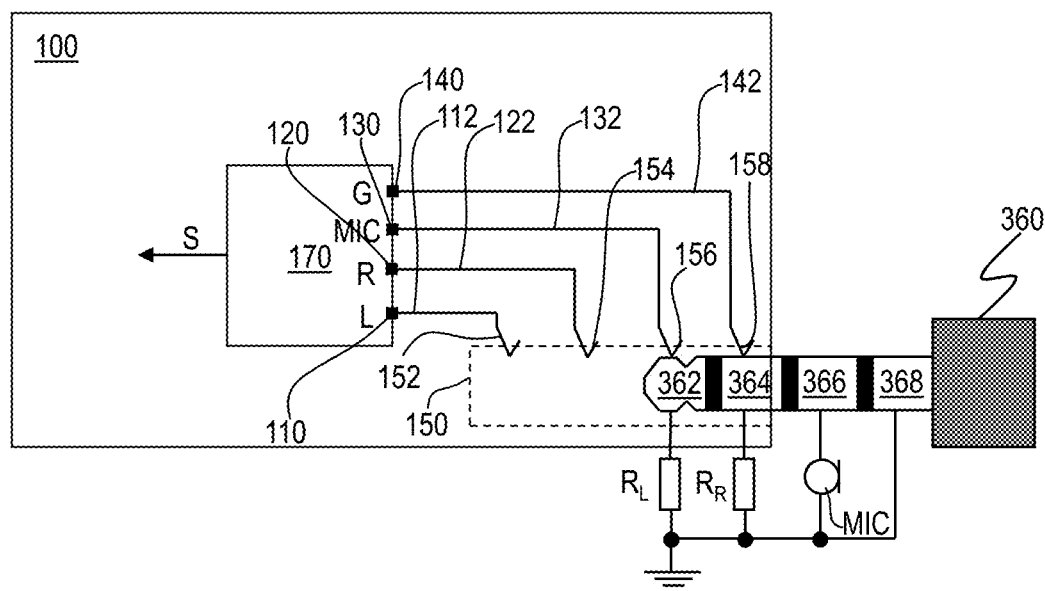

FIG. 3*c* illustrates a third removal state of the plug 360 and the socket 150, in which the plug 360 is partially removed from the socket 150. In the third removal state, the first impedance state, detected at the first terminal 110, is again high impedance, due to the absence of any electrical connection between the first terminal 110 and any of the plug contacts 362-368. Similarly, in the third removal state, the second terminal 120 is not electrically connected to any of the plug contacts 362-368. Therefore, the signal path from second terminal 120 is open circuit. As such, the second impedance state, detected at the second terminal 120, is also high impedance.

In the third removal state, the signal path between the third terminal 130 and the fourth terminal 140, via the audio accessory, includes the left audio load $R_L$ and the right audio load $R_R$. As the impedances of the left audio load $R_L$ and the right audio load $R_R$ are substantially the same, the measured impedance of the third signal path in the third removal state will be measured as $R_L+R_R=2R_{LOAD}$, and thus the detected impedance state at the third terminal in the third removal state will be approximately $2R_{LOAD}$.

Figure 3D:
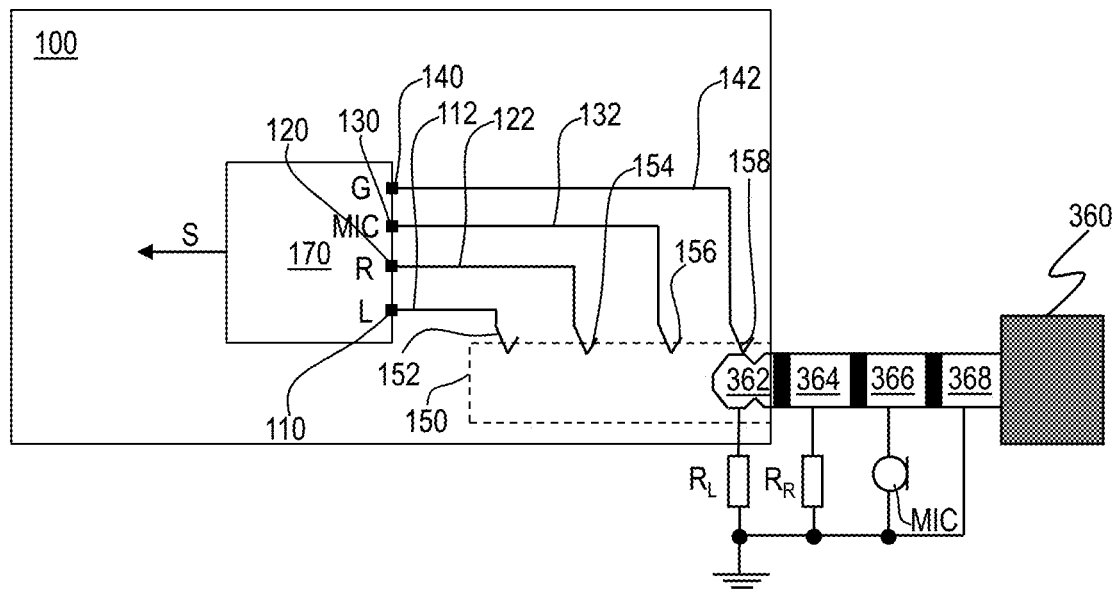

FIG. 3*d* illustrates a fourth removal state of the plug 360 from the socket 150, which for the purposes of the present disclosure is equivalent to the full removal of the plug 360 from the socket 150. FIG. 3d illustrates that the plug tip contact 362 is received in the socket 150 and in contact with the socket sleeve contact 158 (which is grounded as a result of its connection to the fourth terminal 140), but none of the other plug contacts 364-368 are in contact with any of the socket contacts 152-158. Therefore, when the plug 360 and the socket 150 adopt the fourth removal state, the plug 360 will be considered to have been removed from the socket 150 for the purposes of this disclosure.

In the fourth removal state illustrated in FIG. 3d, the first terminal 110, second terminal 120 and third terminal 130 are not in electrical contact with any of the plug contacts 362-368. Therefore, the signal paths from the first, second and third terminals 110-130 are all open circuit and therefore the first, second and third impedance states will all be high impedance.

The sequence of values of the first, second and third impedance states as the plug 360 is removed from the socket 150 over the first to fourth removal states illustrated in FIGS. 3a-d may therefore be expressed according to Table 2:

TABLE 2

| Removal state | First Impedance State | Second Impedance State | Third Impedance State |
|---|---|---|---|
| First | $R_{LOAD}$ | $R_{LOAD}$ | $R_{MIC}$ |
| Second | High-Z | $R_{LOAD} + R_{MIC}$ | $R_{LOAD} + R_{MIC}$ |
| Third | High-Z | High-Z | $2R_{LOAD}$ |
| Fourth | High-Z | High-Z | High-Z |

When a TRRS plug with a left-right-microphone-ground configuration is removed from the socket 150, the plug 360 and the socket 150 will adopt the first to fourth removal states illustrated in FIGS. 3a-d. The first, second and third impedance states will therefore adopt the changing sequence of impedance states denoted in Table 2.

One or more of the changing impedance states of Table 2 may therefore form another predetermined sequence of impedance states indicative of at least partial removal of a plug 360 from the socket 150. The monitoring unit 170 may therefore be configured to detect one or more of the predetermined sequences of impedance states in Table 2 and to output a signal S indicative of detection of removal of the electrical plug 360 from the electrical socket 150 in response to the detection.

FIGS. 4a-d illustrate another example of an audio jack plug 460 being removed from a corresponding socket 150 over a sequence of different removal states. The elements in common between FIG. 1, FIGS. 2a-c, FIGS. 3a-d and FIG. 4a-d are given corresponding reference numerals.

Figure 4A:
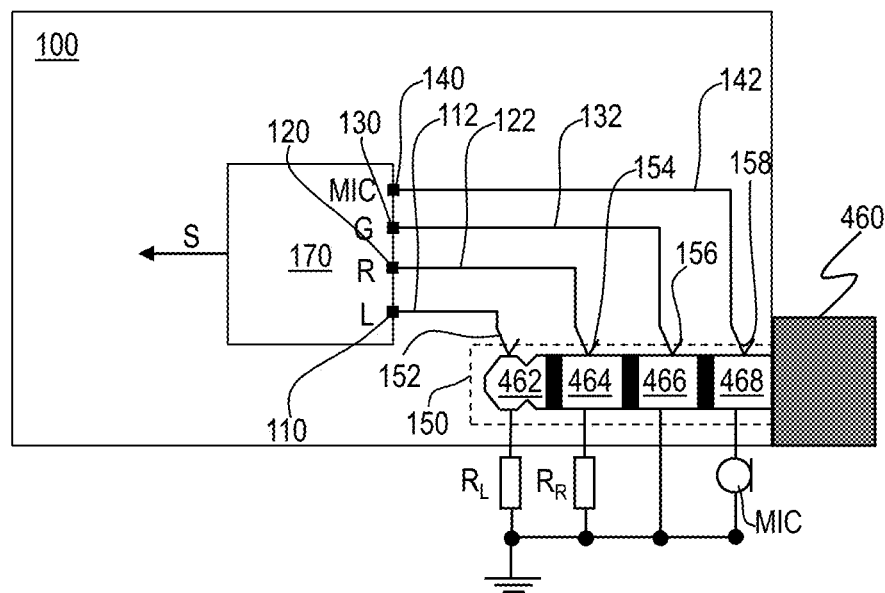
FIGS. 4a-d illustrate a further example of the removal of four-pole jack plug from a corresponding socket over a sequence of different removal states.

FIG. 4a illustrates another example of a TRRS jack plug 460 providing a connection to an audio accessory device having stereo audio and microphone capabilities. The plug 460 comprises left audio, right audio, microphone and ground contacts, as described above with reference to FIGS. 3a-d. However, FIGS. 4a-d illustrate an alternative configuration of the contacts, in which the microphone MIC is connected to the plug sleeve contact 468 and the ground contact is provided at the second plug ring contact 466. The TRRS contacts of the plug 460 therefore provide left audio, right audio, microphone and ground contacts, respectively.

The plug tip contact 462 therefore provides a connection to the left audio load $R_L$ and first plug ring contact 464 provides a connection to the right audio load $R_R$. The second plug ring contact 466 provides a connection to ground and the plug sleeve contact 468 provides a connection to the microphone MIC. In the example illustrated in FIGS. 4a-d, the third terminal 130 will therefore act as the end of the first, second and third signal paths (which start at the first, second and fourth terminals 110, 120, 140 respectively) whose impedances are measured by the monitoring unit 170. The third terminal 130 may also be connected to a ground plane or rail of the circuitry 100.

FIG. 4a illustrates a first removal state of the plug 460 and the socket 150, in which the plug 460 is fully received in the socket 150. The socket tip contact 152 is therefore electrically connected to the plug tip contact 462. The first signal path from the first terminal 110 to the third terminal 130, via the audio accessory, therefore includes the left audio load $R_L$. Therefore, the measured impedance of the first signal path will be approximately equal to the impedance of the left audio load, and so the first impedance state detected at the first terminal 110 will be ROAD. Similarly, the second signal path from the second terminal 120 the third terminal 130, via the audio accessory, includes the right audio load $R_R$, due to the connection between the first socket ring contact 154 and the first plug ring contact 464. Therefore, in the first removal state, the measured impedance of the second signal path will be approximately equal to the impedance $R_R$ of the right audio load, and so the second impedance state detected at the second terminal 120 will also be $R_{LOAD}$.

FIG. 4a illustrates that the fourth terminal 140 is connected to the microphone MIC through the electrical contact between the socket sleeve contact 158 and the plug sleeve contact 468. The third signal path from the fourth terminal 140 to the third terminal 130, via the audio accessory, includes the microphone MIC, which has an impedance of $R_{MIC}$. As such the measured impedance of the third signal path between the fourth terminal 140 and the third terminal 130 will be approximately $R_{MIC}$. Thus, the third impedance state, detected at the fourth terminal 140, will be $R_{MIC}$.

Figure 4B:
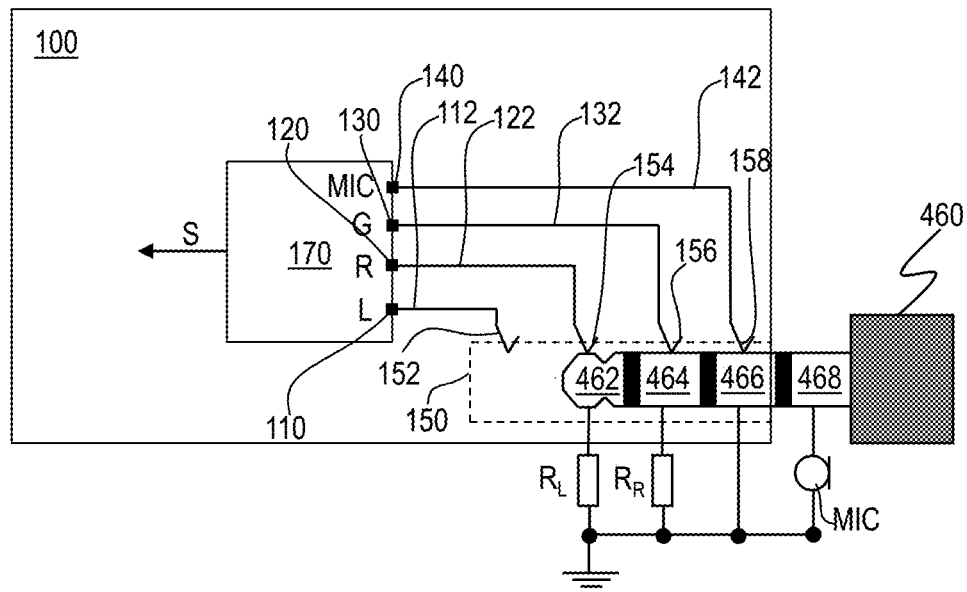

FIG. 4b illustrates a second removal state of the plug 460 from the socket 150, in which the plug 460 is partially removed from the socket 150. In the second removal state the first signal path from the first terminal 110 does not electrically contact any of the plug contacts 462-468 and is thus open circuit. Therefore, the first impedance state detected at the first terminal 110 will be high impedance.

In the second removal state, the second terminal 120 is electrically connected to the plug tip contact 462 and the third terminal 130 is electrically connected to the first plug ring contact 464. The second signal path between the second terminal 120 and the third terminal 130, via the audio accessory, therefore includes the left load $R_L$ and the right load $R_R$ (which each have an impedance of $R_{LOAD}$), and so the measured impedance of the second signal path will be approximately $2R_{LOAD}$. Thus the second impedance state detected at the second terminal 120 will be $2R_{LOAD}$.

The fourth terminal 140 is electrically connected to the second plug ring contact 466. The third signal path between the fourth terminal 140 and the third terminal 130, via the audio accessory, includes the right audio load $R_R$, and so the measured impedance of this signal path will be $R_R$. The third impedance state at the fourth terminal 140 will therefore be $R_{LOAD}$.

Figure 4C:
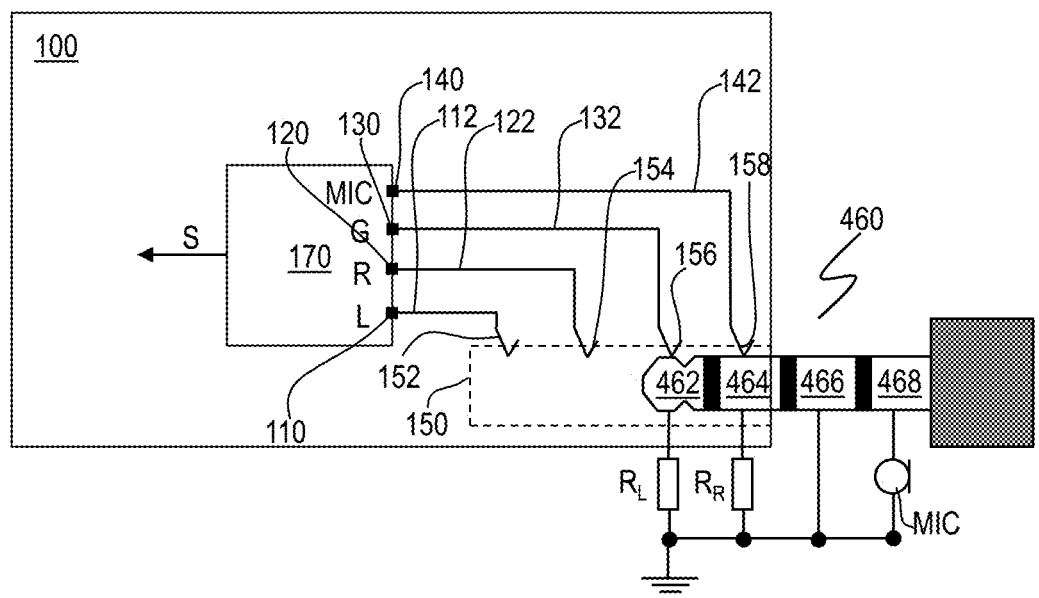

FIG. 4c illustrates a third removal state of the plug 460 and the socket 150, in which the plug 460 is partially removed from the socket 150. In the third removal state neither the first terminal 110 nor the second terminal 120 is electrically connected to any of the plug contacts 462-468. Therefore the first and second signal paths (between the first terminal 110 and the third terminal 130 and between the second terminal 120 and the third terminal 130 respectively) are both open circuit and so the first and second impedance states detected at the first and second terminals 110,120 will both be high impedance.

In the third removal state illustrated in FIG. 4c, the third signal path between the fourth terminal 140 and the third terminal 130, via the audio accessory, includes the left audio load $R_L$ and the right audio load $R_R$ (which each have an impedance of ROAD), such that the measured impedance of the third signal path is $2R_{LOAD}$. The third impedance state, detected at the fourth terminal 140, will therefore be $2R_{LOAD}$.

Figure 4D:
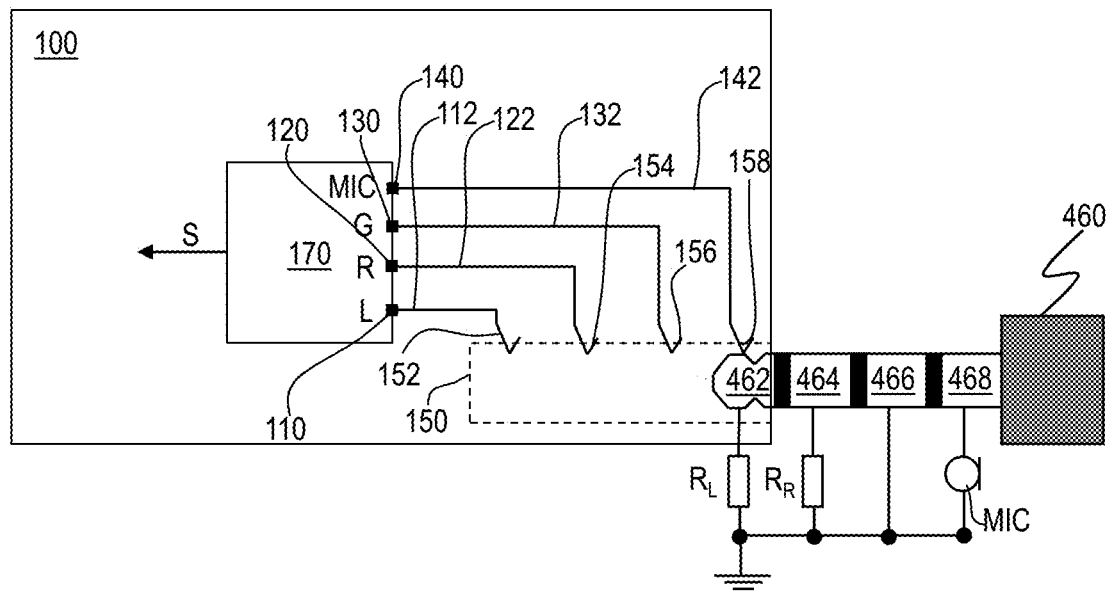

FIG. 4d illustrates a fourth removal state of the plug 460 and the socket 150, which, as described above with reference to FIG. 3d, is equivalent to the full removal of the plug 460 from the socket 150 for the purposes of the present disclosure.

In the fourth removal state, the first and second terminals 110,120 are not electrically connected to any of the plug contacts 462-468. Therefore, the first and second impedance states detected at the first and second terminals respectively will both be high impedance.

The fourth terminal 140 is electrically connected to the plug tip contact 462 in the fourth removal state. However, there is no plug contact connected to the third terminal 130. Therefore, the third signal path from the fourth terminal 140 to the third terminal is open circuit. Therefore, the third impedance state, detected at the fourth terminal 140, will be high impedance in the fourth removal state illustrated in FIG. 4d.

The sequence of values of the first, second and third impedance states as the plug 460 is removed from the socket 150 over the first to four removal states illustrated in FIGS. 4a-d may therefore be expressed according to Table 3:

TABLE 3

| Removal state | First Impedance State | Second Impedance State | Third Impedance State |
|---|---|---|---|
| First | $R_{LOAD}$ | $R_{LOAD}$ | $R_{MIC}$ |
| Second | High-Z | $2R_{LOAD}$ | $R_{LOAD}$ |
| Third | High-Z | High-Z | $2R_{LOAD}$ |
| Fourth | High-Z | High-Z | High-Z |

When a TRRS plug with a left-right-ground-microphone configuration is removed from the socket 150, the plug 460 and the socket 150 will adopt the first to fourth removal states of the plug 460 and socket 150 illustrated in FIGS. 4a-d. The first, second and third impedance states will therefore adopt the changing sequence of values denoted in Table 3.

One or more of the changing impedance states of Table 3 may therefore form another predetermined sequence of impedance states indicative of at least partial removal of plug 460 from socket 150. Monitoring unit 170 may therefore be configured to detect the predetermined sequence of impedance states in Table 3 and output a signal S indicative of detection of removal of the electrical plug 460 from the electrical socket 150 in response to the detection.

The circuitry 100 is therefore capable of detecting a jack extraction event, i.e. the removal of a plug 160, 260, 360, 460 from the socket 150. The circuitry 100 may operate in conjunction with or as an alternative to conventional "jack detect" circuitry, such as the mechanical switch implementation described above.

It will be appreciated that the circuitry 100 is able to detect a jack extraction event even when an accessory device is connected to a host electronic device via an extension cable or a splitter cable that is plugged into the host electronic device, as the removal of a plug 160, 260, 360, 460 from a socket of the extension cable will generate a number of detectable sequences of impedance states. The circuitry 100 detects the removal of an accessory device from an extension cable by detecting a predetermined sequence of impedance states, which occurs regardless of whether the plug of the accessory device is received in the socket of the host device or the socket of an extension cable or splitter cable. Thus the predetermined sequence is detected by the circuitry 100 even when the plug 160, 260, 360, 460 is removed from the socket 150 of an extension cable, and so an extraction event can be detected and recorded even when an accessory device is connected to the host device via an extension cable. In contrast, with conventional jack detect circuitry, the removal of a plug from a socket of an extension cable would not result in the circuitry detecting an extraction event because the plug of the extension cable would remain in the socket of the host device.

The monitoring unit 170 is therefore configured to monitor the impedance states detected at the terminals 110-140 and when the impedance states correspond to a predetermined sequence e.g. any of the sequences denoted in Tables 1-3, the circuitry 100 outputs a signal indicative of removal of a plug 160, 260, 360, 460 from the socket 150. It will be appreciated that the sequences denoted in Tables 1-3 are examples of predetermined sequences and the skilled person will understand that a predetermined sequence could be determined for any TRRS plug contact configuration, for different impedances states that may be detected during the extraction of the plug(s) of one or more accessory devices from one or more sockets of a splitter cable, or indeed for any configuration of different types of complementary plugs and sockets.

A memory may be associated with the monitoring unit 170 and may store the one or more predetermined sequences for detecting the removal of jack plugs of different configurations from a socket, and/or predetermined sequences indicative of the removal of the plug(s) of one or more accessory devices from one or more sockets of a splitter cable. The monitoring unit 170 may comprise a processor that logs the impedance states detected at terminals 110-140 and is configured to detect the removal of a plug from the socket 150 or from a socket of a splitter cable when the detected sequence of impedance states corresponds to any of the stored predetermined sequences. The monitoring unit 170 may be configured to transmit the detected impedance states to a downstream processor, which may detect the removal of a plug from the socket 150 or from a socket of a splitter cable when the detected impedance states correspond with any of the predetermined sequences stored in the memory.

The circuitry 100 may be configured to detect the type of plug received in a socket 150. For example, using conventional microphone detection circuitry, the circuitry 100 may determine that the plug comprises a microphone contact and may further determine which contact of the plug comprises the microphone contact. In response to detecting the type of plug received in the socket 150, a processor may select the corresponding predetermined sequence to detect the removal of the plug from the socket 150. For example, in response to circuitry 100 determining that a TRRS plug with left-right-microphone-ground contacts is received in the socket 150, the processor may select one or more of the sequences denoted in Table 2 to detect the removal of the plug from the socket 150.

The circuitry 100 may output the signal S indicative of detection of removal of the plug from the socket 150 in response to the predetermined sequence of impedance states occurring within a predetermined time period. The predetermined time period may correspond to an average or expected removal time of a plug from socket 150 e.g. 500 ms. Detection of the plug 160, 260, 360, 460 moving from the first removal state to the second removal state in socket 150, may act as trigger for monitoring unit 170 to detect the predetermined sequence of impedance states.

When the circuitry 100 or other jack detect circuitry determines that a plug is fully received in the socket 150, the circuitry 100 may enter an idle mode in which the impedance of the signal paths connected to the terminals 110-140 is not continuously monitored and instead is periodically determined. For example, one of the terminals 110-140 may be periodically polled, e.g. every 500 ms, to measure the impedance of the associated signal path. This mode of operation may reduce power consumption compared to a continuous impedance measurement.

However, in response to determining that a trigger event or sequence has occurred e.g. the plug moving to the second removal state in socket 150, the monitoring unit 170 may enter an "active" mode of operation in which the monitoring unit 170 continuously monitors the impedance states at terminals 110-140 to detect a predetermined sequence of impedance states.

Referring to Tables 1-3, a common feature of all the sequences is the first impedance state at the first terminal 110 being low impedance (e.g. $R_{LOAD}$) in the first removal state and high impedance in the second removal state. Therefore in one embodiment, the first impedance state transitioning from $R_{LOAD}$ (or a low impedance state) in the first removal state to a high impedance state may act as a trigger for the monitoring unit 170 to enter the "active" mode to detect a predetermined sequence of impedance states within a predetermined time period. Detection of this trigger sequence may therefore act as the starting point for the predetermined time period.

In response to the trigger sequence or event, the monitoring unit 170 may operate in the "active" mode for the predetermined time period to detect a predetermined sequence of impedance states. In response to the monitoring unit 170 detecting a predetermined sequence of impedance states within the predetermined time period, the circuitry 100 outputs a signal S indicative of full removal of the plug from the socket 150.

In some situations the monitoring unit 170 may not detect a predetermined sequence of impedance states within the predetermined time period. In one example, the plug may only be partially removed from the socket 150 within the predetermined time period e.g. the plug and socket 150 may not move beyond the second removal state within the predetermined time period.

In such examples, the circuitry 100 may output a signal S indicative of detection of partial removal of the plug from the socket 150. The signal S may again be transmitted to a controller to cause the controller to suspend output of audio signals to the relevant contacts of the socket 150. As the plug is partially removed from the socket 150, the plug is not received in a manner that permits the accessory device to correctly receive the audio signals, and so outputting audio signals would result in unnecessary power consumption of the host device.

In some examples, the monitoring unit 170 may be configured to monitor the first and second impedance states detected at the first and second terminals 110,120 to detect a predetermined sequence indicative of at least partial removal of the plug from socket 150, and to monitor the third impedance state detected at the third terminal 130 to determine whether a full or a partial removal of the plug from the socket 150 has occurred.

For example, referring again to FIG. 4a, the plug 460 may be fully received in the socket 150 (i.e. the plug 460 and the socket are in the first removal state) and the monitoring unit 170 may continuously monitor the first and second impedance states at the first and second terminals 110,120. The first and second impedance states will therefore be indicative of the load impedance ROAD. However, the monitoring unit 170 may not monitor the third impedance state at the fourth terminal 140 when the plug 460 and the socket 150 are in the first removal state.

Upon partial removal of the plug 460 from the socket 150, the plug 460 will be moved to the second removal state illustrated in FIG. 4b. In the second removal state, the monitoring unit 170 may again monitor the first and second impedance states at the first and second terminals 110, 120. However, again, the monitoring unit 170 may be configured not to monitor the third impedance state at the fourth terminal 140 in the second removal state. The first impedance state is indicative of a measured high impedance value and the second impedance state is indicative of a measured impedance value of $2R_{LOAD}$ in the second removal state.

The plug 460 may be moved to the third removal state, in which the plug 460 is again partially removed from socket 150. In this removal state the first and second impedance states are indicative of measured high impedance values. The sequence of the first and second impedance states over the first to third removal states may therefore be denoted according to Table 4:

TABLE 4

| Removal state | First Impedance State | Second Impedance State |
|---|---|---|
| First | $R_{LOAD}$ | $R_{LOAD}$ |
| Second | High-Z | $2R_{LOAD}$ |
| Third | High-Z | High-Z |

In response to detecting the sequence of changing impedance states denoted in Table 4, the monitoring unit 170 may detect that at least a partial removal of the plug 460 from the socket 150 has occurred. To determine whether a partial removal has occurred (i.e. the plug 460 is received in socket 150 in the third removal state) or a full removal has occurred (e.g. the plug 460 is received in socket 150 in the fourth removal state), the monitoring unit 170 may begin to monitor the third impedance state of the third signal path from the fourth terminal 140 to the third terminal 130.

Therefore, in response to detecting a first predetermined sequence of the first and second impedance states in Table 4, the monitoring unit 170 may monitor the third impedance state to determine if a partial or a full removal of the plug 460 from the socket 150 has occurred.

In the third removal state, the third impedance state is indicative of a measured impedance value of $2R_{LOAD}$. If the monitoring unit 170 detects this third impedance state for a predetermined period of time, then it will determine that a partial removal of plug 460 from socket 150 has occurred.

The signal S will therefore be indicative that the plug 460 has been partially removed from socket 150.

If the third impedance state transitions from $2R_{LOAD}$ to a high impedance state within the predetermined time period, then the circuitry 100 may determine that the plug 460 has moved to the fourth removal state illustrated in FIG. 4d, i.e. that the plug 460 has been fully removed from the socket 150. The third impedance state transitioning from a first value (e.g. $2R_{LOAD}$) to a second value (e.g. high impedance) may therefore correspond to a second predetermined sequence of impedance states. In response to detection by the monitoring unit 170 of the second predetermined sequence of impedance states within the predetermined time period the signal S will be indicative that a full removal of the plug 460 from the socket 150 has occurred. In another example, when the third impedance state is initially detected as high impedance, then it may be determined that a full removal of the plug 460 from the socket 150 has occurred.

Monitoring the third impedance state therefore clarifies if a plug has been partially or fully removed from the socket 150. Furthermore, monitoring the third impedance state only after an initial predetermined sequence of the first and second impedance states has occurred reduces power consumption, as the additional third impedance state is used less frequently compared to a continuous detection across all removal states, as described with reference to FIGS. 3a-d and 4a-d.

In one embodiment, in response to receiving the signal S indicative of partial removal of a plug from the socket 150, the controller may output an error message. In an example in which the circuitry 100 and the socket 150 are part of an electronic device, an error message, alert or warning may be output via a user interface of the electronic device. The error message, alert or warning may notify a user that the plug of an accessory device is not correctly received in the socket 150 correctly.

In some embodiments, the impedance states may not be measured as absolute values Instead the monitoring unit 170 may detect whether the impedance of the signal paths associated with the terminals 110-140 is high or low. The impedance of the signal paths associated with the terminals 110-140 may be compared to a threshold impedance using comparator circuitry. If the impedance associated with a terminal is greater than the threshold impedance, then the comparator circuitry may output the corresponding impedance state as a high value. This will therefore be indicative that the corresponding terminal is not electrically connected to a plug contact and the signal path from the corresponding terminal is open circuit. When the impedance from a terminal is less than the threshold impedance this will be indicative that a plug contact is electrically connected to the terminal. The corresponding impedance state will therefore be output as a low value.

Using only two values for the impedance states in this way may reduce the number of predetermined sequences stored in a memory by circuitry 100. For example, the predetermined sequence for both the left-right-microphone-ground TRRS plug described with reference to FIGS. 3a-d and the left-right-ground-microphone TRRS plug described with reference to FIGS. 4a-d, may both be expressed according to Table 5:

TABLE 5

| Removal state | First Impedance State | Second Impedance State | Third Impedance State |
|---|---|---|---|
| First | Low | Low | Low |
| Second | High | Low | Low |
| Third | High | High | Low |
| Fourth | High | High | High |

Therefore, the sequence of impedance states denoted in Table 5 may be used to detect removal of a left-right-microphone-ground configured TRRS plug and a left-right-ground-microphone TRRS configured plug from the socket 150. A single predetermined sequence of impedance states may therefore be used to detect the removal of two types of plugs. Only one predetermined sequence of impedance states to detect the removal of a plurality of different types or configurations of plugs may therefore be stored in a memory associated with circuitry 100. This may therefore reduce the amount of memory required compared to storing a plurality of predetermined impedance states for a corresponding plurality of plug types.

The circuitry described above with reference to FIGS. 1-4 can be used to detect removal of the plug of an audio accessory from the socket of a host device or from the socket of an extension cable or splitter cable that is connected to the socket of the host device while audio signals are being output (via the socket of the host device) to the accessory device without injecting DC voltages that would give rise to undesirable audio artefacts such as clicks and pops. This is achieved by measuring the impedance of one or more signal paths as discussed above while the audio signals are being output.

The skilled person will be aware of several methods for measuring the impedance of a signal path as discussed above. For example, the monitoring unit 170 could be configured to measure the ground return current in the signal paths between terminals of the monitoring unit. As will be appreciated, for a given signal level in a signal path the ground return current in the signal path will vary depending upon the impedance state of the signal path.

For example, referring to FIGS. 2a-2c, in the first removal state illustrated in FIG. 2a the ground return current in the first signal path between the first and fourth terminals 110, 140 for a given signal level will take a first value, and the ground return current in the second signal path between the second and fourth terminals 120, 140 for a given signal level will take a second value (which may be approximately equal to the first value, as the impedance of the left audio load $R_L$ is equal to the impedance of the right audio load $R_R$). By measuring the return current in the first and second signal paths, the impedance of those signal paths can be determined by the monitoring unit 170 or a downstream processor.

When the plug 260 moves to the second removal state illustrated in FIG. 2b the socket tip contact 152 is no longer connected to anything so no current flows in the first signal path. Thus, no ground return current is detected and so the monitoring unit 170 or downstream processor can determine that the impedance of the first signal path is high impedance.

In the second removal state, the second signal path includes the impedances of both the left audio load $R_L$ and the right audio load $R_R$. The return current in the second signal path will therefore be reduced, in comparison to the return current in the second signal path in the first removal state. By measuring the return current in the second signal path, the impedance of that signal path can be determined by the monitoring unit 170 or a downstream processor.

When the plug 260 moves to the third removal state illustrated in FIG. 2c neither the socket tip contact 152 nor the first socket ring contact 154 is connected to anything so no current flows in the first signal path or the second signal path. Thus, no ground return current is detected in the first signal path or the second signal path and so the monitoring unit 170 or downstream processor can determine that the impedance of both the first signal path and the second signal path are high impedance.

In an alternative approach, the monitoring unit 170 or circuitry 100 may include current mirror circuitry, to mirror a proportion of the current through the loads (e.g. speakers of an audio accessory device) through a known resistance. By measuring a parameter associated with the mirrored current (e.g. the current or an associated voltage), the impedance of a signal path between terminals of the monitoring unit, via the audio accessory, can be determined.

Figure 5A:
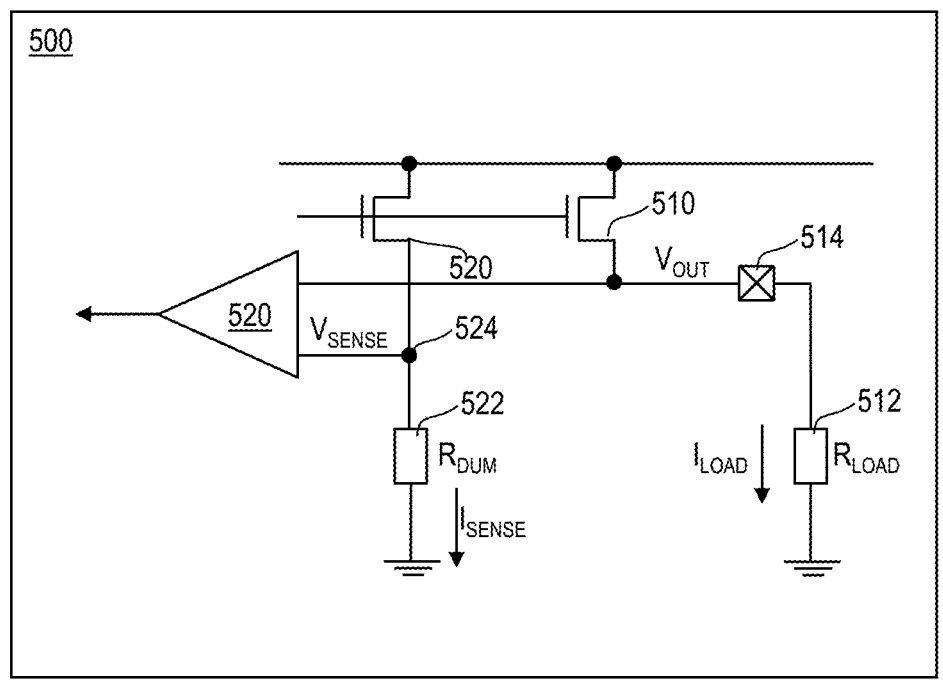
FIG. 5a illustrates an example of circuitry for estimating the impedance of a signal path.

FIG. 5a illustrates an example of circuitry 500 to mirror the load current $I_{LOAD}$ passing through an audio load coupled to a jack socket of a host device. An audio output driver transistor 510 (e.g. a MOSFET) receives at a control terminal (e.g. a gate terminal) thereof an audio signal from an audio sub-system of the host device, and outputs an output voltage $V_{OUT}$ to a circuit node 514, which may be, for example, a tip or ring contact of a jack socket of the host device in which a corresponding jack plug of an audio accessory device is received. The output voltage $V_{OUT}$ drives a load 512 such as a speaker of the audio accessory device, which has a nominal impedance $R_{LOAD}$.

The circuitry 500 also includes current mirror circuitry comprising a current mirror transistor 520 (e.g. a MOSFET) coupled to a dummy resistance 522 having an impedance $R_{DUM}$. A control terminal (e.g. a gate terminal) of the current mirror transistor 520 is coupled to the control terminal of the output driver transistor 510, and thus also receives the audio signal from the audio sub-system of the host device. By appropriate selection of the ratio of the size of the current mirror transistor 520 to that of the output driver transistor 510, or alternatively by appropriate selection of the ratio of the impedance $R_{DUM}$ of the dummy resistance 522 to the nominal impedance $R_{LOAD}$ of the audio load 512, a current $I_{SENSE}$ through the dummy resistance 522 can be set to be a suitable proportion of the load current $I_{LOAD}$ through the audio load 512. For example, if the nominal impedance $R_{LOAD}$ of the audio load is 32Ω, then by setting the impedance $R_{DUM}$ of the dummy resistance 522 to 3.2 kΩ and using a current mirror transistor 520 of the same size as the output driver transistor 510, the current $I_{SENSE}$ through the dummy resistance 522 can be set to be 1/100 of the load current $I_{LOAD}$ through the audio load 512.

The circuitry 520 also includes a comparator 520 having a first input that is coupled to the circuit node 514 and a second input that is coupled to a circuit node 524 between an output terminal of the current mirror transistor 520 and the dummy resistance 522. The first input of the comparator thus receives the output voltage $V_{OUT}$, and the second input of the comparator receives a voltage $V_{SENSE}$ that develops across the dummy resistance 522 as a result of the mirrored current $I_{SENSE}$.

The comparator 520 outputs a signal indicative of the difference between $V_{OUT}$ and $V_{SENSE}$. When the impedance $R_{LOAD}$ of the audio load 512 changes due to full or partial removal of the jack plug of the audio accessory from the socket of the host device as described above with reference to FIGS. 2-4, the current $I_{SENSE}$ will change, leading to a change in $V_{SENSE}$ and a consequential change in the level of the signal output by the comparator 520. This comparator output signal is thus indicative of the impedance $R_{LOAD}$ of the audio load, and can be used by downstream processing circuitry to detect the different impedance states that occur as the jack plug of the audio accessory is removed from the socket of the accessory device.

Figure 5B:
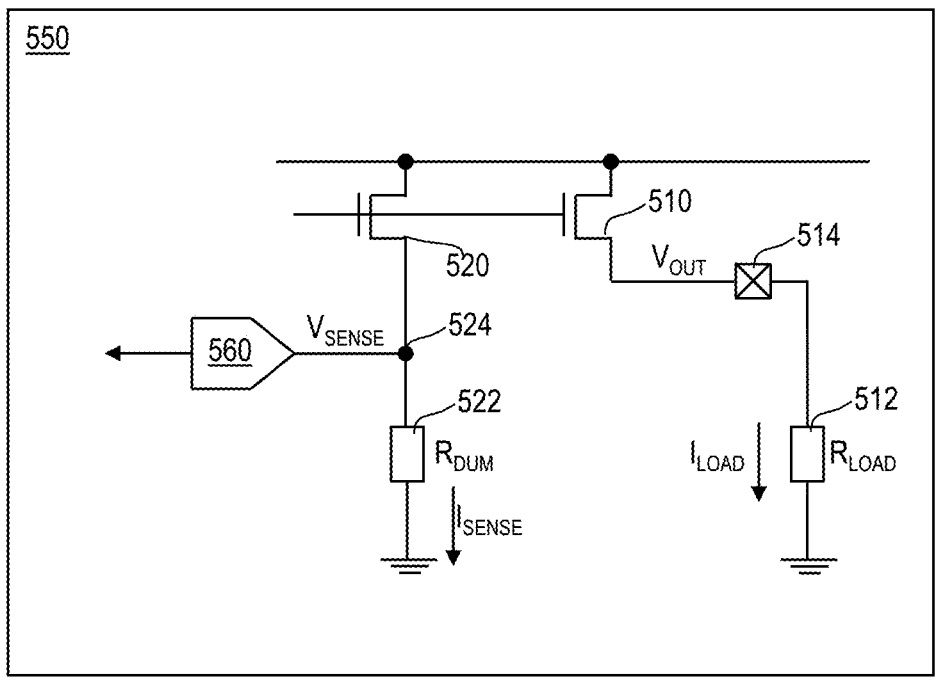
FIG. 5b illustrates another example of circuitry for estimating the impedance of a signal path.

FIG. 5b illustrates circuitry 550 implementing an alternative approach to detecting changes in the impedance states of signal paths between terminals of the monitoring unit 170, via an audio accessory device. The elements in common between FIGS. 5a and 5b are given corresponding reference numerals.

The circuitry 550 is similar to the circuitry 500 of FIG. 5a, with the exception that there is no comparator 520. Instead, the circuitry 550 includes an analog to digital converter (ADC) 560 having an input coupled to the circuit node 524, such that the ADC 560 receives the voltage $V_{SENSE}$ and outputs a digital signal representative of the voltage $V_{SENSE}$ to downstream processing circuitry. As in the circuitry of FIG. 5a, when the impedance $R_{LOAD}$ of the audio load 512 changes due to full of partial removal of the jack plug of the audio accessory from the socket of the host device as described above with reference to FIGS. 2-4, the current $I_{SENSE}$ will change, leading to a change in $V_{SENSE}$. The digital signal output by the ADC 560 is thus indicative of the impedance $R_{LOAD}$ of the audio load, and can be used by downstream processing circuitry to detect the different impedance states that occur as the jack plug of the audio accessory is removed from the socket of the accessory device.

The examples illustrated in FIGS. 1-4 show a 4-pole TRRS plug being removed from a complementary 4-pole TRRS socket. It will be appreciated, however, that the techniques described above in relation to the examples illustrated in FIGS. 1-4 are equally applicable to detecting the presence of a 3-pole TRS plug in a corresponding 3-pole TRS socket, and the removal of such a plug from such a socket.

Figure 6A:
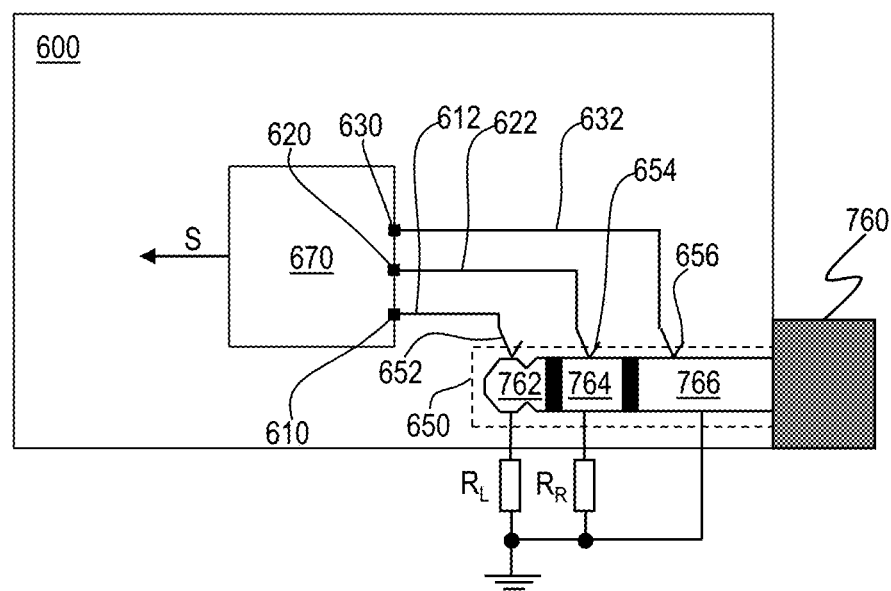
FIGS. 6a-6c illustrate an example of the removal of a three-pole jack plug from a corresponding socket over a sequence of different removal states.
Figure 6B:
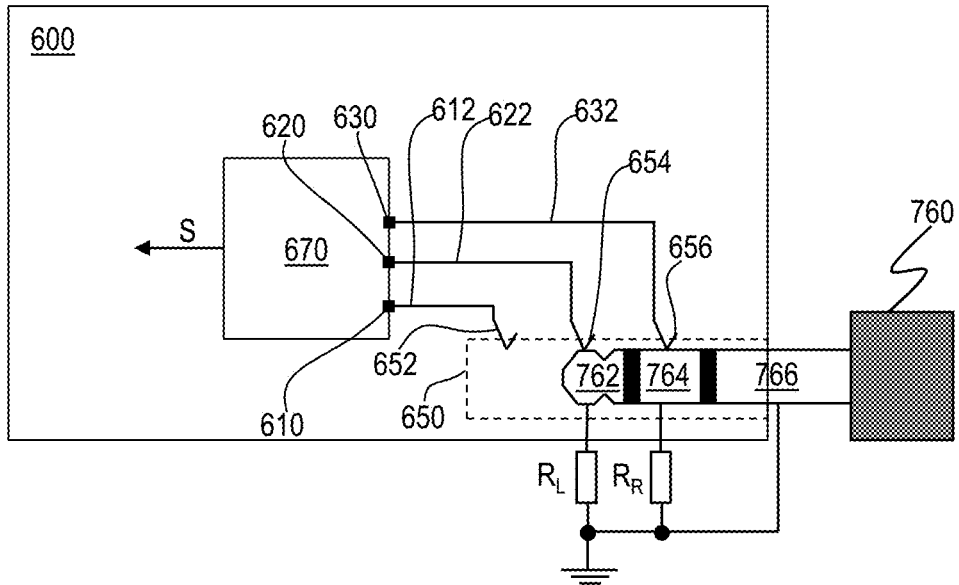
Figure 6C:
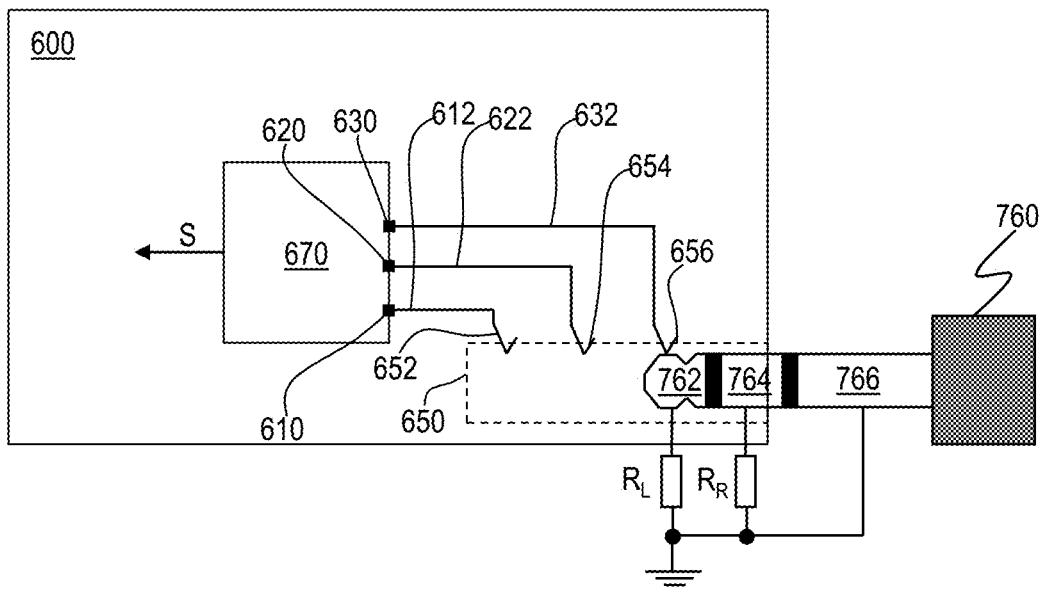

FIGS. 6a-c illustrate an example of a three-pole jack plug 760 being removed from a corresponding socket 650 of a host device over a sequence of different removal states.

The host device includes circuitry 600 for detecting the present of a jack plug 760 in the socket. The circuitry 600 includes a monitoring unit having first, second and third terminals 610, 620, 630 which are connected, respectively, to tip, ring and sleeve contacts 652, 654, 656 of the socket 650 by respective conductors 612, 622, 632 such as printed circuit board (PCB) tracks, wires or the like.

In the illustrated example of FIG. 6, a plug 760 comprises a TRS (tip, ring, sleeve) jack plug to provide a connection to an audio accessory device such as a set of stereo headphones that does not include a microphone. A common configuration for the jack plug for such an accessory device is that the tip and ring contacts 762, 764 provide connections for the left audio and right audio loads (e.g. left and right speakers), respectively, with the sleeve contact 766 providing a ground connection for the accessory device. Thus, as illustrated in FIG. 6a, the plug tip (T) contact 762 provides a connection to the left audio load $R_L$. Similarly, the plug ring (R) contact 764 provides a connection to the right audio load $R_R$. It will be appreciated that both the left audio load $R_L$ and the right audio load $R_R$ will be substantially the same and therefore the impedance of either load may be expressed as $R_{LOAD}$.

Therefore, as illustrated in FIG. 6a, when the plug 760 is fully received in the socket 650 of the host device, the first terminal 610 of the monitoring unit 670 is electrically connected to the left load $R_L$ at the plug tip contact 762 via the socket tip contact 652, while the second terminal 620 of the monitoring unit 670 is electrically connected to the right load $R_R$ at the plug ring contact 764 via the socket ring contact 654.

As illustrated in FIG. 6a, when the plug 760 is fully received in the socket 650, the socket sleeve contact 656 is electrically connected to the plug sleeve contact 766. As described above, the plug sleeve contact 766 provides a contact for connection to ground. Therefore, the third terminal 630 connects the plug sleeve contact 266 to ground G, when the plug 760 is fully received in the socket 750.

The third terminal 630 provides a suitable reference from which impedance measurements may be taken. Therefore, impedance measurements may be taken for a first signal path from the first terminal 610 to the third terminal 630, via the audio accessory, and for a second signal path from the second terminal 620 to the third terminal 630, via the audio accessory. In other words, a first impedance state may be detected at the first terminal 610 for a first signal path between the first terminal 610 and the third terminal 630, and a second impedance state may be detected at the second terminal 620, for a second signal path between the second terminal 620 and the third terminal 630.

FIG. 6a illustrates the plug 760 and the socket 650 in an initial (or first) removal state, in which the plug 760 is fully inserted in the socket 650. In this initial removal state, the impedance state at both the first terminal 610 and the second terminal 620 will be low, as the first and second terminals 610,620 are in electrical contact with the plug tip and ring contacts 762, 764 via socket contacts 652,654, respectively. The first signal path from the first terminal 610 to the third terminal 630, via the audio accessory, includes the left load $R_L$, and therefore the impedance of the first signal path will be measured as $R_{LOAD}$. Accordingly, the first impedance state, detected at the first terminal 610, is low impedance. Similarly, the second signal path from the second terminal 620 the third terminal 630, via the audio accessory, includes the right audio load $R_R$. Therefore, the impedance of the second signal path will also be measured as $R_{LOAD}$ by the monitoring unit 670. Thus the second impedance state, detected at the second terminal 620, is also low impedance.

FIG. 6b illustrates a second removal state of the plug 760 and the socket 650, in which the plug 760 is partially removed from the socket 650. In the second removal state, the plug 760 has been partially extracted from the socket 650, such that the plug sleeve contact 766 is no longer fully received in the socket 650. In the second removal state, the socket tip contact 652 is not in electrical contact with any of the plug contacts 762-766. The signal path from the first terminal 610 is therefore open circuit. As such, the first impedance state, detected at the first terminal 610, will be high impedance.

In the second removal state, the second terminal 620 is electrically connected to the plug tip contact 762 via the socket ring contact 654. The signal path between the second terminal 620 and the third terminal 630, via the audio accessory, therefore includes the left audio load $R_L$ and the right audio load $R_R$. As the impedances of the left audio load $R_L$ and the right audio load $R_R$ are substantially the same, the impedance of this signal path will therefore again be measured as approximately $2R_{LOAD}$ in the second removal state, and thus the impedance state, detected at the second terminal 620, when the plug 760 and the socket 650 are in the second removal state will be approximately $2R_{LOAD}$.

FIG. 6c illustrates the plug 760 and the socket 650 in a third removal state, which for the purposes of the present disclosure is equivalent to the full removal of the plug 760 from the socket 650. In the third removal state, the plug tip contact 762 is received in the socket 650, in contact with the socket sleeve contact 656. However, neither of the socket ring contact 764 and the socket sleeve contact 766 are connected to any plug contact. The left and right audio contacts of the plug 760 (i.e. the socket tip contact 762 and the socket ring contact 764) are therefore no longer in contact with the socket contacts of the socket 650 through which audio signals can be supplied to the left and/or right plug contacts (i.e. the socket tip contact 652 and the socket ring contact 654). Therefore, neither of left audio load $R_L$ and right audio load $R_R$ can be driven in the third removal state. Accordingly, when the plug 760 and the socket 650 adopt the third removal state, the plug 760 will be considered to be removed from the socket 650 for the purposes of the present disclosure.

In the third removal state, the first terminal 610 is again not connected to any of the plug contacts 762-766. Therefore the first impedance state, detected at the first terminal 610, will again be high impedance. The socket ring contact 754 is no longer in electrical contact with any of the plug contacts 762-266 in the third removal state. Therefore, the second impedance state, detected at the second terminal 620, will also be high impedance.

The sequence of values of the first and second impedance states as the plug 760 is removed from the socket 650 over the first to third removal states illustrated in FIGS. 6a-c may therefore be expressed according to Table 6:

TABLE 6

| Removal State | First Impedance State | Second Impedance State |
|---|---|---|
| First | Low-Z ($R_{LOAD}$) | Low-Z ($R_{LOAD}$) |
| Second | High-Z | $2R_{LOAD}$ |
| Third | High-Z | High-Z |

The changing sequence of the first and/or second impedance states detected at the first and/or second terminals 610, 620 respectively may therefore be indicative of the removal of the plug 760 from the socket 650. As the plug 760 is removed from the socket 650, the plug 760 and socket 650 will sequentially adopt the first, second and third removal states illustrated in FIGS. 6a-c. The monitoring unit 670 is therefore configured to detect a sequence of first and/or second impedance states, and when the detected sequence of first and/or second impedance states corresponds to the relevant sequence(s) in Table 6, the monitoring unit 670 will detect that the plug 760 has been removed from socket 650.

The circuitry 600 is configured to output a signal S indicative of detection of at least partial removal of the plug 760 from the socket 650 when the monitoring unit 670 detects this predetermined sequence. The signal S may be sent to a controller (not illustrated) of the host device, which may, in response to the signal S, suspend the supply of audio signals to the socket 650, thereby reducing power consumption of the host device, since audio signals are not unnecessarily generated and output.

The monitoring unit 670 may comprise a processor and/or circuitry configured to detect the predetermined sequence denoted in Table 6, indicative of removal of the plug 760 from the socket 650. In another example the monitoring unit 670 may detect the first and second impedance states (e.g. by measuring the impedances of signal paths from the first and second terminals 610, 620, as described above) and transmit the detected impedance states to a downstream processor. The downstream processor may log the detected sequence of the first and second impedance states and, when the logged sequence of impedance states corresponds to the predetermined sequence, may output the signal S to a controller to suspend audio output by the host device.

As will be appreciated by those skilled in the art, the circuitry described herein with reference to FIGS. 1-6 can be used to detect removal of jack plugs from sockets in a number of different scenarios, as illustrated in FIGS. 7a-7f.

Figure 7A:
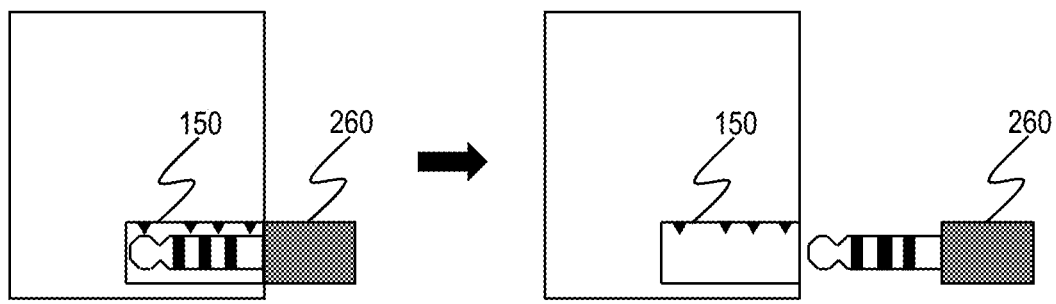
FIG. 7a-7f illustrate examples of different scenarios in which the removal of a jack plug from a corresponding socket can be detected.

FIG. 7a illustrates the removal of a 4-pole TRRS jack plug 260 of an audio accessory device from a corresponding 4-pole TRRS socket 150 of a host device.

Figure 7B:
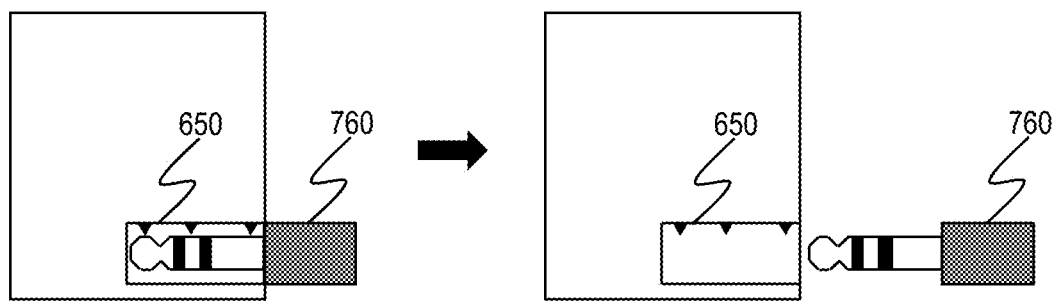

FIG. 7b illustrates the removal of a 3-pole TRS jack plug 760 of an audio accessory device from a corresponding 3-pole TRS socket 650 of a host device.

Figure 7C:
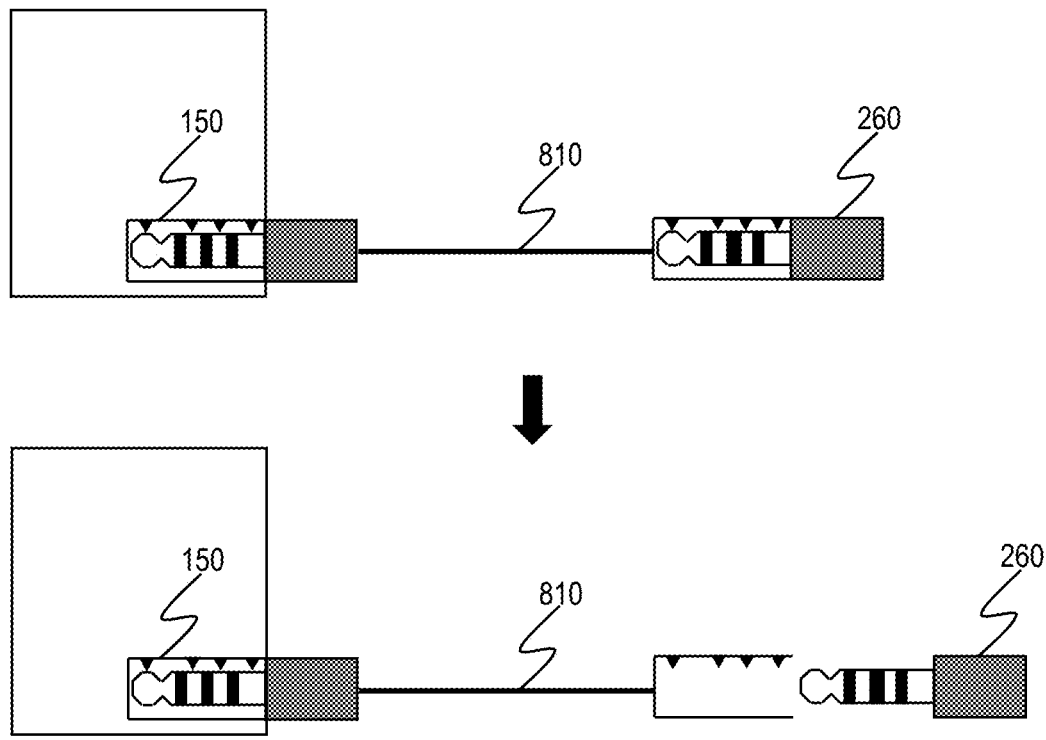

FIG. 7c illustrates the removal of a 4-pole TRRS jack plug 260 of an audio accessory device from a corresponding 4-pole TRRS socket of an extension cable 810 having a 4-pole TRRS jack plug that is received in a 4-pole TRRS socket 150 of a host device.

Figure 7D:
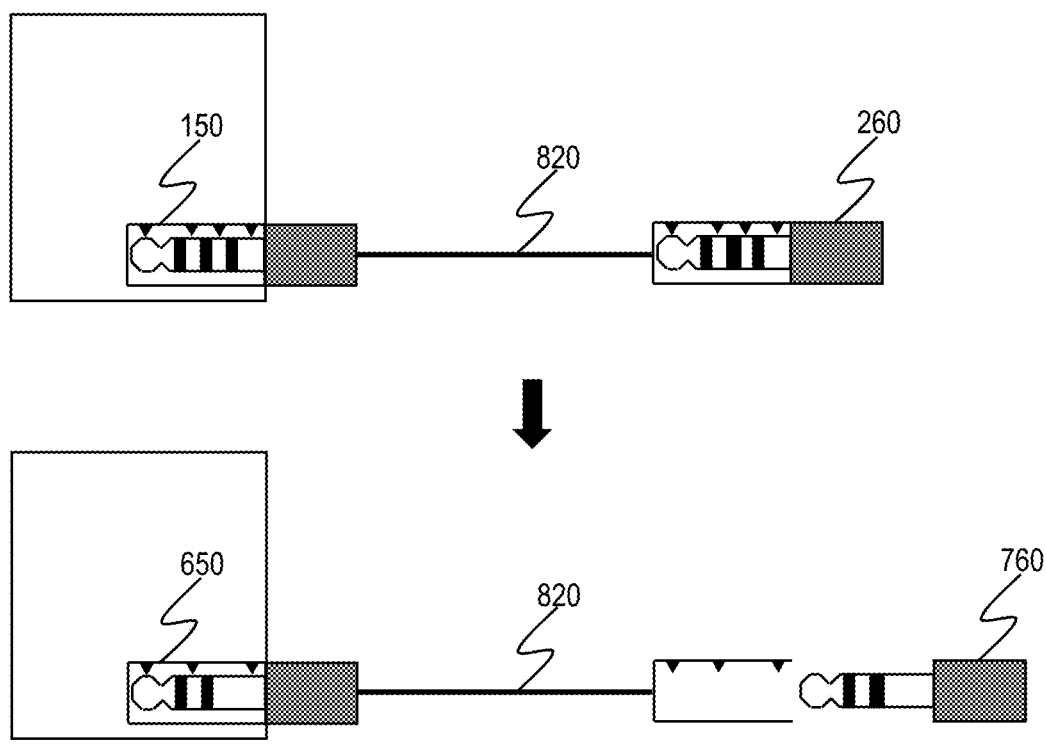

FIG. 7d illustrates the removal of a 3-pole TRS jack plug 760 of an audio accessory device from a corresponding 3-pole TRS socket of an extension cable having a 3-pole TRS jack plug that is received in a 3-pole TRS socket 650 of a host device.

Figure 7E:
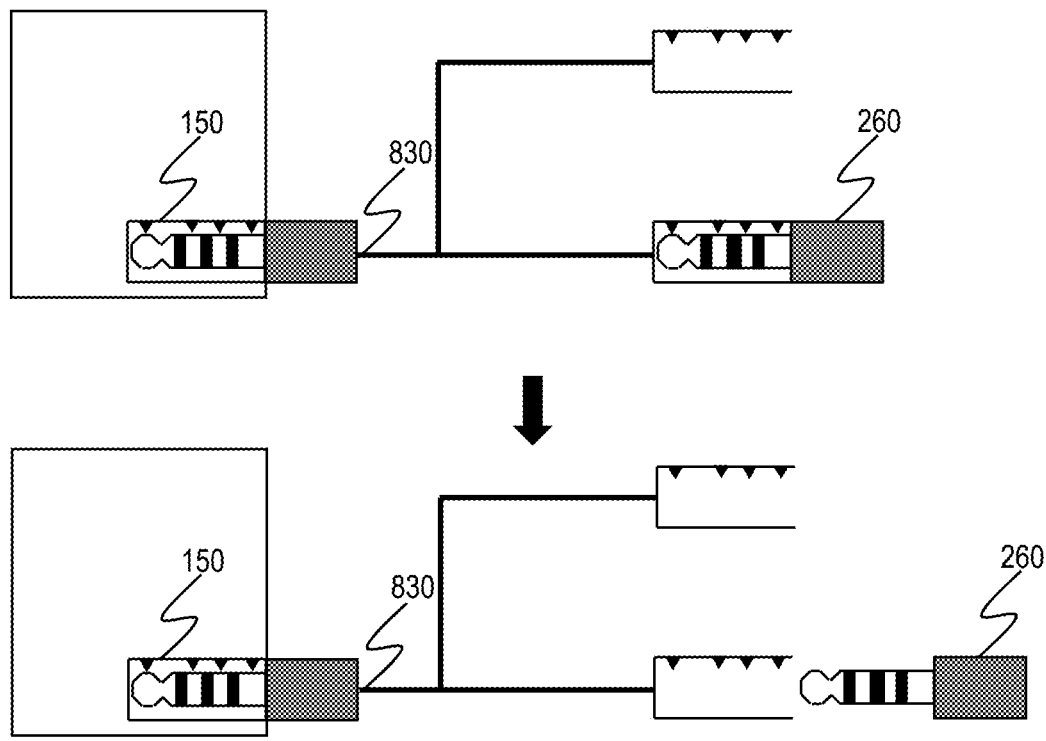

FIG. 7e illustrates the removal of a 4-pole TRRS jack plug 260 of an audio accessory device from a corresponding 4-pole TRRS socket of a splitter cable 830 having a 4-pole TRRS jack plug that is received in a 4-pole TRRS socket 150 of a host device.

Figure 7F:
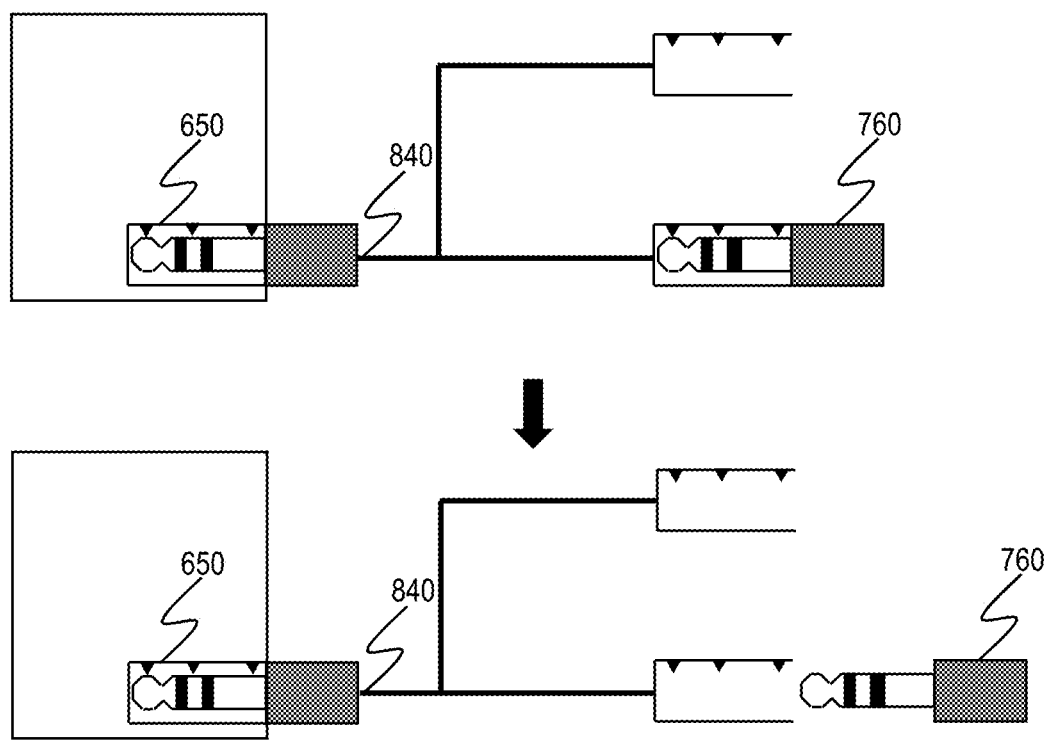

FIG. 7f illustrates the removal of a 3-pole TRS jack plug 760 of an audio accessory device from a corresponding 3-pole TRS socket of a splitter cable 840 having a 3-pole TRS jack plug that is received in a 3-pole TRS socket 650 of a host device.

The description above relates to detecting removal of a jack plug from a complementary socket of the same type (e.g. removal of a four-pole TRRS plug from a complementary 4-pole TRRS socket, or removal of a 3-pole TRS plug from a complementary 3-pole TRS socket). The disclosed systems and techniques can detect removal of a plug from a socket of a host device or from a socket of an intermediate cable such as an extension cable, splitter cable or the like.

However, in some circumstances the plug of an intermediate cable such as an extension cable, splitter cable or the like may be mismatched with the socket of the host device, and/or the plug of an accessory device may be mismatched with the socket of the intermediate cable, i.e. the intermediate cable may have a plug of a different type than the socket of the host device to which it is connected, and/or may have a socket of a different type than the plug of the accessory device that is connected to the intermediate cable. For example, an extension cable or splitter cable may have a three-pole TRS jack plug at a first end, connected to one or more three-pole TRS jack sockets at a second end, whereas a host device may have a four-pole TRRS socket and an accessory device may have a four-pole TRRS plug.

Typically host devices such as mobile phones, tablet and laptop computers and the like include circuitry to detect a mismatch between the jack plug of an audio accessory device and the audio accessory socket of the host device when the jack plug is received in the socket and to configure or reconfigure internal connections to the socket to ensure compatibility between the host device and the accessory device.

Figure 8:
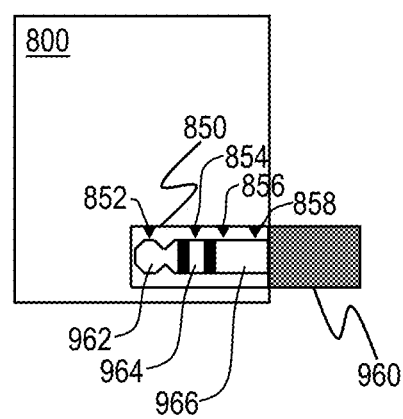
FIG. 8 illustrates a situation in which a three-pole TRS jack plug (e.g. of an accessory device or an intermediate cable) is received in a four-pole TRRS socket of a host device.

For example, FIG. 8 shows a situation in which a three-pole TRS jack plug (e.g. of an accessory device or an intermediate cable) is received in a four-pole TRRS socket 850 of a host device 800. In this example both the second ring contact 856 and the sleeve contact 858 of the socket 850 are capable of providing either a microphone or a ground connection for an audio accessory device. When the plug 960 is received in the socket 850, circuitry of the host device 850 detects that the second ring and sleeve contacts of the socket 850 are connected together (i.e. short-circuited) by the sleeve contact 966 of the plug 960, and the host device 800 will thus configure itself so as to be suitable for use with an accessory device that uses a three-pole TRS plug, e.g. by configuring internal connections of circuitry of the host device to couple the second ring and sleeve contacts 856, 858 of the socket 850 to ground so as to provide a ground path for audio signals.

This configuration or reconfiguration of the internal connections of the host device 800 ensures that the host device 800 is able to output audio signals to an accessory device that uses a three-pole TRS jack plug correctly. However, if the jack plug 960 that is received in the socket 850 is not for an audio accessory device but is instead for an intermediate cable such as an extension cable or a splitter cable, the host device has no way to determine the type of device that is connected to connected at the second end of the intermediate cable (or even if any device at all is connected to the intermediate cable), and thus it is possible that the configuration or reconfiguration of the internal connections of the host device 800 will not provide the required connections for the accessory device that is connected to the intermediate cable, such that correct audio output to the audio accessory device is not possible. This can lead to a poor user experience, as audio output by the accessory device may be distorted or attenuated, or alternatively no audio may be output by the audio accessory at all.

Figure 9A:
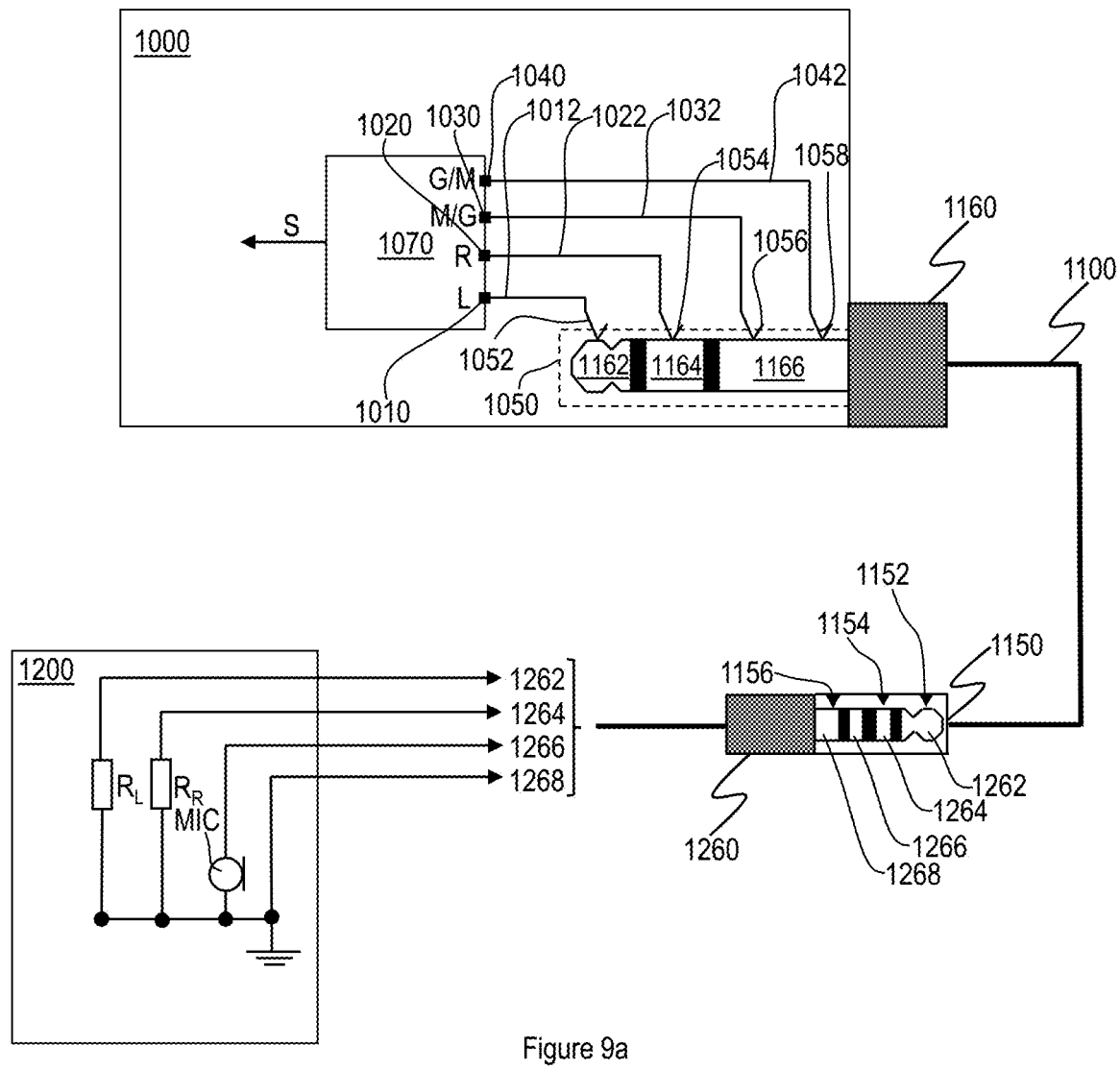
FIGS. 9a-9f illustrate circuitry for detecting the presence of a four-pole jack plug of an audio accessory device in three-pole sockets of different configurations of an intermediate cable.

FIG. 9a illustrates an example of a situation in which a plug 1160 of an intermediate cable (in this case an extension cable 1100) is received in a socket 1050 of a host device, and a plug of an accessory device 1200 is received in a socket 1150 of the extension cable 1100.

In the example illustrated in FIG. 9a the plug 1160 of the extension cable 1100 is a three-pole TRS plug and the socket 1150 of the extension cable 1100 is a three-pole TRS socket. Tip, ring and sleeve contacts 1162, 1164, 1166 of the plug 1160 are electrically connected to respective tip, ring and sleeve contacts 1152, 1154, 1156 of the socket 1150 by suitable conductors within the cable 1100.

The plug 1260 of the accessory device 1200, however, is a four-pole plug, having a tip contact 1262, first and second ring contacts 1264, 1266 and a sleeve contact 1268. Thus there is a mismatch between a plug type of the plug 1260 and a socket type of the socket 1150.

In the example illustrated in FIG. 9a the socket 1150 is configured such that when the plug 1260 is fully received in the socket 1150 the socket tip contact 1152 is in contact with the plug tip contact 1262, the socket ring contact 1154 is in contact with the first plug ring contact 1264 and the socket sleeve contact 1156 is in contact with the plug sleeve contact 1568. However, the position of the socket sleeve contact 1156 can vary according to different configurations of the socket 1150, as discussed below with reference to FIGS. 9b-9f, and this can have an effect on which (if any) of the plug contacts is in contact with the socket sleeve contact 1156 when the plug 1260 is fully received in the socket 1150.

In the example illustrated in FIG. 9*a* the accessory device 1200 is configured such that a left audio load $R_L$ (e.g. a left speaker of a set of headphones) is electrically connected to the plug tip contact 1262, a right audio load $R_R$ (e.g. a right speaker of a set of headphones) is electrically connected to the first plug ring contact 1264, a microphone MIC is electrically connected to the second plug ring contact 1266 and a ground connection of the accessory device 1200 is electrically connected to the plug sleeve contact 1268.

Thus, when the plug 1260 of the audio accessory device 1200 is fully received in the socket 1150 of the extension cable 1100, the left audio load $R_L$ is electrically coupled to the socket tip contact 1152 via the plug tip contact 1262, the right audio load $R_R$ is electrically coupled to the socket ring contact 1154 via the plug ring contact 1264, and the ground connection of the accessory device 1200 is electrically coupled to the socket sleeve contact 1268. As shown in FIG. 9*a*, as a result of the mismatch between the plug type of the plug 1260 and the socket type of the socket 1150, the microphone MIC of the accessory device 1200 is not coupled to any socket contact of the socket 1150.

In this arrangement the socket tip contact 1052 and first socket ring contact 1054 of the socket 1050 of the host device are electrically connected to the left and right audio loads, respectively, of the audio accessory device 1200, whilst the second socket ring contact 1056 and the socket sleeve contact 1058 of the socket 1050 of the host device are electrically connected to the ground connection of the audio accessory device 1200. Thus in the arrangement illustrated in FIG. 9*a* audio signals output by the host device via the socket 1050 can be correctly output by the audio accessory device 1200.

Figure 9B:
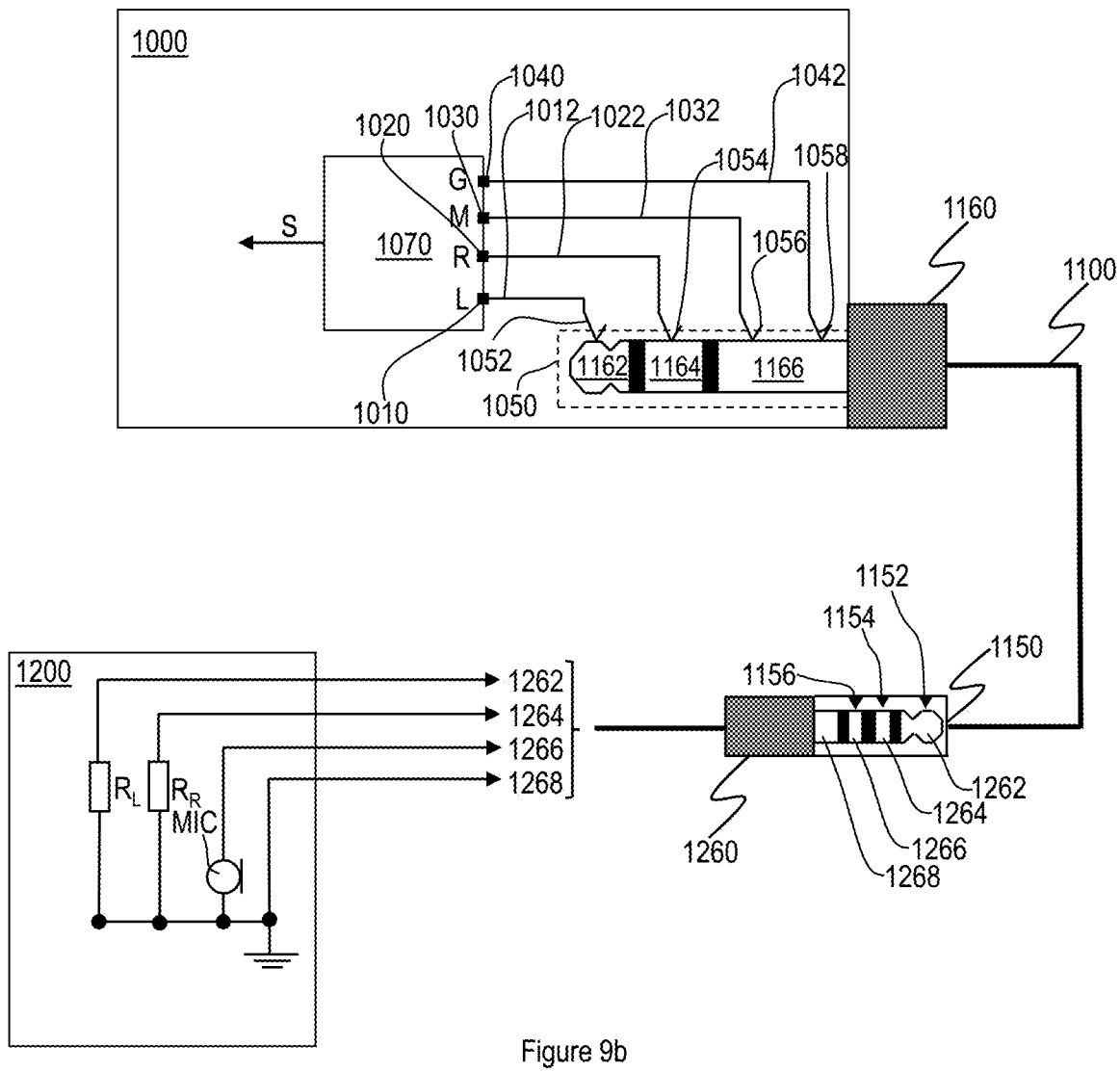

FIG. 9*b* illustrates another example of a situation in which a plug 1160 of an intermediate cable (in this case an extension cable 1100) is received in a socket 1050 of a host device, and a plug of an accessory device 1200 is received in a socket 1150 of the extension cable 1100. The elements in common between FIGS. 9*a* and 9*b* are given corresponding reference numerals.

The host device and audio accessory device 1200 of the example illustrated in FIG. 9*b* are similar to the corresponding devices of FIG. 9*a*. However, the extension cable 1100 of FIG. 9*b* differs from that of FIG. 9*a* in that the socket sleeve contact 1156 is positioned such that, when the plug 1260 is fully received in the socket 1150, the socket sleeve contact 1156 is in contact with the second plug ring contact 1266, thus electrically coupling the socket sleeve contact 1156 to the microphone (MIC) of the audio accessory device 1200.

Thus, as shown in FIG. 9*b*, as a result of the mismatch between the plug type of the plug 1260 and the socket type of the socket 1150, the microphone MIC of the accessory device 1200 is coupled to the socket sleeve contact 1156 of the socket 1150.

In this arrangement the socket tip contact 1052 and first socket ring contact 1054 of the socket 1050 of the host device are again electrically connected to the left and right audio loads, respectively, of the audio accessory device 1200, whilst the second socket ring contact 1056 and the socket sleeve contact 1058 of the socket 1050 of the host device are electrically connected to the microphone of the audio accessory device 1200. Thus in the arrangement illustrated in FIG. 9*b* audio signals output by the host device via the socket 1050 cannot be correctly output by the audio accessory device 1200, since the audio signal paths that include the left and right audio loads also include the microphone MIC, such that any audio signal transmitted via these signal paths will be at best attenuated, or worse, distorted by the additional impedance of the microphone, and the system may choose to respond appropriately.

Figure 9C:
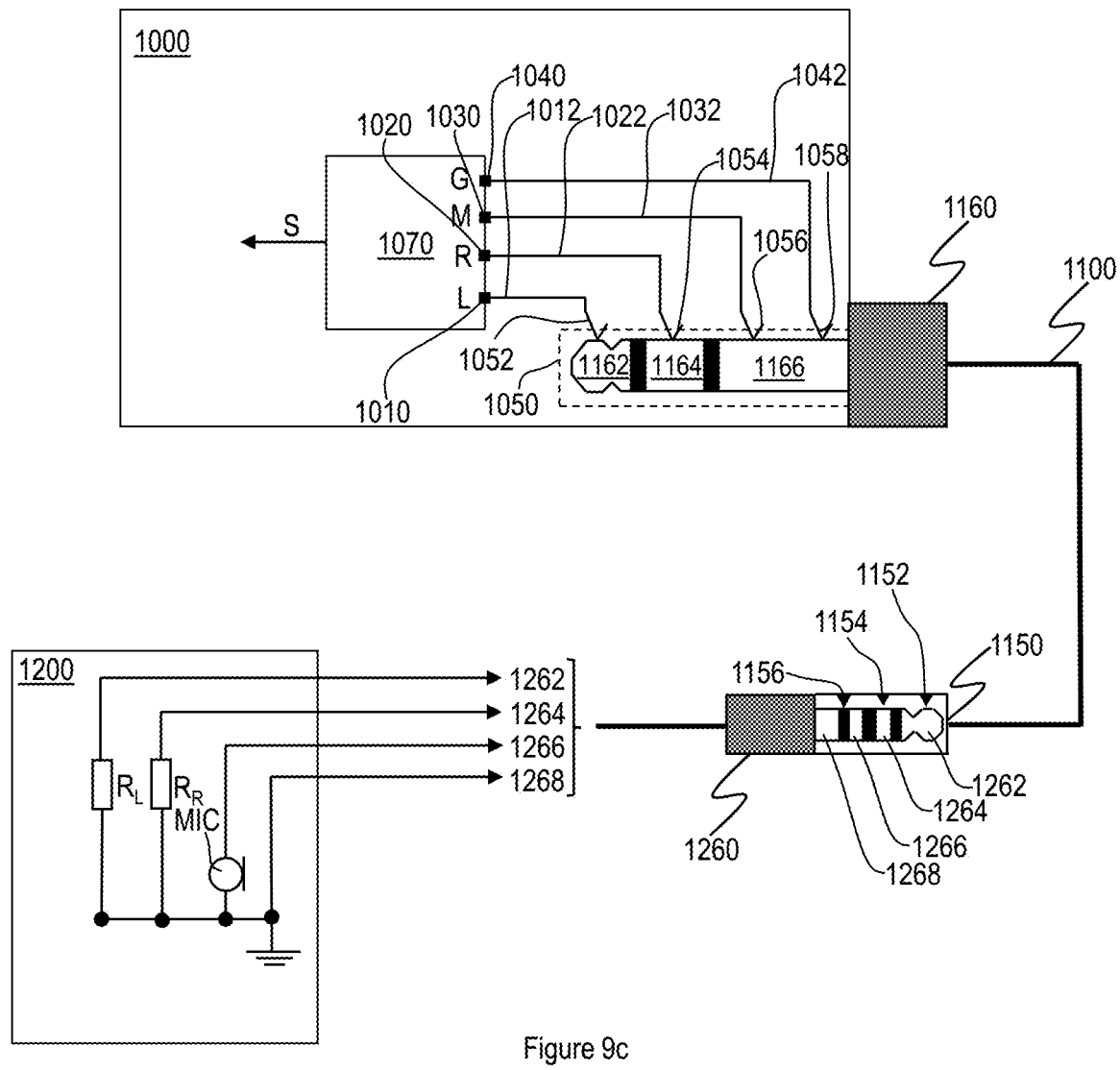

FIG. 9*c* illustrates another example of a situation in which a plug 1160 of an intermediate cable (in this case an extension cable 1100) is received in a socket 1050 of a host device, and a plug of an accessory device 1200 is received in a socket 1150 of the extension cable 1100. The elements in common between FIGS. 9*a*, 9*b* and 9*c* are given corresponding reference numerals.

The host device and audio accessory device 1200 of the example illustrated in FIG. 9*c* are similar to the corresponding devices of FIG. 9*a*. However, the extension cable 1100 of FIG. 9*c* differs from that of FIG. 9*a* in that the socket sleeve contact 1156 is positioned such that, when the plug 1260 is fully received in the socket 1150, the socket sleeve contact 1156 is in contact with an insulator that is provided between the second plug ring contact 1266 and the plug sleeve contact 1268.

Thus, as shown in FIG. 9*c*, as a result of the mismatch between the plug type of the plug 1260 and the socket type of the socket 1150, neither the microphone MIC nor the ground connection of the accessory device 1200 is coupled to any socket contact of the socket 1150.

In this arrangement the socket tip contact 1052 and first socket ring contact 1054 of the socket 1050 of the host device are again electrically connected to the left and right audio loads respectively. However, the second socket ring contact 1056 and the socket sleeve contact 1058 of the socket 1050 of the host device are not electrically connected to anything, due to the position of the socket sleeve contact 1156 of the socket 1150 in contact with the insulator between the second plug ring contact 1266 and the plug sleeve contact 1268. Thus in the arrangement illustrated in FIG. 9*c* audio signals output by the host device via the socket 1050 cannot be correctly output by the audio accessory device 1200 and the system may choose to respond appropriately.

Figure 9D:
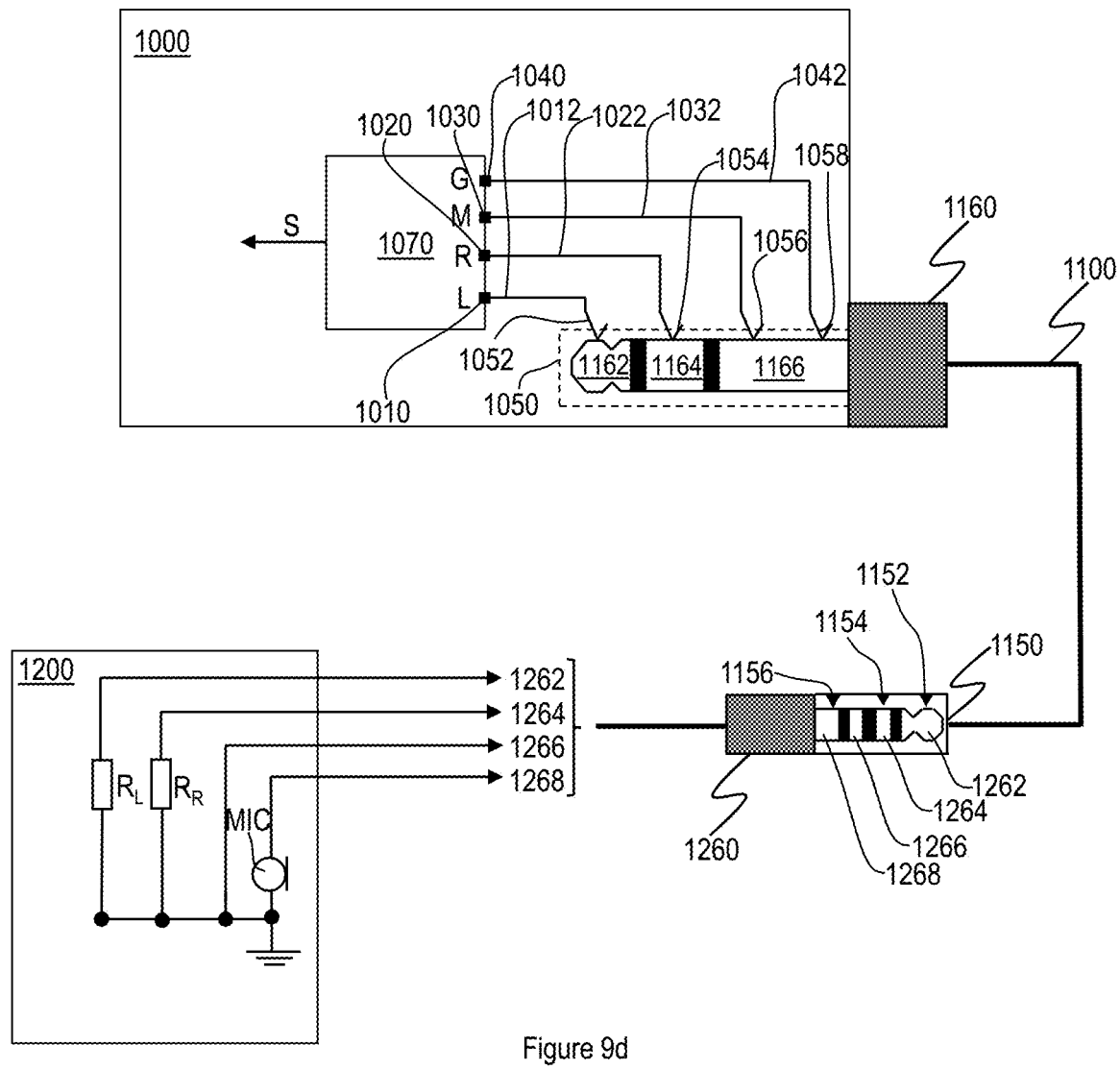

FIG. 9*d* illustrates another example of a situation in which a plug 1160 of an intermediate cable (in this case an extension cable 1100) is received in a socket 1050 of a host device, and a plug of an accessory device 1200 is received in a socket 1150 of the extension cable 1100. The elements in common between FIGS. 9*a*-9*d* are given corresponding reference numerals.

The host device and the extension cable 1100 of the example illustrated in FIG. 9*d* are similar to the corresponding elements of FIG. 9*a*. However, the audio accessory device 1200 differs from the audio accessory device 1200 of FIG. 9*a* in that in the arrangement illustrated in FIG. 9*d*, the microphone MIC of the audio accessory device 1200 is electrically connected to the plug sleeve contact 1268. Thus, when the plug 1260 is fully received in the socket 1150, the microphone MIC is electrically connected to the socket sleeve contact 1156 via the plug sleeve contact 1268. As shown in FIG. 9*d*, as a result of the mismatch between the plug type of the plug 1260 and the socket type of the socket 1150, the ground connection of the accessory device 1200 is not coupled to any socket contact of the socket 1150.

In this arrangement the socket tip contact 1052 and first socket ring contact 1054 of the socket 1050 of the host device are electrically connected to the left and right audio loads respectively, whilst the second socket ring contact 1056 and the socket sleeve contact 1058 of the socket 1050 of the host device are electrically connected to the microphone MIC of the audio accessory device 1200. Thus in the arrangement illustrated in FIG. 9a audio signals output by the host device via the socket 1050 cannot be correctly output by the audio accessory device 1200, since the audio signal paths that include the left and right audio loads also include the microphone MIC, such that any audio signal transmitted via these signal paths will be at best attenuated, or worse, distorted by the additional impedance of the microphone, and the system may choose to respond appropriately.

Figure 9E:
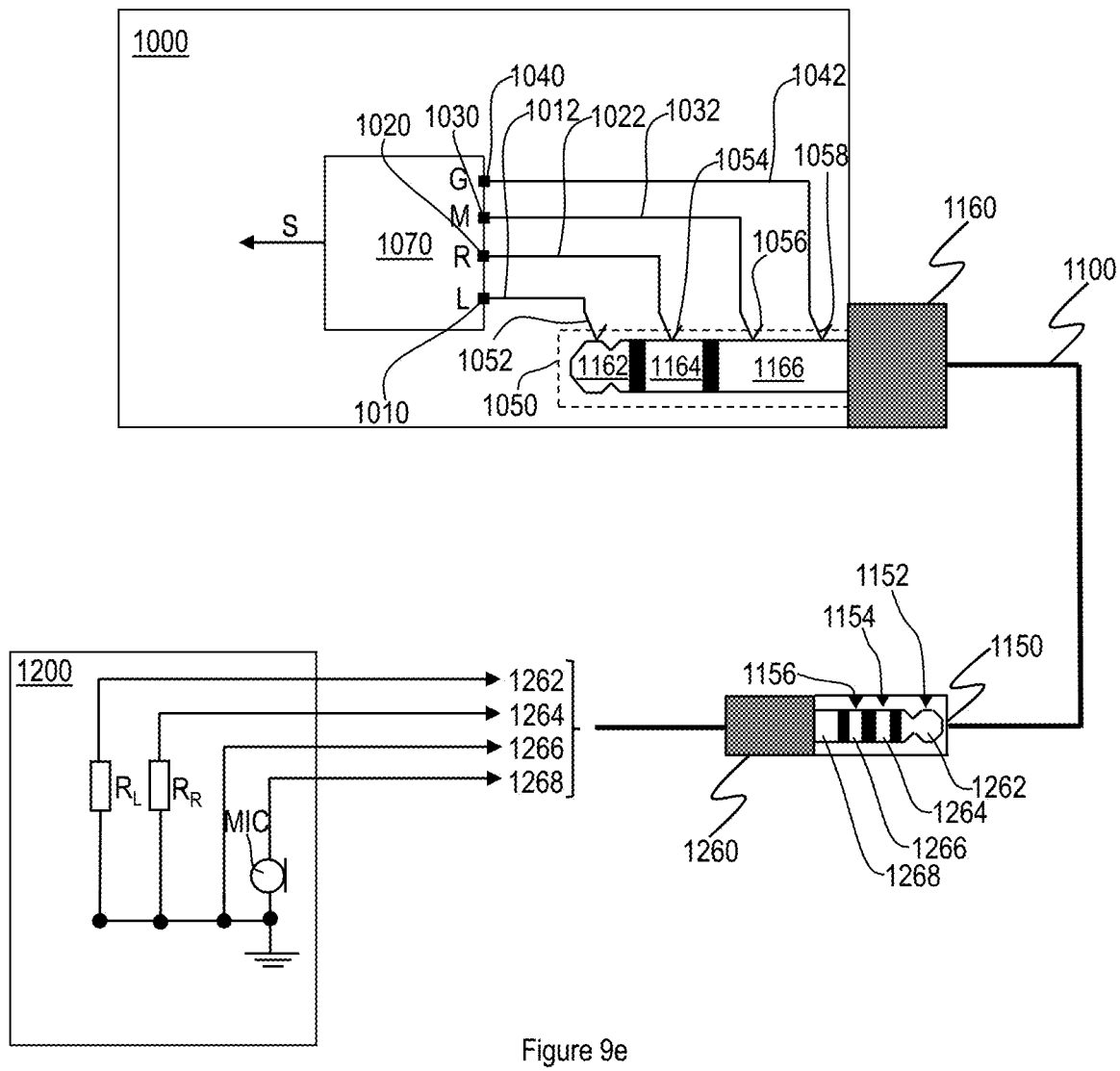

FIG. 9e illustrates another example of a situation in which a plug 1160 of an intermediate cable (in this case an extension cable 1100) is received in a socket 1050 of a host device, and a plug of an accessory device 1200 is received in a socket 1150 of the extension cable 1100. The elements in common between FIGS. 9a-9e are given corresponding reference numerals.

The host device and audio accessory device 1200 of the example illustrated in FIG. 9e are similar to the corresponding devices of FIG. 9d. However, the extension cable 1100 of FIG. 9e differs from that of FIG. 9d in that the socket sleeve contact 1156 is positioned such that, when the plug 1260 is fully received in the socket 1150, the socket sleeve contact 1156 is in contact with the second plug ring contact 1266, thus electrically coupling the socket sleeve contact 1156 to the ground connection of the audio accessory device 1200.

Thus, as shown in FIG. 9e, as a result of the mismatch between the plug type of the plug 1260 and the socket type of the socket 1150, the microphone of the accessory device 1200 is not coupled to any socket contact of the socket 1150.

In this arrangement the socket tip contact 1052 and first socket ring contact 1054 of the socket 1050 of the host device are electrically connected to the left and right audio loads respectively, whilst the second socket ring contact 1056 and the socket sleeve contact 1058 of the socket 1050 of the host device are again electrically connected to the ground connection of the audio accessory device 1200. Thus in the arrangement illustrated in FIG. 9e audio signals output by the host device via the socket 1050 can be correctly output by the audio accessory device 1200.

Figure 9F:
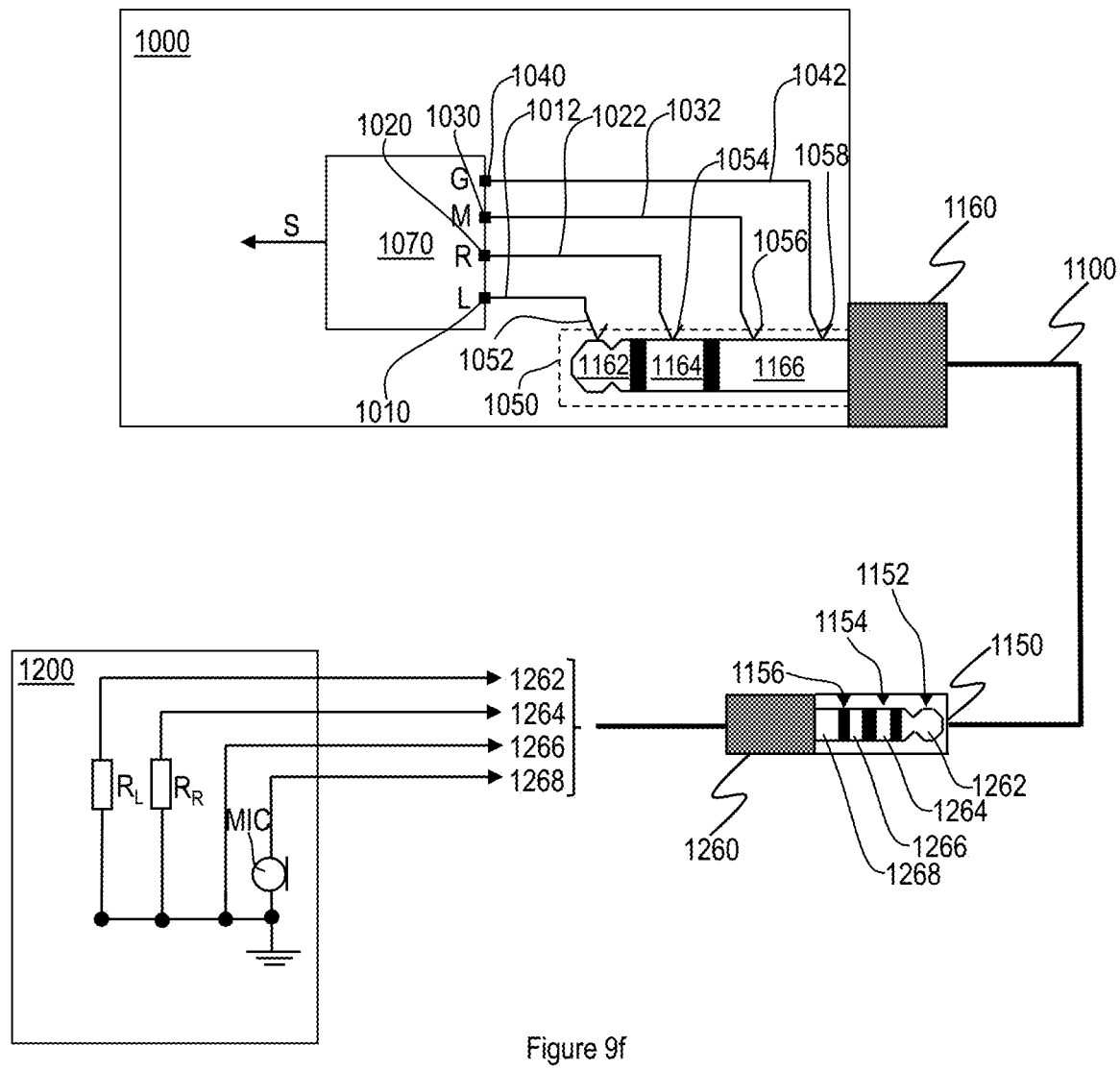

FIG. 9f illustrates another example of a situation in which a plug 1160 of an intermediate cable (in this case an extension cable 1100) is received in a socket 1050 of a host device, and a plug of an accessory device 1200 is received in a socket 1150 of the extension cable 1100. The elements in common between FIGS. 9a-9f are given corresponding reference numerals.

The host device and audio accessory device 1200 of the example illustrated in FIG. 9f are similar to the corresponding devices of FIG. 9d. However, the extension cable 1100 of FIG. 9f differs from that of FIG. 9d in that the socket sleeve contact 1156 is positioned such that, when the plug 1260 is fully received in the socket 1150, the socket sleeve contact 1156 is in contact with an insulator that is provided between the second plug ring contact 1266 and the plug sleeve contact 1268.

Thus, as shown in FIG. 9f, as a result of the mismatch between the plug type of the plug 1260 and the socket type of the socket 1150, neither the microphone MIC nor the ground connection of the accessory device 1200 is coupled to any socket contact of the socket 1150.

In this arrangement the socket tip contact 1052 and first socket ring contact 1054 of the socket 1050 of the host device are again electrically connected to the left and right audio loads respectively. However, the second socket ring contact 1056 and the socket sleeve contact 1058 of the socket 1050 of the host device are not electrically connected to anything, due to the position of the socket sleeve contact 1156 of the socket 1150 in contact with the insulator of the between the second plug ring contact 1266 and the plug sleeve contact 1268. Thus in the arrangement illustrated in FIG. 9f audio signals output by the host device via the socket 1050 cannot be correctly output by the audio accessory device 1200, and the system may choose to respond appropriately.

The host device includes circuitry 1000 configured to detect connection of a plug 1260 of an audio accessory device 1200 to a second 1150 of an intermediate cable 1100 that is connected to the socket 1050 of the host device, and to output a signal indicative of incompatibility between the accessory device 1200 and the intermediate cable 1100 or of a fault in the accessory device 1200 or intermediate cable.

The circuitry 1000 includes a monitoring unit 1070, which may comprise discrete circuitry, integrated circuitry, processor circuitry configured to execute suitable software instructions or any combination of discrete circuitry, integrated circuitry, processor circuitry and software.

The monitoring unit 1070 is configured to determine a first impedance of a first signal path associated with the socket tip contact 1052, a second impedance of a second signal path associated with the socket tip contact 1052 and a third impedance of a third signal path associated with the first socket ring contact 1054.

To this end the monitoring unit 1070 includes a first terminal 1010, a second terminal 1020, a third terminal 1030 and a fourth terminal 140. The first terminal 1010 is electrically coupled to the tip contact 1052 of the socket 1050 via a conductor (e.g. a PCB trace, wire or the like) 1012, the second terminal 1020 is electrically coupled to the first ring contact 1054 of the socket 1050 via a conductor 1022, the third terminal 1030 is electrically coupled to the second ring contact 1056 of the socket 1050 via a conductor 1032, and the fourth terminal 1040 is electrically coupled to the sleeve contact 1058 of the socket 1050 via a conductor 1042.

The monitoring unit 1070 is configured to determine, continuously, periodically, or in response to a particular event (e.g. when audio playback is requested by a user of the host device), the impedance of a first signal path between the first terminal 1010 and the second terminal 1020 via the audio accessory 1200, the impedance of a second signal path between the first terminal 1010 and the third terminal 1030 or the fourth terminal 1040 via the audio accessory, and the impedance of a third signal path between the second terminal 1020 and the third terminal 1030 or the fourth terminal 1040 via the audio accessory 1200.

As described above, when the plug 1260 of the audio accessory device 1200 is received in the socket 1150 of the extension cable 1100 in the arrangement illustrated in FIG. 9a, audio signals can be correctly output by the audio accessory device 1200. In this arrangement the impedance of the first signal path from the first terminal 1010 to the second terminal 1020 (via the extension cable 1100 and the accessory device 1200), as "seen" by the host device and determined by the monitoring unit 1070, includes the left and right audio loads of the accessory device 1200. Thus, in the arrangement illustrated in FIG. 9a the impedance of the first signal path (also referred to as the first impedance state), as determined by the monitoring unit 1070, is approximately equal to the combined impedance of the left and right audio loads of the accessory device, i.e. $R_{TOT}=R_L+R_R$, (where $R_L$ and $R_R$ are the impedances of the left and right audio loads respectively) plus some additional impedance in the extension cable 1160 and the plugs 1160, 1260 and sockets 1050, 1150.

In the arrangement illustrated in FIG. 9a, the second signal path from the first terminal 1010 to the third or fourth terminal 1030/1040 (via the extension cable 1100 and the accessory device 1200) includes only the left audio load. Thus, the impedance of the second signal path (also referred to as the second impedance state), as determined by the monitoring unit 1070, will be approximately equal to $R_L$, i.e. $R_{XL}=R_L$ plus some additional impedance in the extension cable 1160 and the plugs 1160, 1260 and sockets 1050, 1150. Similarly, the third signal path from the second terminal 1020 to the third or fourth terminal 1030/1040 (via the extension cable 1100 and the accessory device 1200) includes only the right audio load. Thus, the impedance of the third signal path (also referred to as the third impedance state), as determined by the monitoring unit 1070, will be approximately equal to $R_R$, i.e. $R_{XR}=R_R$ plus some additional impedance in the extension cable 1160 and the plugs 1160, 1260 and sockets 1050, 1150. Accordingly, in the arrangement illustrated in FIG. 9a the sum of the impedances $R_{XL}$ and $R_{XR}$ will be close to $R_{TOT}$, i.e. $R_{XL}+R_{XR}=R_{TO}T+R_{TOL}$, where $R_{TOL}$ is some tolerance value.

As described above, when the plug 1260 of the audio accessory device 1200 is received in the socket 1150 of the extension cable 1100 in the arrangement illustrated in FIG. 9b, audio signals cannot be correctly output by the audio accessory device 1200, since the second and third signal paths that include the left and right audio loads also include the microphone MIC. As in the arrangement of FIG. 9a, in the arrangement of FIG. 9b the impedance of the first signal path (i.e. the first impedance state), as determined by the monitoring unit 1070, is approximately equal to the combined impedance of the left and right audio loads of the accessory device, i.e. $R_{TOT}=R_L+R_R$, plus some additional impedance in the extension cable 1160 and the plugs 1160, 1260 and sockets 1050, 1150. However, in the arrangement illustrated in FIG. 9b, the second signal path from the first terminal 1010 to the third or fourth terminal 1030/1040 includes the left audio load and the microphone of the audio accessory device 1200, and thus the impedance $R_{XL}$ of the second signal path (i.e. the second impedance state) will be approximately $R_L+R_{MIC}$, where $R_{MIC}$ is the impedance of the microphone. Similarly, the third signal path from the second terminal 1020 to the third or fourth terminal 1030/1040 includes the right audio load and the microphone of the audio accessory device 1200, and thus the impedance $R_{XR}$ of the second signal path (i.e. the third impedance state) will be approximately $R_R+R_{MIC}$. Accordingly, in the arrangement illustrated in FIG. 9d the sum of the impedances $R_{XL}$ and $R_{XR}$ will be different than (e.g. greater than) $R_{TOT}$.

In the arrangement illustrated in FIG. 9c, audio signals output by the host device via the socket 1050 cannot be correctly output by the audio accessory device 1200, since the ground connection of the audio accessory device 1200 is open-circuit. In this arrangement the first signal path from the first terminal 1010 to the second terminal 1020 via the accessory device 1200 includes the left and right audio loads of the accessory device 1200, and thus the impedance of the first signal path (i.e. the first impedance state), as determined by the monitoring unit 1070, is approximately equal to the combined impedance of the left and right audio loads of the accessory device, i.e. $R_{TOT}=R_L+R_R$. However, as neither the microphone nor the ground connection of the accessory device is connected to any of the contacts of the extension cable socket 1150, there is no complete signal path from either the first or the second terminal 1010, 1020 to the third or fourth terminal 1030, 1040, and thus in the arrangement illustrated in FIG. 9c the monitoring unit 1070 will determine that both the second and third signal paths are high impedance (i.e. the second and third impedance states are both high impedance).

In the arrangement illustrated in FIG. 9d, audio signals output by the host device via the socket 1050 cannot be correctly output without attenuation and/or distortion by the audio accessory device 1200, since the audio signal paths that include the left and right audio loads also include the microphone MIC. In this arrangement the first signal path from the first terminal 1010 to the second terminal 1020 via the accessory device 1200 includes the left and right audio loads of the accessory device 1200, and thus the impedance of the first signal path (i.e. the first impedance state), as determined by the monitoring unit 1070, is approximately equal to the combined impedance of the left and right audio loads of the accessory device, i.e. $R_{TOT}=R_L+R_R$. The second signal path from the first terminal 1010 to the third or fourth terminal 1030/1040 includes the left audio load and the microphone of the audio accessory device 1200, and thus the impedance $R_{XL}$ of the second signal path (i.e. the second impedance state) will be approximately $R_L+R_{MIC}$, where $R_{MIC}$ is the impedance of the microphone. Similarly, the third signal path from the second terminal 1020 to the third or fourth terminal 1030/1040 includes the right audio load and the microphone of the audio accessory device 1200, and thus the impedance $R_{XR}$ of the second signal path (i.e. the third impedance state) will be approximately $R_R+R_{MIC}$. Accordingly, in the arrangement illustrated in FIG. 9d the sum of the impedances $R_{XL}$ and $R_{XR}$ will be different than (e.g. greater than) $R_{TOT}$.

In the arrangement illustrated in FIG. 9e, audio signals output by the host device via the socket 1050 can be correctly output by the audio accessory device 1200. In this arrangement the first signal path from the first terminal 1010 to the second terminal 1020 via the accessory device 1200 includes the left and right audio loads of the accessory device 1200, and thus the impedance of the first signal path (i.e. the first impedance state), as determined by the monitoring unit 1070, is approximately equal to the combined impedance of the left and right audio loads of the accessory device, i.e. $R_{TOT}=R_L+R_R$. The second signal path, from the first terminal 1010 to the third or further terminal 1030/1040, includes only the left audio load of the accessory device 1200. Thus, the impedance of the second signal path (also referred to as the second impedance state), as determined by the monitoring unit 1070, will be approximately equal to $R_L$, i.e. $R_{XL}=R_L$ plus some additional impedance in the extension cable 1160 and the plugs 1160, 1260 and sockets 1050, 1150. Similarly, the third signal path from the second terminal 1020 to the third or fourth terminal 1030/1040 (via the extension cable 1100 and the accessory device 1200) includes only the right audio load. Thus, the impedance of the third signal path (also referred to as the third impedance state), as determined by the monitoring unit 1070, will be approximately equal to $R_R$, i.e. $R_{XR}=R_R$ plus some additional impedance in the extension cable 1160 and the plugs 1160, 1260 and sockets 1050, 1150. Accordingly, in the arrangement illustrated in FIG. 9a the sum of the impedances $R_{XL}$ and $R_{XR}$ will be close to $R_{TOT}$, i.e. $R_{XL}+R_{XR}=R_{TOT}+R_{TOL}$, where $R_{TOL}$ is some tolerance value.

In the arrangement illustrated in FIG. 9f, audio signals output by the host device via the socket 1050 cannot be correctly output by the audio accessory device 1200, since the ground connection of the audio accessory device 1200 is open-circuit. In this arrangement the first signal path from the first terminal 1010 to the second terminal 1020 via the accessory device 1200 includes the left and right audio loads of the accessory device 1200, and thus the impedance of the first signal path (i.e. the first impedance state), as determined by the monitoring unit 1070, is approximately equal to the combined impedance of the left and right audio loads of the accessory device, i.e. $R_{TOT}=R_L+R_R$. However, as neither the microphone nor the ground connection of the accessory device is connected to any of the contacts of the extension cable socket 1150, there is no complete signal path from either the first or the second terminal 1010, 1020 to the third or fourth terminal 1030, 1040, and thus in the arrangement illustrated in FIG. 9c the monitoring unit 1070 will determine that both the second and third signal paths are high impedance (i.e. the second and third impedance states are both high impedance).

The circuitry 1000 is configured to detect incompatibility between an intermediate cable 1100 that is connected to the host device and an accessory device 1200 that is connected to the intermediate cable 1100, based on the determined impedances of the first, second and third signal paths associated with the first and second terminals 1010, 1020 of the monitoring unit 1070.

As explained above with reference to FIGS. 9a and 9e, when an audio accessory device 1200 having a plug 1260 that is compatible with the socket 1150 of an intermediate cable 1100 is connected to the intermediate cable 1100 and the intermediate cable 1100 is in turn connected to a host device, audio signals output by the host device via the socket 1050 of the host device can be correctly output by the audio accessory device 1200. In this situation the impedance $R_{TOT}$ of the first signal path, as detected by the monitoring unit 1070, is approximately equal to $R_L+R_R$, and the sum of the impedances of the second and third signal paths is approximately equal to $R_{TOT}+R_{TOL}$.

In contrast, when an audio accessory device 1200 having a plug 1260 that is not compatible with the socket 1150 of an intermediate cable 1100 is connected to the intermediate cable 1100 and the intermediate cable 1100 is in turn connected to a host device, audio signals output by the host device via the socket 1050 of the host device cannot be correctly output by the audio accessory device 1200. In this situation the impedance $R_{TOT}$ of the first signal path, as detected by the monitoring unit 1070, is again approximately equal to $R_L+R_R$, but the sum of the impedances of the second and third signal paths is different from (e.g. greater than) $R_{TOT}+R_{TOL}$.

The monitoring unit 1070 is configured to determine the impedances of the first, second and third signal paths, typically in response to an event such as a request for audio playback (but may alternatively or additionally determine these impedances periodically, or may monitor them continuously or in response to some other request). The monitoring unit 1070 may be further configured to compare the detected impedance of the first signal path to the sum of the detected impedances of the second and third signal paths. If the monitoring unit 1070 detects that the sum of the measured impedances of the second and third signal paths is different from the impedance of the first signal path (within some predefined tolerance), the monitoring unit 1070 can output a signal S indicative of incompatibility between the intermediate cable 1100 and the connected accessory device 1200. In response to the signal S the host device may take appropriate action such as suspending audio output and/or issuing a warning or notification indicating that the audio accessory device 1200 is incompatible with the intermediate cable 1100.

The circuitry 1000 and/or monitoring unit 1070 is also able to detect removal of a four-pole jack plug from a three-pole socket of an intermediate cable such as an extension cable or splitter cable that is connected to the socket of a host device, as will now be explained with reference to FIGS. 10a-10i, which will show the removal of a four-pole jack plug from a three-pole jack socket of an intermediate cable over a sequence of removal states.

Figure 10A:
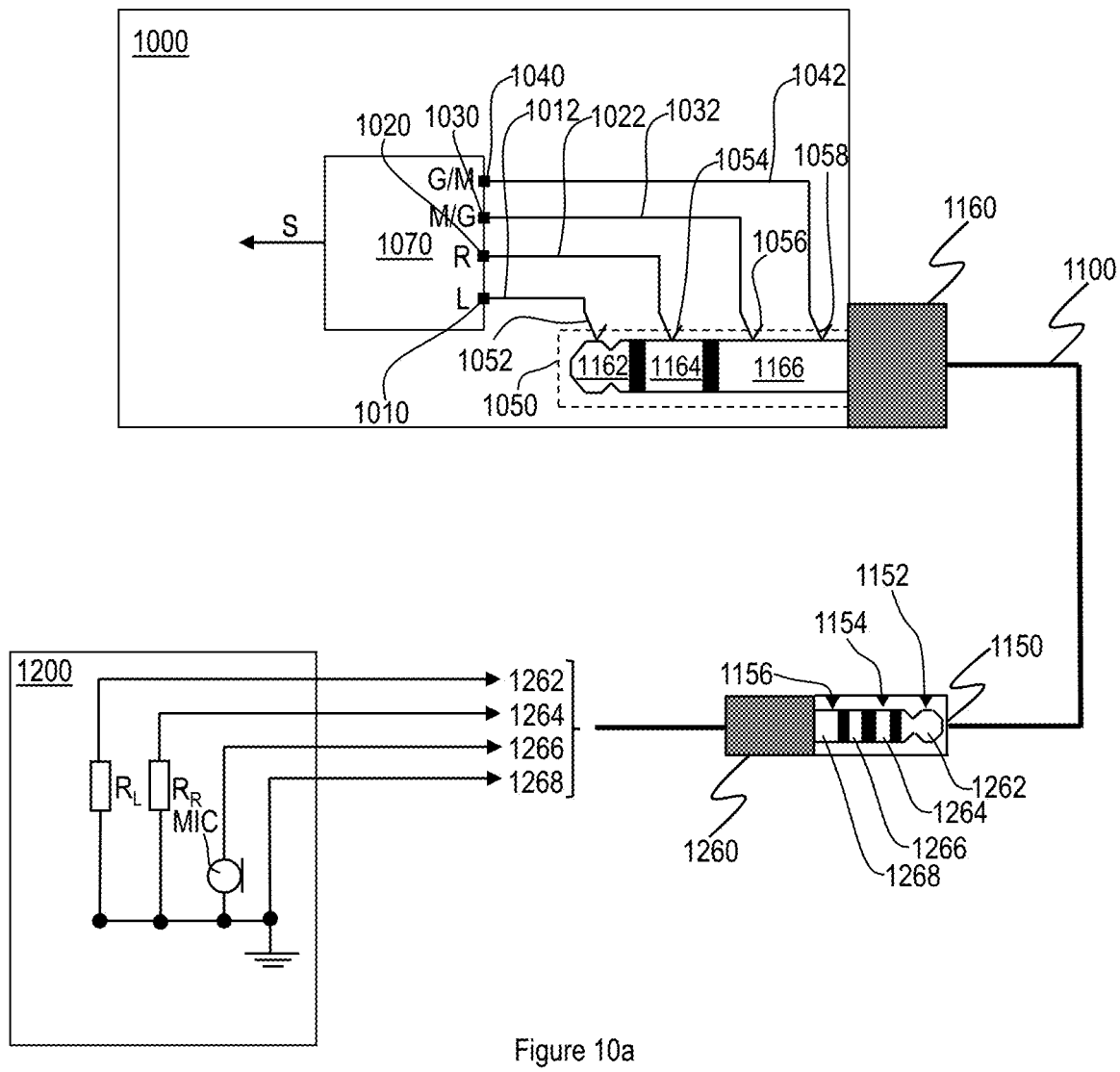
FIGS. 10a-10j illustrate examples of the removal of four-pole jack plug of an audio accessory device from three-pole sockets of different configurations of an intermediate cable over a sequence of different removal states.

FIG. 10a shows a four-pole plug 1260 of an audio accessory device 1200 fully received in a three-pole socket 1150 of an intermediate cable 1100 in an initial or first removal state. The three-pole socket of FIG. 10a has a first configuration in which its sleeve contact 1156 is in contact with a sleeve contact 1268 of the plug 1260 when the plug 1260 is fully received in the socket 1150. A three-pole plug 1160 of the intermediate cable 1100 is received in a four-pole socket of a host device. The contacts 1262-1268 of the plug 1262 are connected as in the arrangement illustrated in FIG. 9a, i.e. the tip contact 1262, the first ring contact 1264, the second ring contact 1266 and the sleeve contact 1268 are connected, respectively, to the left audio load, the right audio load, the microphone and the ground connection of the audio accessory device 1200.

In the first removal state of the plug 1260 illustrated in FIG. 10a the first signal path between the first terminal 1010 of the monitoring unit 1070 and the second terminal 1020, via the audio accessory 1200, includes the left audio load impedance $R_L$ and the right audio load impedance $R_R$. Thus, the impedance $R_{TOT}$ of the first signal path (i.e. the first impedance state) in the first removal state as measured by the monitoring unit 1070 is approximately equal to $R_L+R_R$. The second signal path, between the first terminal 1010 and the third or fourth terminal 1030/1040 includes only the left audio load impedance $R_L$. Thus, the impedance $R_{XL}$ of the second signal path (i.e. the second impedance state) in the first removal state as measured by the monitoring unit 1070 is approximately equal to $R_L$ plus some additional impedance in the extension cable 1160 and the plugs 1160, 1260 and sockets 1050, 1150. Similarly, the second signal path from the second terminal 1020 to the third or fourth terminal 1030/1040 (via the extension cable 1100 and the accessory device 1200) includes only the right audio load impedance $R_R$. Thus, the impedance of the third signal path (i.e. the third impedance state) in the first removal state, as determined by the monitoring unit 1070, will be approximately equal to $R_R$ plus some additional impedance in the extension cable 1160 and the plugs 1160, 1260 and sockets 1050, 1150.

Figure 10B:
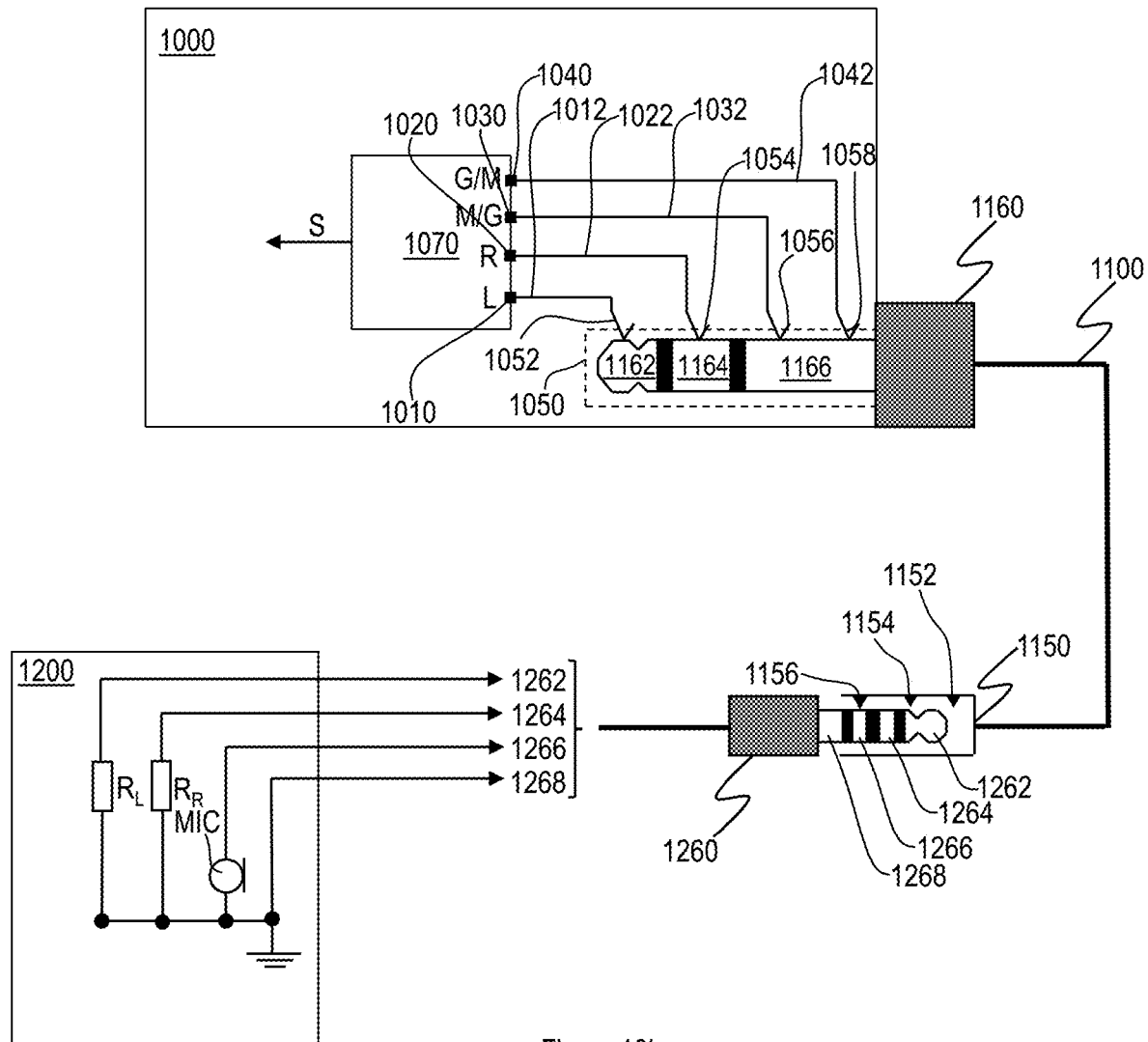

FIG. 10b shows the four-pole plug 1260 of an audio accessory device 1200 partially received in the three-pole socket 1150 of the intermediate cable 1100 in a second removal state. In the illustrated second removal state the socket tip contact 1152 is no longer in contact with any plug contact, whilst the socket ring contact 1154 is in contact with the plug tip contact 1262 and the socket sleeve contact 1156 is in contact with the second plug ring contact 1266.

In the second removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the second removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the second removal state, as determined by the monitoring unit 1070, is also high impedance. The third signal path from the second terminal 1020 to the third or fourth terminal 1030/1040 includes the left audio load and the microphone, and thus the impedance of the third signal path (i.e. the third impedance state) in the second removal state, as determined by the monitoring unit 1070, is approximately $R_L+R_{MIC}$.

Figure 10C:
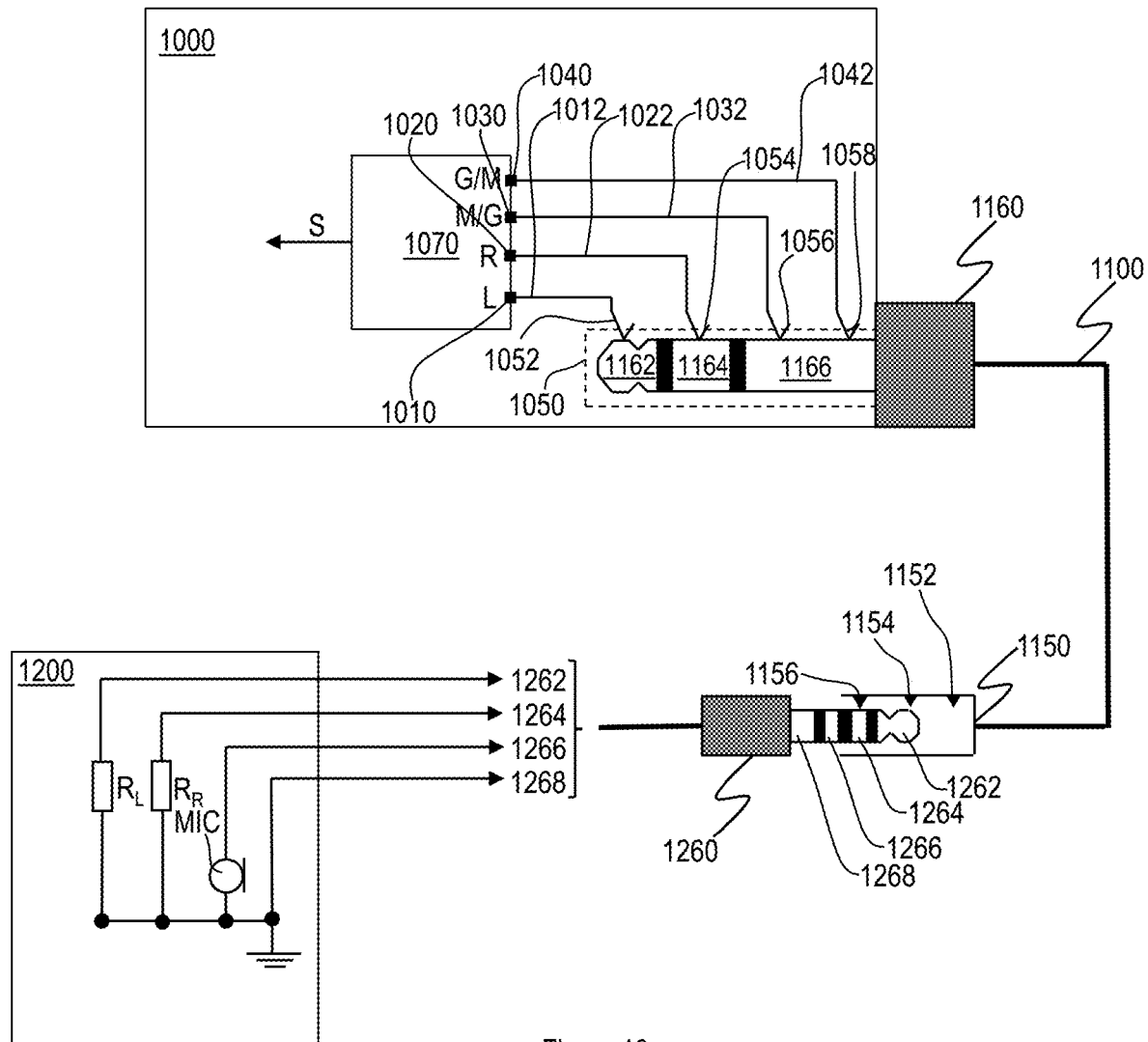

FIG. 10c shows the four-pole plug 1260 of an audio accessory device 1200 partially received in the three-pole socket 1150 of the intermediate cable 1100 in a third removal state. In the illustrated third removal state the socket tip contact 1152 is again no longer in contact with any plug contact, whilst the socket ring contact 1154 is in contact with the plug tip contact 1262 and the socket sleeve contact 1156 is in contact with the first plug ring contact 1264.

In the third removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the second removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the second removal state, as determined by the monitoring unit 1070, is also high impedance. The third signal path from the second terminal 1020 to the third or fourth terminal 1030/1040 includes the left audio load and the right audio load, and thus the impedance of the third signal path (i.e. the third impedance state) in the third removal state, as determined by the monitoring unit 1070, is approximately $R_L+R_R$.

Figure 10D:
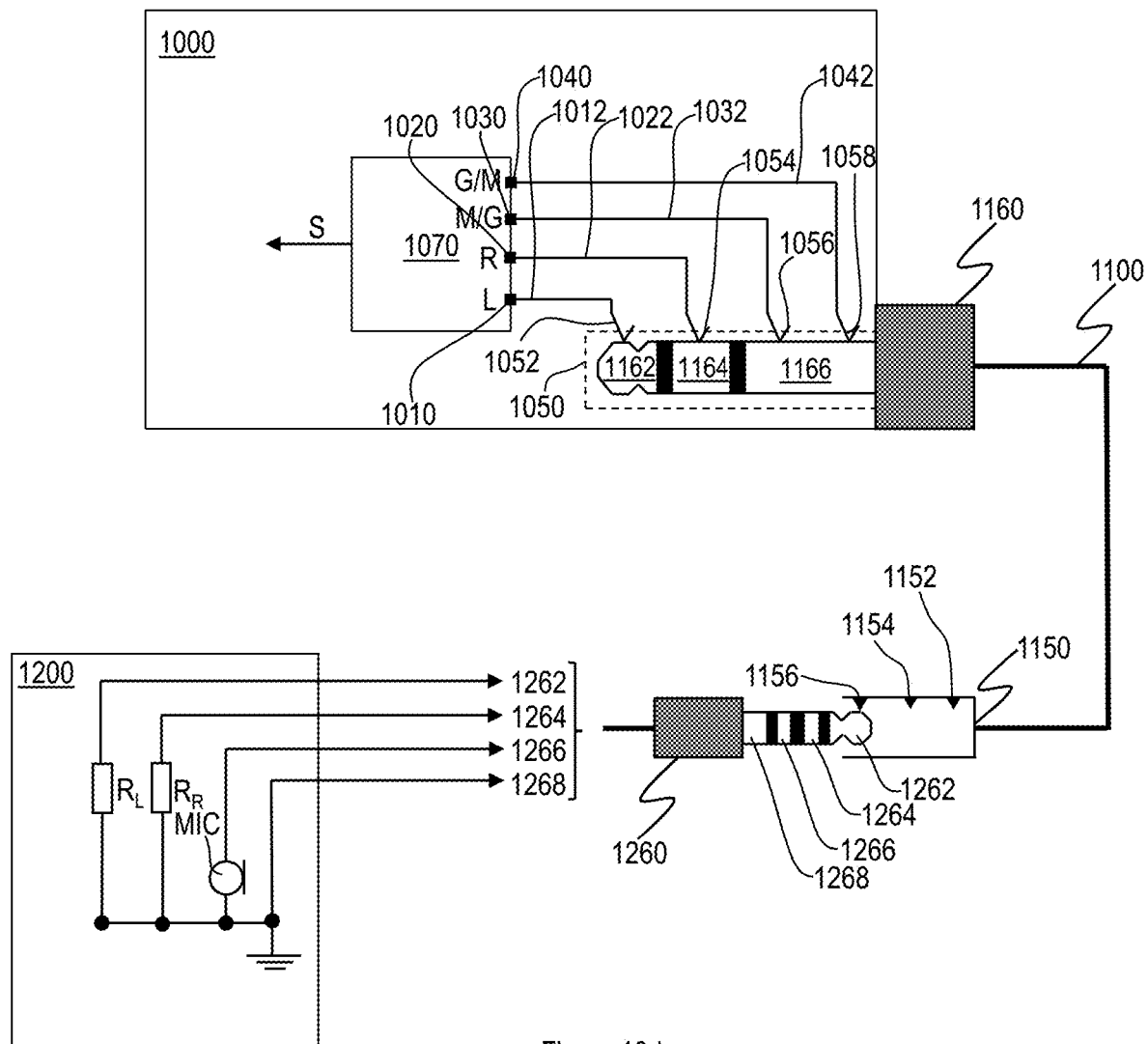

FIG. 10d shows the four-pole plug 1260 of an audio accessory device 1200 partially received in the three-pole socket 1150 of the intermediate cable 1100 in a fourth removal state which, for the purposes of the present disclosure, is equivalent to the plug 1260 being fully removed from the socket 1150. In the illustrated fourth removal state the socket tip contact 1152 is again not in contact with any plug contact, whilst the socket ring contact 1154 no longer in contact with any plug contact 1262. The socket sleeve contact 1156 is in contact with the plug tip contact 1262.

In the fourth removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the fourth removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the fourth removal state, as determined by the monitoring unit 1070, is also high impedance. The third signal path from the second terminal 1020 to the third or fourth terminal 1030/1040 is also open-circuit, since only a single socket contact (i.e. the socket sleeve contact 1156) is electrically connected to a plug contact (i.e. the plug tip contact 1262) such that no complete signal path exists. Thus, the impedance of the third signal path (i.e. the third impedance state) in the fourth removal state, as determined by the monitoring unit 1070, is high impedance.

The impedance states (as "seen" by the host device) of the first, second and third signal paths in the first, second, third and fourth removal states of the plug 1260 for the socket configuration shown in FIGS. 10a-10d are summarised in Table 7 below:

TABLE 7

| Removal state | First impedance state | Second impedance state | Third impedance state |
|---|---|---|---|
| First | $R_L+R_R$ (approx.) | $R_L$ (approx.) | $R_R$ (approx.) |
| Second | High-Z | High-Z | $R_R+R_{MIC}$ (approx.) |
| Third | High-Z | High-Z | $R_L+R_R$ (approx.) |
| Fourth | High-Z | High-Z | High-Z |

Figure 10E:
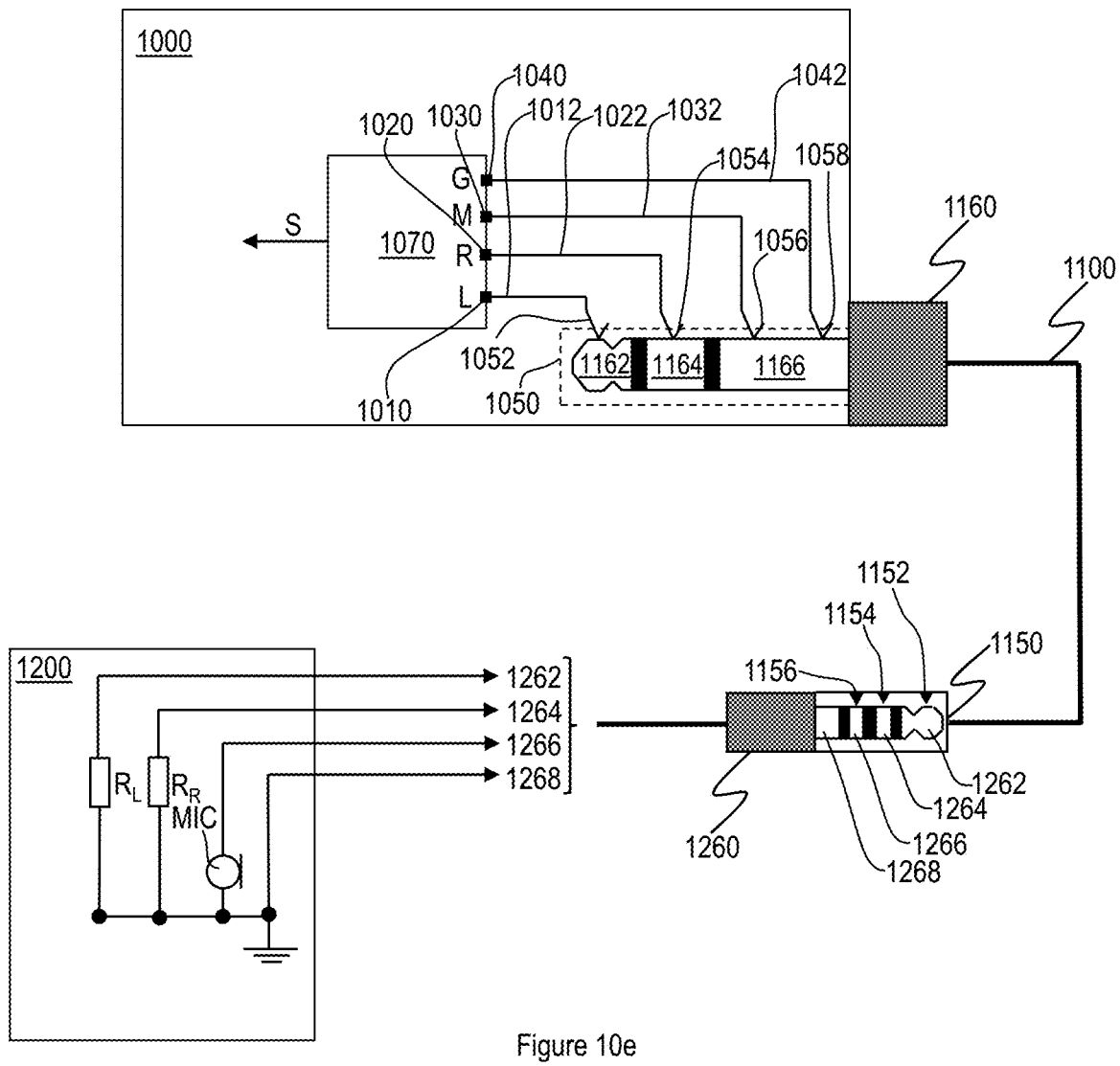

FIG. 10e shows a four-pole plug 1260 of an audio accessory device 1200 fully received in a three-pole socket 1150 of an intermediate cable 1100 in an initial or first removal state. The three-pole socket of FIG. 10e has a second configuration in which its sleeve contact 1156 is in contact with a second ring contact 1266 of the plug 1260 when the plug 1260 is fully received in the socket 1150. A three-pole plug 1160 of the intermediate cable 1100 is received in a four-pole socket of a host device. The contacts 1262-1268 of the plug 1260 are connected to the elements of the audio accessory device 1200 as in FIGS. 10a-10d.

In the first removal state of the plug 1260 illustrated in FIG. 10e the first signal path between the first terminal 1010 of the monitoring unit 1070 and the second terminal 1020, via the audio accessory, includes the left audio load impedance $R_L$ and the right audio load impedance $R_R$. Thus, the impedance $R_{TOT}$ of the first signal path (i.e. the first impedance state) in the first removal state as measured by the monitoring unit 1070 is approximately equal to $R_L+R_R$. The second signal path, between the first terminal 1010 and the third or fourth terminal 1030/1040 includes only the left audio load impedance $R_L$. Thus, the impedance $R_{XL}$ of the second signal path (i.e. the second impedance state) in the first removal state as measured by the monitoring unit 1070 is approximately equal to $R_L$ plus some additional impedance in the extension cable 1160 and the plugs 1160, 1260 and sockets 1050, 1150. Similarly, the third signal path from the second terminal 1020 to the third or fourth terminal 1030/1040 (via the extension cable 1100 and the accessory device 1200) includes only the right audio load impedance $R_R$. Thus, the impedance of the third signal path (i.e. the third impedance state) in the first removal state, as determined by the monitoring unit 1070, will be approximately equal to $R_R$ plus some additional impedance in the extension cable 1160 and the plugs 1160, 1260 and sockets 1050, 1150.

Figure 10F:
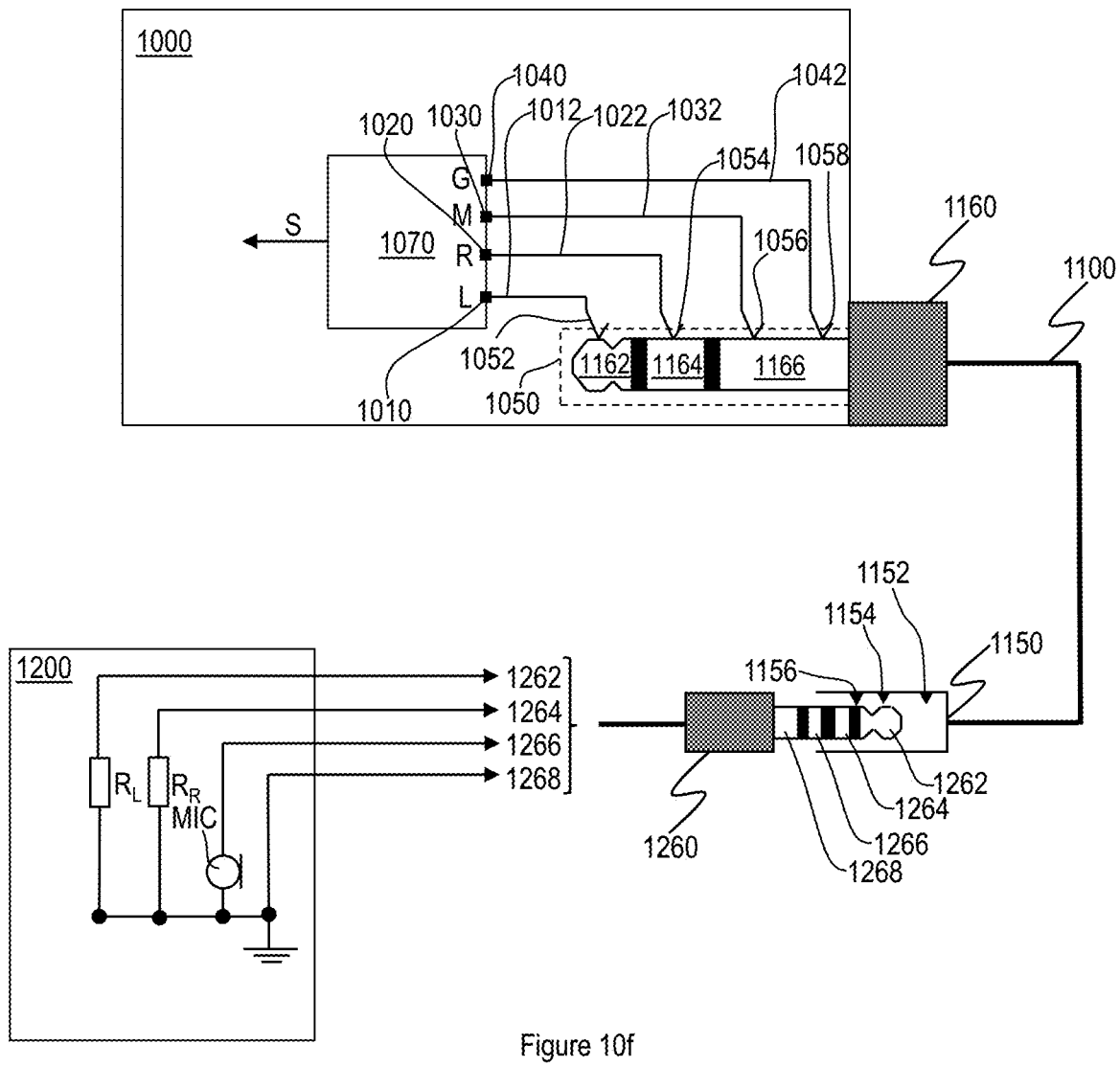

FIG. 10f shows the four-pole plug 1260 of an audio accessory device 1200 partially received in the three-pole socket 1150 of the intermediate cable 1100 in a second removal state. In the illustrated second removal state the socket tip contact 1152 is no longer in contact with any plug contact, whilst the socket ring contact 1154 is in contact with the plug tip contact 1262 and the socket sleeve contact 1156 is in contact with an insulator that is provided between the plug tip contact 1262 and the first plug ring contact 1264.

In the second removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the second removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the second removal state, as determined by the monitoring unit 1070, is also high impedance. The third signal path from the second terminal 1020 to the third or fourth terminal 1030/1040 is also open circuit, due to the contact between the socket sleeve contact 1156 and the insulator between the plug tip contact 1262 and the first plug ring contact 1264. Thus, the third impedance state is also high impedance.

Figure 10G:
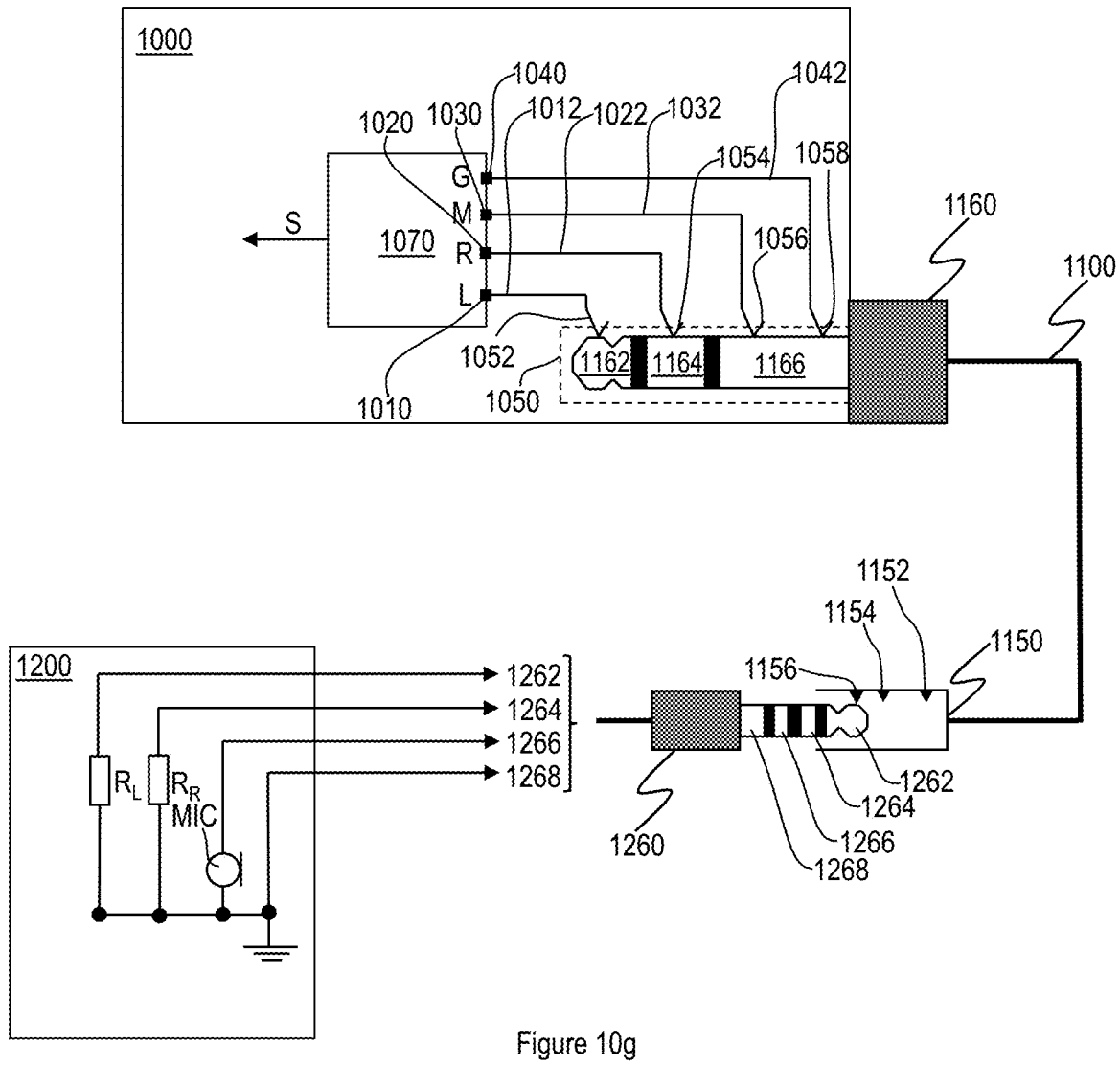

FIG. 10g shows the four-pole plug 1260 of an audio accessory device 1200 partially received in the three-pole socket 1150 of the intermediate cable 1100 in a third removal state which, for the purposes of the present disclosure, is equivalent to the plug 1260 being fully removed from the socket 1150. In the illustrated third removal state the socket tip contact 1152 is again not in contact with any plug contact, whilst the socket ring contact 1154 no longer in contact with any plug contact 1262. The socket sleeve contact 1156 is in contact with the plug tip contact 1262.

In the third removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the third removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the third removal state, as determined by the monitoring unit 1070, is also high impedance. The third signal path from the second terminal 1020 to the third or fourth terminal 1030/1040 is also open-circuit, since only a single socket contact (i.e. the socket sleeve contact 1156) is electrically connected to a plug contact (i.e. the plug tip contact 1262) such that no complete signal path exists. Thus, the impedance of the third signal path (i.e. the third impedance state) in the third removal state, as determined by the monitoring unit 1070, is high impedance.

The impedance states (as "seen" by the host device) of the first, second and third signal paths in the first, second and third removal states of the plug 1260 for the second socket configuration shown in FIGS. 10e-10g are summarised in Table 8 below:

TABLE 8

| Removal state | First impedance state | Second impedance state | Third impedance state |
| --- | --- | --- | --- |
| First | $R_L + R_R$ (approx.) | $R_L$ (approx.) | $R_R$ (approx.) |
| Second | High-Z | High-Z | High-Z |
| Third | High-Z | High-Z | High-Z |

Figure 10H:
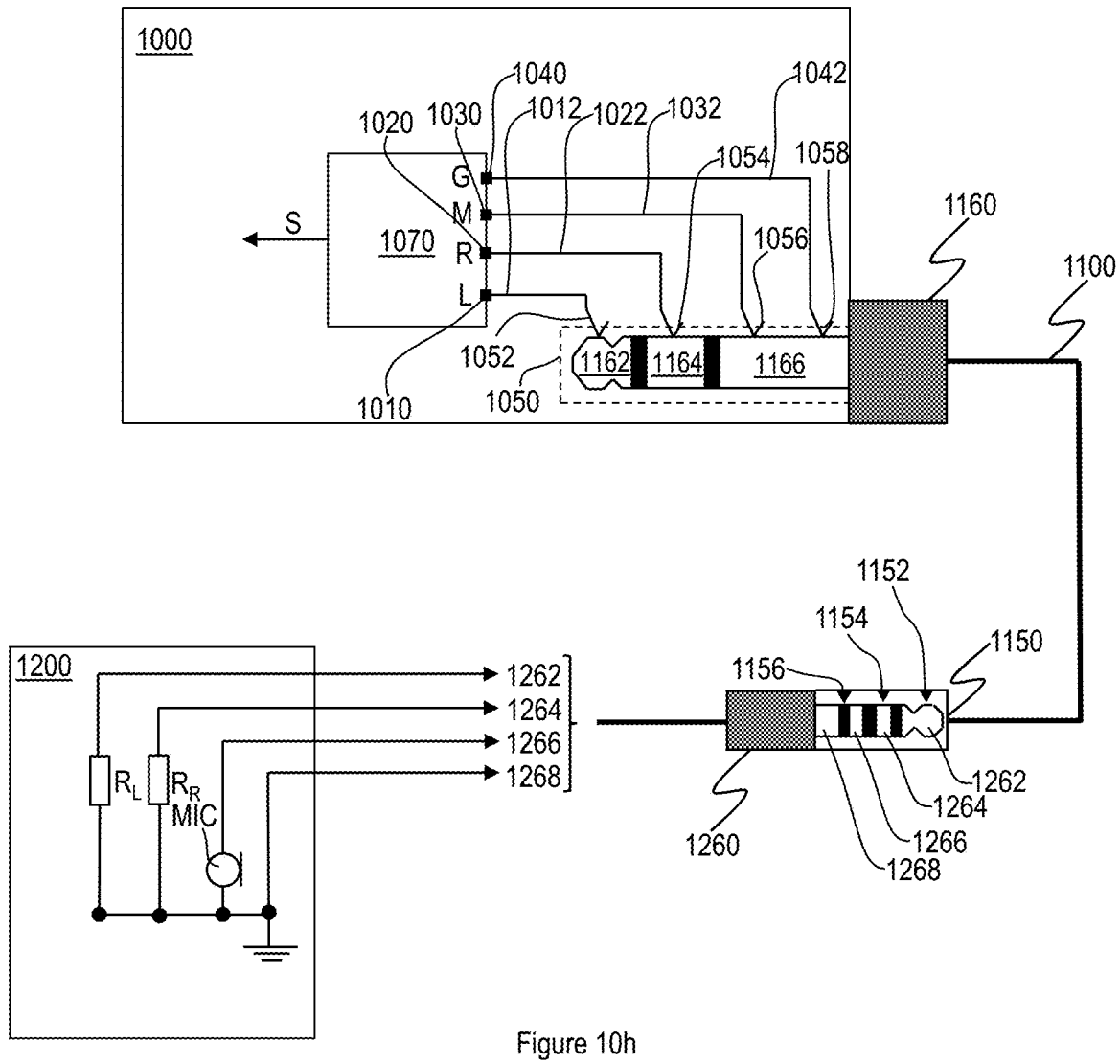

FIG. 10h shows a four-pole plug 1260 of an audio accessory device 1200 fully received in a three-pole socket 1150 of an intermediate cable 1100 in an initial or first removal state. The three-pole socket of FIG. 10g has a third configuration in which its sleeve contact 1156 is in contact with an insulator between the second ring contact 1266 and the sleeve contact 1268 of the plug 1260 when the plug 1260 is fully received in the socket 1150. A three-pole plug 1160 of the intermediate cable 1100 is received in a four-pole socket of a host device. The contacts 1262-1268 of the plug 1260 are connected to the elements of the accessory device 1200 as in FIGS. 10a-10d.

In the first removal state of the plug 1260 illustrated in FIG. 10h the first signal path between the first terminal 1010 of the monitoring unit 1070 and the second terminal 1020, via the audio accessory, includes the left audio load impedance $R_L$ and the right audio load impedance $R_R$. Thus, the impedance $R_{TOT}$ of the first signal path (i.e. the first impedance state) in the first removal state as measured by the monitoring unit 1070 is approximately equal to $R_L + R_R$. The second signal path, between the first terminal 1010 and the third or fourth terminal 1030/1040, is open circuit, due to the contact between the socket sleeve contact 1156 and the insulator between the second plug ring contact 126 and the plug sleeve contact 1268. Similarly, the third signal path from the second terminal 1020 to the third or fourth terminal 1030/1040 (via the extension cable 1100 and the accessory device 1200) is open circuit, due to the contact between the socket sleeve contact 1156 and the insulator between the second plug ring contact 126 and the plug sleeve contact 1268. Thus, the second and third impedance states of the second and third signal paths, respectively, in the first removal state, as determined by the monitoring unit 1070, will be high impedance.

Figure 10I:
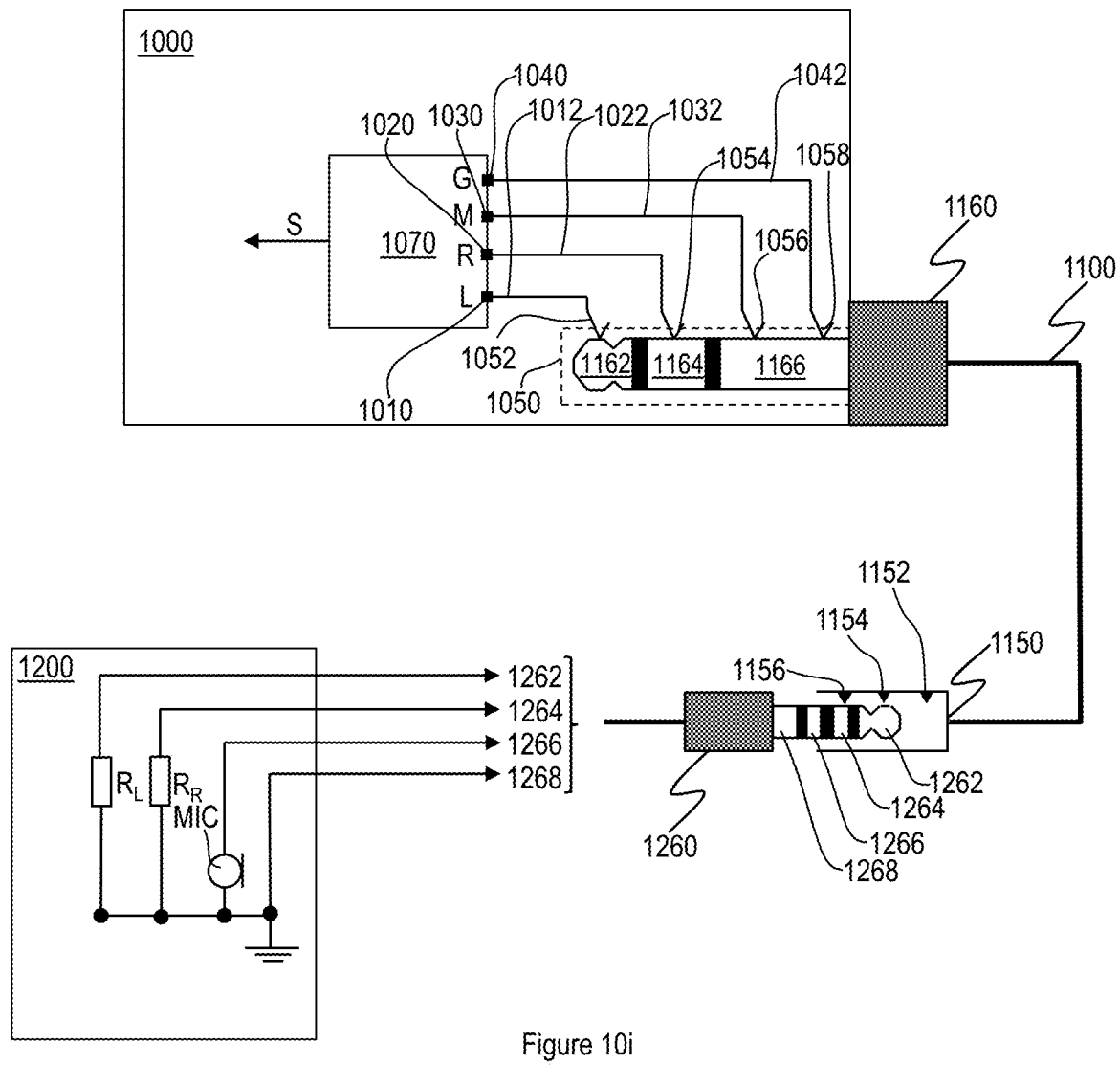

FIG. 10i shows the four-pole plug 1260 of an audio accessory device 1200 partially received in the three-pole socket 1150 of the intermediate cable 1100 in a second removal state. In the illustrated second removal state the socket tip contact 1152 is no longer in contact with any plug contact, whilst the socket ring contact 1154 is in contact with the plug tip contact 1262 and the socket sleeve contact 1156 is in contact with the first plug ring contact 1156.

In the second removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the second removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the second removal state, as determined by the monitoring unit 1070, is also high impedance. The third signal path from the second terminal 1020 to the third or fourth terminal 1030/1040 includes the left and right audio loads. Thus, the impedance of the third signal path (i.e. the third impedance state) in the second removal state, as determined by the monitoring unit 1070, is approximately $R_L + R_R$.

Figure 10J:
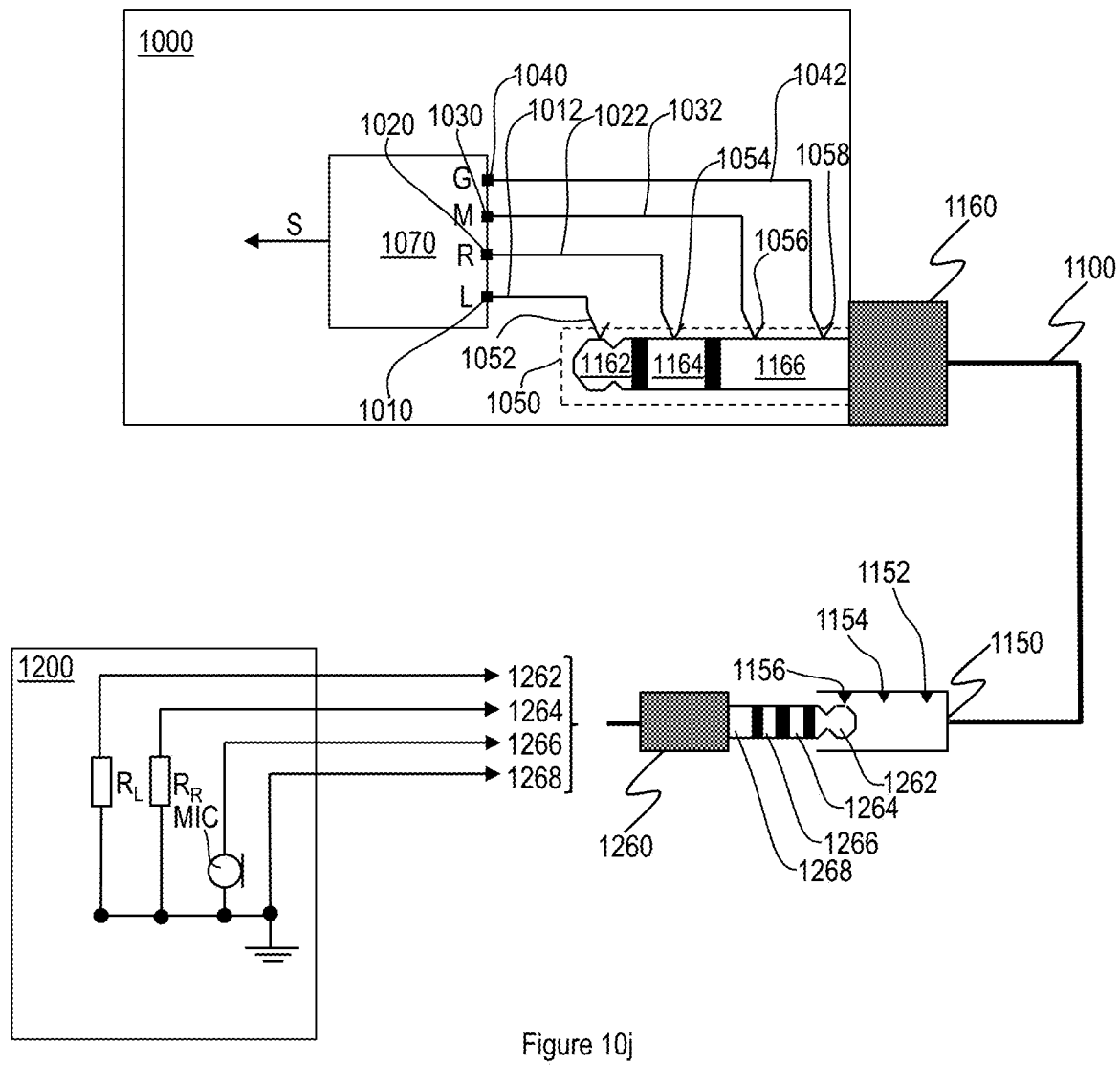

FIG. 10j shows the four-pole plug 1260 of an audio accessory device 1200 partially received in the three-pole socket 1150 of the intermediate cable 1100 in a third removal state which, for the purposes of the present disclosure, is equivalent to the plug 1260 being fully removed from the socket 1150. In the illustrated third removal state the socket tip contact 1152 is again not in contact with any plug contact, whilst the socket ring contact 1154 no longer in contact with any plug contact 1262. The socket sleeve contact 1156 is in contact with the plug tip contact 1262.

In the third removal state, the first signal path from the first terminal 1010 of the monitoring unit 1070 to the second terminal 1020 is open-circuit, because the socket tip contact 1152 is not in contact with any plug contact. Thus, the impedance of the first signal path (i.e. the first impedance state) in the third removal state, as determined by the monitoring unit 1070, is high impedance. The second signal path from the first terminal 1010 to the third or fourth terminal 1030/1040 is also open circuit, again due to the lack of any connection between the socket tip contact 1152 and any plug contact, and thus the impedance of the second signal path (i.e. the second impedance state) in the third removal state, as determined by the monitoring unit 1070, is also high impedance. The third signal path from the second terminal 1020 to the third or fourth terminal 1030/1040 is also open-circuit, since only a single socket contact (i.e. the socket sleeve contact 1156) is electrically connected to a plug contact (i.e. the plug tip contact 1262) such that no complete signal path exists. Thus, the impedance of the third signal path (i.e. the third impedance state) in the third removal state, as determined by the monitoring unit 1070, is high impedance.

The impedance states (as "seen" by the host device) of the first, second and third signal paths in the first, second and third removal states of the plug 1260 for the second socket configuration shown in FIGS. 10g-10j are summarised in Table 9 below:

TABLE 9

| Removal state | First impedance state | Second impedance state | Third impedance state |
|---|---|---|---|
| First | $R_L + R_R$ (approx.) | High-Z | High-Z |
| Second | High-Z | High-Z | $R_L + R_R$ (approx.) |
| Third | High-Z | High-Z | High-Z |

As will be apparent from the discussion above, regardless of which type of socket 1150 is provided on the intermediate cable 1100, as the plug 1260 of the audio accessory device 1200 moves from the first removal state to the second removal state the impedance state of the first signal path changes from approximately $R_L+R_R$ to a high impedance state. The monitoring unit 1070 is configured to output a signal indicative of removal of the plug 1260 from the socket 1150 of the intermediate cable to downstream components (e.g. a processor or the like) of the host device on detection of this predetermined sequence of the impedance states of the first signal path. In response to receiving this signal the host device may take appropriate action, such as suspending the generation and output of audio signals and/or issuing an alert or notification to the user to advise the user of the disconnection of the audio accessory device 1200 from the intermediate cable 1100, e.g. as a notification on a user interface of the host device.

It will be noted that in the examples discussed above in relation to FIGS. 10a-10j the contacts 1262-1268 of plug 1260 of the audio accessory device 1200 are connected to the elements of the audio accessory device in the manner illustrated in FIG. 9a, i.e. the plug tip contact 1262, first plug ring contact 1264, second plug ring contact 1266 and plug sleeve contact 1268 are connected, respectively, to the left audio load, right audio load, microphone and ground connection of the audio accessory device 1200. However, the change of the impedance of the first signal path described above will be observed when a plug 1260 that is connected as in FIG. 9b (i.e. plug tip contact 1262—left audio load, first plug ring contact 1264—left audio load, second plug ring contact 1266—audio accessory ground connection, plug sleeve contact 1268—microphone) is removed from the socket 1150. Thus, the plug removal mechanism described above is equally applicable to plugs that are connected as in FIG. 9b.

Figure 11A:
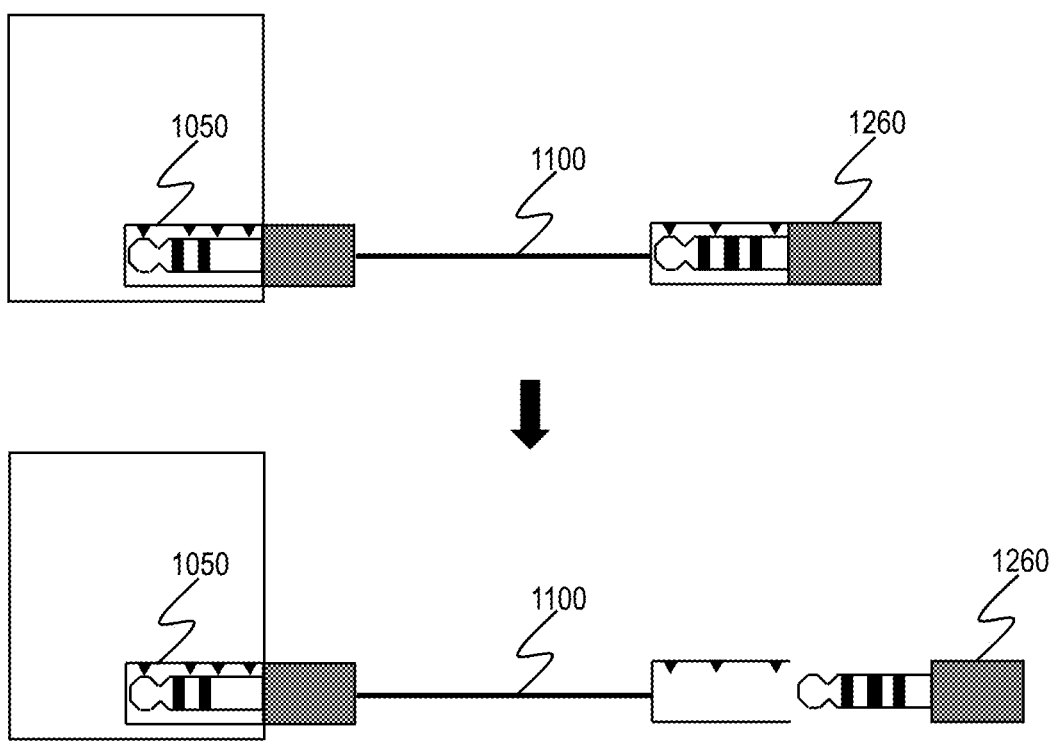
FIGS. 11a-11b illustrate examples of different scenarios in which the insertion of a jack into, and the removal of a jack plug from, a mismatched socket of an intermediate cable can be detected.
Figure 11B:
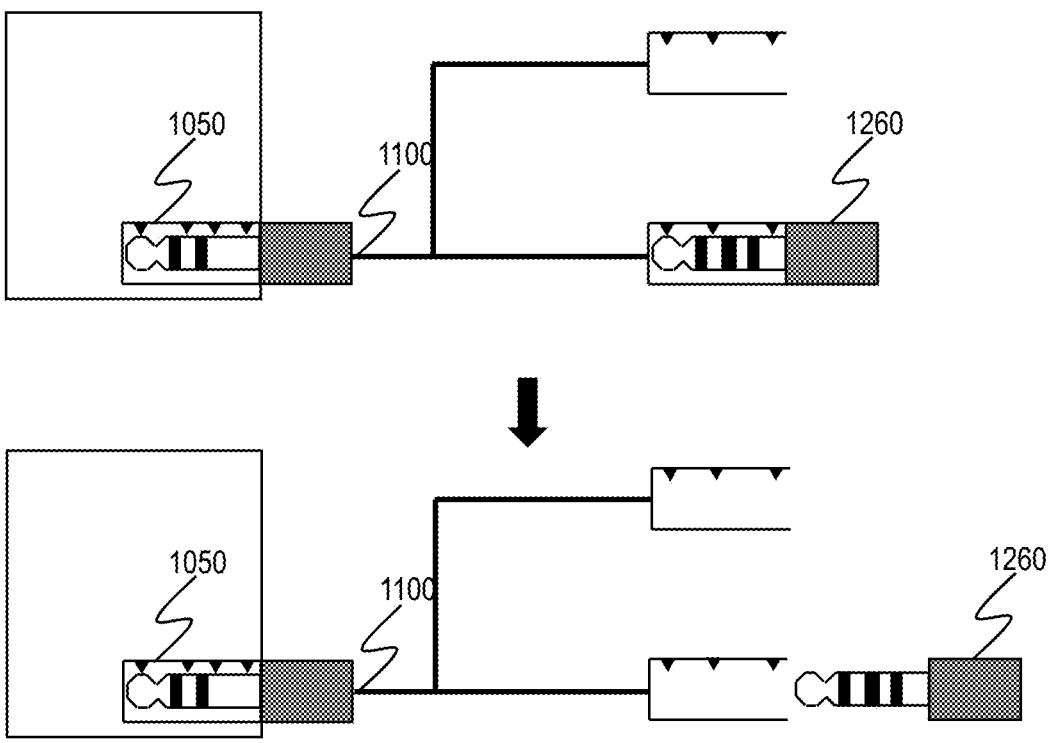

As will be appreciated by those skilled in the art, the circuitry described herein with reference to FIGS. 8-10 can be used to detect the insertion of a jack into, and the removal of a jack plug from, a mismatched socket of an intermediate cable, as illustrated in FIGS. 11a-11b.

FIG. 11a illustrates the removal of a 4-pole TRRS jack plug 1260 of an audio accessory device from a 3-pole TRS socket 1150 of an extension cable 1100 having a three-pole TRS jack plug that is received in a 4-pole socket 1050 of a host device.

FIG. 11b illustrates the removal of a 4-pole TRRS jack plug 1260 of an audio accessory device from a 3-pole TRRS socket of a splitter cable 1100 having a 3-pole TRS jack plug that is received in a 4-pole TRRS socket 1050 of a host device.

In the description above it has been assumed that the circuitry 100, 600, 1000 operates in isolation from other circuitry such as microphone detect circuitry that may be present in a host device. Thus, the impedance values and states provided in the description above are based on this assumption. As will be appreciated by those skilled in the art, where the circuitry 100, 600, 1000 is required to operate in conjunction with other circuitry such as microphone detection circuitry, the actual impedance values and states of the signal paths as the jack plug moves through the described removal states may differ from the impedance values and states described above. Those skilled in the art will readily be able to adapt the teachings of the present disclosure to detect impedance values and states that are appropriate to the requirements of a particular host device or other implementation, and thus it will be understood that the impedance values and states provided in the above description are examples used to illustrate the principles of the present disclosure, and are not limitations of the scope of the present disclosure.

The description above has presented the present disclosure in the context of an audio accessory connected via a jack plug 160, 260, 360, 460, 760 to be received in socket 150, 650. However, the skilled person will appreciate that a wide variety of different accessory devices or apparatus may comprise a jack plug for a mating connection to a corresponding socket. The skilled person will therefore understand that the teaching in accordance with the present disclosure may be applied to any such accessory apparatus or device.

Circuitry according to embodiments of the present invention may be implemented as an integrated circuit and may be implemented in a host device. The term host device is used in this specification to refer to any electronic or electrical device which is removably connectable to an external accessory apparatus. The host device may especially be a portable and/or battery powered host device such as a mobile telephone, an audio player, a video player, a PDA, a mobile computing platform such as a laptop computer or tablet and/or a games device for example. A removable accessory apparatus is any apparatus which may be connected to and used with a host device. The accessory apparatus may, for instance, be a set of headphones, earphones, earbuds or the like, possibly including a microphone, or a headset.

The skilled person will thus recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for detecting connection of a plug of an audio accessory device to a socket of an intermediate cable that is connected to a host device, wherein the plug of the accessory device is of a different type than the socket of the intermediate cable, the circuitry comprising:
    a monitoring unit comprising:
        a first terminal configured to be electrically connected to a first socket contact of the socket that is in electrical contact with a first plug contact of the plug when the plug is fully received in the socket;
        a second terminal configured to be electrically connected to a second socket contact of the socket that is in electrical contact with a second plug contact of the plug when the plug is fully received in the socket; and
        a third terminal configured to be electrically connected to a third socket contact of the socket that is in electrical contact with a third plug contact of the plug when the plug is fully received in the socket,
    wherein the monitoring unit is configured to:
        detect a first impedance of a first signal path from the first terminal;
        detect a second impedance of a second signal path from the first terminal; and
        detect a third impedance of a third signal path from the second terminal,
    wherein the circuitry is configured to output a signal indicative of detection of connection of the plug to the socket in response to detection by the monitoring unit that the detected first, second and third impedances do not correspond to expected first, second and third impedances,
    wherein the second terminal is configured to act as an end point of the first signal path and wherein the third terminal is configured to act as an end point of the second and third signal paths.

2. Circuitry according to claim 1, wherein the circuitry is configured to output the signal in response to detection by the monitoring unit that the sum of the second and third impedances does not correspond to the first impedance.

3. Circuitry according to claim 1, wherein the plug is a four-pole jack plug and the socket is a three-pole socket.

4. Circuitry according to claim 3 wherein the plug is a TRRS plug and the socket is a TRS socket.

5. Circuitry according to claim 1 wherein the intermediate cable is an extension cable.

6. Circuitry according to claim 1 wherein the intermediate cable is a splitter cable.

7. Circuitry according to claim 1 wherein the monitoring unit is configured to determine the first, second and third impedances in response to a request received by the host device.

8. Circuitry according to claim 7 wherein the request is a request for audio output.

9. Circuitry according to claim 1 wherein the monitoring unit is configured to determine the first, second and third impedances periodically.

10. Circuitry according to claim 1 wherein the monitoring unit is configured to monitor the first, second and third impedances continuously.

11. Circuitry according to claim 1 implemented as an integrated circuit.

12. An electronic device comprising circuitry according to claim 1.

13. A method for detecting connection of a plug of an audio accessory device to a socket of an intermediate cable that is connected to a host device, wherein the plug of the accessory device is of a different type than the socket of the intermediate cable, the method comprising:
   detecting a first impedance of a first signal path from a first terminal of a monitoring unit to a second terminal of the monitoring unit, wherein the first terminal is configured to be electrically connected to a first socket contact of the socket that is in electrical contact with a first plug contact of the plug when the plug is fully received in the socket;
   detecting a second impedance of a second signal path from the first terminal to a third terminal of the monitoring unit;
   detecting a third impedance of a third signal path from a second terminal to the third terminal, wherein the second terminal is configured to be electrically connected to a second socket contact of the socket that is in electrical contact with a second plug contact of the plug when the plug is fully received in the socket and wherein the third terminal is configured to be electrically connected to a third socket contact of the socket that is in electrical contact with a third plug contact of the plug when the plug is fully received in the socket; and
   outputting a signal indicative of detection of connection of the plug to the socket in response to detection that the detected first, second and third impedances do not correspond to expected first, second and third impedances.

14. Circuitry for detecting at least partial removal of a plug of an audio accessory device from a socket of an intermediate cable that is connected to a host device, the circuitry comprising:
   a monitoring unit comprising:
      a first terminal configured to be electrically connected to a first socket contact of the socket that is in electrical contact with a first plug contact of the plug of the audio accessory device when the plug of the audio accessory device is fully received in the socket of the intermediate cable,
   wherein the monitoring unit is configured to monitor a first impedance of a first signal path coupled between the first terminal and a second terminal of the monitoring unit, and
   wherein the circuitry is configured to output a signal indicative of detection of at least partial removal of the plug of the audio accessory device from the socket of the intermediate cable in response to detection by the monitoring unit of a change in an impedance state of the first signal path from a first impedance state in which the impedance of the first signal path has a first impedance value to a second, high impedance state.

* * * * *